United States Patent
Itoh

(10) Patent No.: US 7,907,071 B2
(45) Date of Patent: Mar. 15, 2011

(54) DATA CONVERSION APPARATUS AND CONTROL METHOD THEREOF

(75) Inventor: Naotsugu Itoh, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 12/420,925

(22) Filed: Apr. 9, 2009

(65) Prior Publication Data

US 2009/0261996 A1 Oct. 22, 2009

(30) Foreign Application Priority Data

Apr. 22, 2008 (JP) ................................ 2008-111903

(51) Int. Cl.
*H03M 7/40* (2006.01)
(52) U.S. Cl. ......................................... 341/67; 370/463
(58) Field of Classification Search .............. 341/50–70; 382/197, 198, 239; 375/E7.103, E7.13, E7.158, 375/E7.094, E7.226, E7.198; 370/463
See application file for complete search history.

(56) References Cited

U.S. PATENT DOCUMENTS

| 6,295,272 | B1 * | 9/2001 | Feldman et al. | 370/210 |
| 6,958,714 | B2 * | 10/2005 | Umeda | 341/63 |
| 7,257,060 | B2 * | 8/2007 | Sako et al. | 369/47.22 |
| 7,330,320 | B1 * | 2/2008 | Oberg et al. | 360/39 |
| 7,633,965 | B2 * | 12/2009 | Shibata et al. | 370/463 |

FOREIGN PATENT DOCUMENTS

JP 2007-189527 7/2007

* cited by examiner

*Primary Examiner* — Lam T Mai
(74) *Attorney, Agent, or Firm* — Cowan, Liebowitz & Latman, P.C.

(57) ABSTRACT

This invention converts Packbit-encoded data into new Packbit-encoded data which allows to have a throughput=M. a extraction unit separates inputted encoded data into length information and data information, and outputs them to a conversion unit. The conversion unit has a count unit which cumulatively counts the number of output data after decoding indicated by the separated length information. The conversion unit divides length information of interest into first length information and second length information as needed, outputs the first length information, and sets the second length information as an initial count target to be counted by the count unit, so that the counted number N of output data reaches the throughput=M. The conversion unit combines the generated length information and the separated data information, and outputs new Packbit-encoded data.

5 Claims, 49 Drawing Sheets

FIG. 2

| LENGTH INFORMATION | BYTE COUNT INFORMATION | NUMBER OF REPETITION TIMES | MEANING |
|---|---|---|---|
| 00h | 1 | 1 | OUTPUT FOLLOWING 1 BYTE ONCE |
| 01h | 2 | 1 | OUTPUT FOLLOWING 2 BYTES ONCE |
| 02h | 3 | 1 | OUTPUT FOLLOWING 3 BYTES ONCE |
| 03h | 4 | 1 | OUTPUT FOLLOWING 4 BYTES ONCE |
| ...... | ...... | ...... | ...... |
| 7Eh | 127 | 1 | OUTPUT FOLLOWING 127 BYTES ONCE |
| 7Fh | 128 | 1 | OUTPUT FOLLOWING 128 BYTES ONCE |
| 80h | NOT USED | NOT USED | NOT USED |
| 81h | 1 | 128 | OUTPUT FOLLOWING 1 BYTE 128 TIMES |
| 82h | 1 | 127 | OUTPUT FOLLOWING 1 BYTE 127 TIMES |
| 83h | 1 | 126 | OUTPUT FOLLOWING 1 BYTE 126 TIMES |
| 84h | 1 | 125 | OUTPUT FOLLOWING 1 BYTE 125 TIMES |
| ...... | ...... | ...... | ...... |
| FEh | 1 | 3 | OUTPUT FOLLOWING 1 BYTE 3 TIMES |
| FFh | 1 | 2 | OUTPUT FOLLOWING 1 BYTE TWICE |

FIG. 3

| c0 | c1 | c2 | c3 | c4 | c5 | c6 | c7 | c8 | c9 | c10 | c11 | c12 | c13 | c14 | c15 | c16 | c17 |
|---|---|---|---|---|---|---|---|---|---|---|---|---|---|---|---|---|---|
| 04 | 01 | 02 | 03 | 04 | 05 | FE | 06 | 03 | 07 | 08 | 09 | 0A | FA | 0B | 05 | 0C | 0D | 0E | 0F | 10 | 11 | FA | 12 |

FIG. 4

| c0 | c1 | c2 | c3 | c4 | c5 | c6 | c7 | c8 | c9 | c10 | c11 | c12 | c13 | c14 | c15 | c16 | c17 | c18 | c19 | c20 | c21 | c22 | c23 |
|---|---|---|---|---|---|---|---|---|---|---|---|---|---|---|---|---|---|---|---|---|---|---|---|
| 04 | 01 | 02 | 03 | 04 | 05 | FE | 06 | 03 | 07 | 08 | 09 | 0A | FA | 0B | 05 | 0C | 0D | 0E | 0F | 10 | 11 | FA | 12 |

FIG. 5

| d0 | d1 | d2 | d3 | d4 | d5 | d6 | d7 | d8 | d9 | d10 | d11 | d12 | d13 | d14 | d15 | d16 | d17 | d18 | d19 | d20 | d21 | d22 | d23 | d24 | d25 | d26 | d27 | d28 | d29 | d30 | d31 |
|---|---|---|---|---|---|---|---|---|---|---|---|---|---|---|---|---|---|---|---|---|---|---|---|---|---|---|---|---|---|---|---|
| 01 | 02 | 03 | 04 | 05 | 06 | 06 | 07 | 08 | 09 | 0A | 0B | 0B | 0B | 0B | 0B | 0C | 0D | 0E | 0F | 10 | 11 | 12 | 12 | 12 | 12 | 12 | 12 | 12 | 12 | 12 | 12 |

FIG. 7

| PATTERN NUMBER | PATTERN CONTENTS | | | | | | | |
|---|---|---|---|---|---|---|---|---|
| | byte 0 | byte 1 | byte 2 | byte 3 | byte 4 | byte 5 | byte 6 | byte 7 |
| 1 | 00h | * | 00h | * | 00h | * | 00h | * |
| 2 | 00h | * | 00h | * | 00h | * | 01h~7Fh | * |
| 3 | 00h | * | 00h | * | 00h | * | 80h~FFh | * |
| 4 | 00h | * | 00h | * | 01h | * | * | * |
| 5 | 00h | * | 00h | * | 02h~7Fh | * | * | * |
| 6 | 00h | * | 00h | * | 80h~FEh | * | * | * |
| 7 | 00h | * | 00h | * | FFh | * | * | * |
| 8 | 00h | * | 01h | * | * | 00h | * | * |
| 9 | 00h | * | 01h | * | * | 01h~7Fh | * | * |
| 10 | 00h | * | 01h | * | * | 80h~FFh | * | * |
| 11 | 00h | * | 02h | * | * | * | * | * |
| 12 | 00h | * | 03h~7Fh | * | * | * | * | * |
| 13 | 00h | * | 80h~FDh | * | * | * | * | * |
| 14 | 00h | * | FEh | * | * | * | * | * |
| 15 | 00h | * | FFh | * | 00h | * | * | * |
| 16 | 00h | * | FFh | * | 01h~7Fh | * | * | * |
| 17 | 00h | * | FFh | * | 80h~FFh | * | * | * |
| 18 | 01h | * | * | 00h | * | 00h | * | * |
| 19 | 01h | * | * | 00h | * | 01h~7Fh | * | * |
| 20 | 01h | * | * | 00h | * | 80h~FFh | * | * |
| 21 | 01h | * | * | 01h | * | * | * | * |
| 22 | 01h | * | * | 02h~7Fh | * | * | * | * |
| 23 | 01h | * | * | 80h~FEh | * | * | * | * |
| 24 | 01h | * | * | FFh | * | * | * | * |
| 25 | 02h | * | * | * | 00h | * | * | * |
| 26 | 02h | * | * | * | 01h~7Fh | * | * | * |
| 27 | 02h | * | * | * | 80h~FFh | * | * | * |
| 28 | 03h | * | * | * | * | * | * | * |
| 29 | 04h~7Fh | * | * | * | * | * | * | * |
| 30 | 80h~FCh | * | * | * | * | * | * | * |
| 31 | FDh | * | * | * | * | * | * | * |
| 32 | FEh | * | 00h | * | * | * | 00h | * |
| 33 | FEh | * | 01h~7Fh | * | * | * | * | * |
| 34 | FEh | * | 80h~FFh | * | * | * | * | * |
| 35 | FFh | * | 00h | * | 00h | * | * | * |
| 36 | FFh | * | 00h | * | 01h~7Fh | * | * | * |
| 37 | FFh | * | 00h | * | 80h~FFh | * | * | * |
| 38 | FFh | * | 01h | * | * | * | * | * |
| 39 | FFh | * | 02h~7Fh | * | * | * | * | * |
| 40 | FFh | * | 80h~FEh | * | * | * | * | * |
| 41 | FFh | * | FFh | * | * | * | * | * |

| * | 00h~FFh |
|---|---|

FIG. 8A

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 1 | FBh | * | * | * | * | * | * | * | * | * | * | * |
| 2 | 80h~FAh | * | * | * | * | * | * | * | * | * | * | * |
| 3 | 05h | * | * | * | * | * | * | * | * | * | * | * |
| 4 | 06h~79h | * | * | * | * | * | * | * | * | * | * | * |
| 5 | FCh | * | 80h~FFh | * | * | * | * | * | * | * | * | * |
| 6 | FCh | * | 00h | * | * | * | * | * | * | * | * | * |
| 7 | FCh | * | 01h~79h | * | * | * | * | * | * | * | * | * |
| 8 | 04h | * | * | * | * | * | 80h~FFh | * | * | * | * | * |
| 9 | 04h | * | * | * | * | * | 00h | * | * | * | * | * |
| 10 | 04h | * | * | * | * | * | 01h~79h | * | * | * | * | * |
| 11 | FDh | * | FFh | * | * | * | * | * | * | * | * | * |
| 12 | FDh | * | 80h~FEh | * | * | * | * | * | * | * | * | * |
| 13 | FDh | * | 01h | * | * | * | * | * | * | * | * | * |
| 14 | FDh | * | 02h~79h | * | * | * | * | * | * | * | * | * |
| 15 | 03h | * | * | * | FFh | * | * | * | * | * | * | * |
| 16 | 03h | * | * | * | 80h~FEh | * | * | * | * | * | * | * |
| 17 | 03h | * | * | * | 01h | * | * | * | * | * | * | * |
| 18 | 03h | * | * | * | 02h~79h | * | * | * | * | * | * | * |
| 19 | FDh | * | 00h | * | 80h~FFh | * | * | * | * | * | * | * |
| 20 | FDh | * | 00h | * | 00h | * | * | * | * | * | * | * |

PATTERN CONTENTS

* : 00h~FFh

FIG. 8B

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 21 | FDh | * | 00h | * | 01h~79h | * | * | * | * | * | * | * |
| 22 | 03h | * | * | * | * | 00h | * | 80h~FFh | * | * | * | * |
| 23 | 03h | * | * | * | * | 00h | * | 00h | * | * | * | * |
| 24 | 03h | * | * | * | * | 00h | * | 01h~79h | * | * | * | * |
| 25 | FEh | * | FEh | * | FEh | * | * | * | * | * | * | * |
| 26 | FEh | * | 80h~FDh | * | 80h~FDh | * | * | * | * | * | * | * |
| 27 | FEh | * | 02h | * | 02h | * | * | * | * | * | * | * |
| 28 | FEh | * | 03h~79h | * | 03h~79h | * | * | * | * | * | * | * |
| 29 | 02h | * | * | * | * | * | * | * | * | * | * | * |
| 30 | 02h | * | * | * | * | * | * | * | * | * | * | * |
| 31 | 02h | * | * | * | * | * | * | * | * | * | * | * |
| 32 | 02h | * | * | * | * | * | * | * | * | * | * | * |
| 33 | FEh | * | FFh | * | 80h~FFh | * | * | * | * | * | * | * |
| 34 | FEh | * | FFh | * | 00h | * | * | * | * | * | * | * |
| 35 | FEh | * | FFh | * | 01h~79h | * | * | * | * | * | * | * |
| 36 | FEh | * | 01h | * | * | 80h~FFh | * | * | * | * | * | * |
| 37 | FEh | * | 01h | * | * | 00h | * | * | * | * | * | * |
| 38 | FEh | * | 01h | * | * | 01h~79h | * | * | * | * | * | * |
| 39 | 02h | * | * | * | FFh | * | 80h~FFh | * | * | * | * | * |
| 40 | 02h | * | * | * | FFh | * | 00h | * | * | * | * | * |

PATTERN CONTENTS

| * | 00h~FFh |
|---|---|

FIG. 8C

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 41 | 02h | * | * | * | FFh | * | 01h~79h | * | * | * | * | * |
| 42 | 02h | * | * | * | 01h | * | * | 80h~FFh | * | * | * | * |
| 43 | 02h | * | * | * | 01h | * | * | 00h | * | * | * | * |
| 44 | 02h | * | * | * | 01h | * | * | 01h~79h | * | * | * | * |
| 45 | FEh | * | 00h | * | FFh | * | * | * | * | * | * | * |
| 46 | FEh | * | 00h | * | 80h~FEh | * | * | * | * | * | * | * |
| 47 | FEh | * | 00h | * | 01h | * | * | * | * | * | * | * |
| 48 | FEh | * | 00h | * | 02h~79h | * | * | * | * | * | * | * |
| 49 | 02h | * | * | * | 00h | * | FFh | * | * | * | * | * |
| 50 | 02h | * | * | * | 00h | * | 80h~FEh | * | * | * | * | * |
| 51 | 02h | * | * | * | 00h | * | 01h | * | * | * | * | * |
| 52 | 02h | * | * | * | 00h | * | 02h~79h | * | * | * | * | * |
| 53 | FEh | * | 00h | * | 00h | * | 80h~FFh | * | * | * | * | * |
| 54 | FEh | * | 00h | * | 00h | * | 00h | * | * | * | * | * |
| 55 | FEh | * | * | * | 00h | * | 01h~79h | * | * | * | * | * |
| 56 | 02h | * | * | * | 00h | * | 00h | * | 80h~FFh | * | * | * |
| 57 | 02h | * | * | * | 00h | * | 00h | * | 00h | * | * | * |
| 58 | 02h | * | * | * | 00h | * | 00h | * | 01h~79h | * | * | * |
| 59 | FFh | * | FDh | * | * | * | * | * | * | * | * | * |
| 60 | FFh | * | 80h~FCh | * | * | * | * | * | * | * | * | * |

| * | 00h~FFh |
|---|---|

FIG. 8D

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 61 | FFh | * | 03h | * | * | * | * | * | * | * | * | * |
| 62 | FFh | * | 04h~79h | * | * | * | * | * | * | * | * | * |
| 63 | 01h | * | * | FDh | * | * | * | * | * | * | * | * |
| 64 | 01h | * | * | 80h~FCh | * | * | * | * | * | * | * | * |
| 65 | 01h | * | * | 03h | * | * | * | * | * | * | * | * |
| 66 | 01h | * | * | 04h~79h | * | * | * | * | * | * | * | * |
| 67 | FFh | * | FEh | * | 80h~FFh | * | * | * | * | * | * | * |
| 68 | FFh | * | FEh | * | 00h | * | * | * | * | * | * | * |
| 69 | FFh | * | FEh | * | 01h~79h | * | * | * | * | * | * | * |
| 70 | FFh | * | 02h | * | * | * | 80h~FFh | * | * | * | * | * |
| 71 | FFh | * | 02h | * | * | * | 00h | * | * | * | * | * |
| 72 | FFh | * | 02h | * | * | * | 01h~79h | * | * | * | * | * |
| 73 | 01h | * | * | FFh | 80h~FFh | * | * | * | * | * | * | * |
| 74 | 01h | * | * | FFh | 00h | * | * | * | * | * | * | * |
| 75 | 01h | * | * | FFh | 01h~79h | * | * | * | * | * | * | * |
| 76 | 01h | * | * | 02h | * | * | * | 80h~FFh | * | * | * | * |
| 77 | 01h | * | * | 02h | * | * | * | 00h | * | * | * | * |
| 78 | 01h | * | * | 02h | * | * | * | 01h~79h | * | * | * | * |
| 79 | FFh | * | FFh | * | FFh | * | * | * | * | * | * | * |
| 80 | FFh | * | FFh | * | 80h~FEh | * | * | * | * | * | * | * |

PATTERN CONTENTS

| * | 00h~FFh |

FIG. 8E

| PATTERN NUMBER | PATTERN CONTENTS ||||||||||||
|---|---|---|---|---|---|---|---|---|---|---|---|
| | byte 0 | byte 1 | byte 2 | byte 3 | byte 4 | byte 5 | byte 6 | byte 7 | byte 8 | byte 9 | byte 10 | byte 11 |
| 81 | FFh | * | FFh | * | 01h | * | * | * | * | * | * | * |
| 82 | FFh | * | FFh | * | 02h~79h | * | * | * | * | * | * | * |
| 83 | FFh | * | 01h | * | * | FFh | * | * | * | * | * | * |
| 84 | FFh | * | 01h | * | * | 80h~FEh | * | * | * | * | * | * |
| 85 | FFh | * | 01h | * | * | 01h | * | * | * | * | * | * |
| 86 | FFh | * | 01h | * | * | 02h~79h | * | * | * | * | * | * |
| 87 | 01h | * | * | FFh | * | FFh | * | * | * | * | * | * |
| 88 | 01h | * | * | FFh | * | 80h~FEh | * | * | * | * | * | * |
| 89 | 01h | * | * | FFh | * | 01h | * | * | * | * | * | * |
| 90 | 01h | * | * | FFh | * | 02h~79h | * | * | * | * | * | * |
| 91 | 01h | * | * | 01h | * | * | FFh | * | * | * | * | * |
| 92 | 01h | * | * | 01h | * | * | 80h~FEh | * | * | * | * | * |
| 93 | 01h | * | * | 01h | * | * | 01h | * | * | * | * | * |
| 94 | 01h | * | * | 01h | * | * | 02h~79h | * | * | * | * | * |
| 95 | FFh | * | FFh | * | 00h | * | 80h~FFh | * | * | * | * | * |
| 96 | FFh | * | FFh | * | 00h | * | 00h | * | * | * | * | * |
| 97 | FFh | * | FFh | * | 00h | * | 01h~79h | * | * | * | * | * |
| 98 | FFh | * | 01h | * | * | 00h | * | 80h~FFh | * | * | * | * |
| 99 | FFh | * | 01h | * | * | 00h | * | 00h | * | * | * | * |
| 100 | FFh | * | 01h | * | * | 00h | * | 01h~79h | * | * | * | * |

| * | 00h~FFh |
|---|---|

FIG. 8F

| PATTERN NUMBER | PATTERN CONTENTS | | | | | | | | | | |
|---|---|---|---|---|---|---|---|---|---|---|---|
| | byte 0 | byte 1 | byte 2 | byte 3 | byte 4 | byte 5 | byte 6 | byte 7 | byte 8 | byte 9 | byte 10 | byte 11 |
| 101 | 01h | * | * | FFh | * | 00h | * | 80h~FFh | * | * | * | * |
| 102 | 01h | * | * | FFh | * | 00h | * | 00h | * | * | * | * |
| 103 | 01h | * | * | FFh | * | 00h | * | 01h~79h | * | * | * | * |
| 104 | 01h | * | * | 01h | * | * | 00h | * | 80h~FFh | * | * | * |
| 105 | 01h | * | * | 01h | * | * | 00h | * | 00h | * | * | * |
| 106 | 01h | * | * | 01h | * | * | 00h | * | 01h~79h | * | * | * |
| 107 | FFh | * | 00h | * | FEh | * | * | * | * | * | * | * |
| 108 | FFh | * | 00h | * | 80h~FDh | * | * | * | * | * | * | * |
| 109 | FFh | * | 00h | * | 02h | * | * | * | * | * | * | * |
| 110 | FFh | * | 00h | * | 03h~79h | * | * | * | * | * | * | * |
| 111 | 01h | * | * | 00h | * | FEh | * | * | * | * | * | * |
| 112 | 01h | * | * | 00h | * | 80h~FDh | * | * | * | * | * | * |
| 113 | 01h | * | * | 00h | * | 02h | * | * | * | * | * | * |
| 114 | 01h | * | * | 00h | * | 03h~79h | * | * | * | * | * | * |
| 115 | FFh | * | * | * | FFh | * | 80h~FFh | * | * | * | * | * |
| 116 | FFh | * | * | * | FFh | * | 00h | * | * | * | * | * |
| 117 | FFh | * | * | * | FFh | * | 01h~79h | * | * | * | * | * |
| 118 | FFh | * | 00h | * | 00h | * | * | 80h~FFh | * | * | * | * |
| 119 | FFh | * | 00h | * | 01h | * | * | 00h | * | * | * | * |
| 120 | FFh | * | 00h | * | 01h | * | * | 01h~79h | * | * | * | * |

| | 00h~FFh |
|---|---|
| * | |

FIG. 8G

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 121 | 01h | * | * | 00h | * | FFh | * | 80h~FFh | * | * | * | * |
| 122 | 01h | * | * | 00h | * | FFh | * | 00h | * | * | * | * |
| 123 | 01h | * | * | 00h | * | FFh | * | 01h~79h | * | * | * | * |
| 124 | 01h | * | * | 00h | * | 01h | * | * | 80h~FFh | * | * | * |
| 125 | 01h | * | * | 00h | * | 01h | * | * | 00h | * | * | * |
| 126 | 01h | * | * | 00h | * | 01h | * | * | 01h~79h | * | * | * |
| 127 | FFh | * | 00h | * | 00h | * | FFh | * | * | * | * | * |
| 128 | FFh | * | 00h | * | 00h | * | 80h~FEh | * | * | * | * | * |
| 129 | FFh | * | 00h | * | 00h | * | 01h | * | * | * | * | * |
| 130 | FFh | * | 00h | * | 00h | * | 02h~79h | * | * | * | * | * |
| 131 | 01h | * | * | 00h | * | 00h | * | FFh | * | * | * | * |
| 132 | 01h | * | * | 00h | * | 00h | * | 80h~FEh | * | * | * | * |
| 133 | 01h | * | * | 00h | * | 00h | * | 01h | * | * | * | * |
| 134 | 01h | * | * | 00h | * | 00h | * | 02h~79h | * | * | * | * |
| 135 | FFh | * | 00h | * | 00h | * | 00h | * | 80h~FFh | * | * | * |
| 136 | FFh | * | 00h | * | 00h | * | 00h | * | 00h | * | * | * |
| 137 | FFh | * | 00h | * | 00h | * | 00h | * | 01h~79h | * | * | * |
| 138 | 01h | * | * | 00h | * | 00h | * | 00h | * | 80h~FFh | * | * |
| 139 | 01h | * | * | 00h | * | 00h | * | 00h | * | 00h | * | * |
| 140 | 01h | * | * | 00h | * | 00h | * | 00h | * | 01h~79h | * | * |

| * | 00h~FFh |
|---|---|

FIG. 8H

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 141 | 00h | * | FCh | * | * | * | * | * | * | * | * | * |
| 142 | 00h | * | 80h~FBh | * | * | * | * | * | * | * | * | * |
| 143 | 00h | * | 04h | * | * | * | * | * | * | * | * | * |
| 144 | 00h | * | 05h~79h | * | * | * | * | * | * | * | * | * |
| 145 | 00h | * | FDh | * | 80h~FFh | * | * | * | * | * | * | * |
| 146 | 00h | * | FDh | * | 00h | * | * | * | * | * | * | * |
| 147 | 00h | * | FDh | * | 01h~79h | * | * | * | * | * | * | * |
| 148 | 00h | * | 03h | * | * | * | * | 80h~FFh | * | * | * | * |
| 149 | 00h | * | 03h | * | * | * | * | 00h | * | * | * | * |
| 150 | 00h | * | 03h | * | * | * | * | 01h~79h | * | * | * | * |
| 151 | 00h | * | FEh | * | FFh | * | * | * | * | * | * | * |
| 152 | 00h | * | FEh | * | 80h~FEh | * | * | * | * | * | * | * |
| 153 | 00h | * | FEh | * | 01h | * | * | * | * | * | * | * |
| 154 | 00h | * | FEh | * | 02h~79h | * | * | * | * | * | * | * |
| 155 | 00h | * | 02h | * | * | * | FFh | * | * | * | * | * |
| 156 | 00h | * | 02h | * | * | * | 80h~FEh | * | * | * | * | * |
| 157 | 00h | * | 02h | * | * | * | 01h | * | * | * | * | * |
| 158 | 00h | * | 02h | * | * | * | 02h~79h | * | * | * | * | * |
| 159 | 00h | * | FEh | * | 00h | * | 80h~FFh | * | * | * | * | * |
| 160 | 00h | * | FEh | * | 00h | * | 00h | * | * | * | * | * |

| | |
|---|---|
| * | 00h~FFh |

FIG. 8I

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 161 | 00h | * | FEh | * | 00h | * | 01h~79h | * | * | * | * | * |
| 162 | 00h | * | 02h | * | * | * | 00h | * | 80h~FFh | * | * | * |
| 163 | 00h | * | 02h | * | * | * | 00h | * | 00h | * | * | * |
| 164 | 00h | * | 02h | * | * | * | 00h | * | 01h~79h | * | * | * |
| 165 | 00h | * | FFh | * | FEh | * | * | * | * | * | * | * |
| 166 | 00h | * | FFh | * | 80h~FDh | * | * | * | * | * | * | * |
| 167 | 00h | * | FFh | * | 02h | * | * | * | * | * | * | * |
| 168 | 00h | * | FFh | * | 03h~79h | * | * | * | * | * | * | * |
| 169 | 00h | * | 01h | * | * | FEh | * | * | * | * | * | * |
| 170 | 00h | * | 01h | * | * | 80h~FDh | * | * | * | * | * | * |
| 171 | 00h | * | 01h | * | * | 02h | * | * | * | * | * | * |
| 172 | 00h | * | 01h | * | * | 03h~79h | * | * | * | * | * | * |
| 173 | 00h | * | FFh | * | FFh | * | 80h~FFh | * | * | * | * | * |
| 174 | 00h | * | FFh | * | FFh | * | 00h | * | * | * | * | * |
| 175 | 00h | * | FFh | * | FFh | * | 01h~79h | * | * | * | * | * |
| 176 | 00h | * | FFh | * | 01h | * | * | 80h~FFh | * | * | * | * |
| 177 | 00h | * | FFh | * | 01h | * | * | 00h | * | * | * | * |
| 178 | 00h | * | FFh | * | 01h | * | * | 01h~79h | * | * | * | * |
| 179 | 00h | * | 01h | * | * | FFh | * | 80h~FFh | * | * | * | * |
| 180 | 00h | * | 01h | * | * | FFh | * | 00h | * | * | * | * |

| | |
|---|---|
| | 00h~FFh |
| * | |

FIG. 8J

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 181 | 00h | * | 01h | * | * | FFh | * | 01h~79h | * | * | * | * |
| 182 | 00h | * | 01h | * | * | 01h | * | * | 80h~FFh | * | * | * |
| 183 | 00h | * | 01h | * | * | 01h | * | * | 00h | * | * | * |
| 184 | 00h | * | 01h | * | * | 01h | * | * | 01h~79h | * | * | * |
| 185 | 00h | * | FFh | * | 00h | * | FFh | * | * | * | * | * |
| 186 | 00h | * | FFh | * | 00h | * | 80h~FEh | * | * | * | * | * |
| 187 | 00h | * | FFh | * | 00h | * | 01h | * | * | * | * | * |
| 188 | 00h | * | FFh | * | 00h | * | 02h~79h | * | * | * | * | * |
| 189 | 00h | * | 01h | * | * | 00h | * | FFh | * | * | * | * |
| 190 | 00h | * | 01h | * | * | 00h | * | 80h~FEh | * | * | * | * |
| 191 | 00h | * | 01h | * | * | 00h | * | 01h | * | * | * | * |
| 192 | 00h | * | 01h | * | * | 00h | * | 02h~79h | * | * | * | * |
| 193 | 00h | * | FFh | * | 00h | * | 00h | * | 80h~FFh | * | * | * |
| 194 | 00h | * | FFh | * | 00h | * | 00h | * | 00h | * | * | * |
| 195 | 00h | * | FFh | * | 00h | * | 00h | * | 01h~79h | * | * | * |
| 196 | 00h | * | 01h | * | * | 00h | 00h | * | * | 80h~FFh | * | * |
| 197 | 00h | * | 01h | * | * | 00h | 00h | * | * | 00h | * | * |
| 198 | 00h | * | 01h | * | * | 00h | 00h | * | * | 01h~79h | * | * |
| 199 | 00h | * | 00h | * | FDh | * | * | * | * | * | * | * |
| 200 | 00h | * | 00h | * | 80h~FCh | * | * | * | * | * | * | * |

| * | 00h~FFh |
|---|---|

FIG. 8K

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 201 | 00h | * | 00h | * | 03h | * | * | * | * | * | * | * |
| 202 | 00h | * | 00h | * | 04h~79h | * | * | * | * | * | * | * |
| 203 | 00h | * | 00h | * | FEh | * | 80h~FFh | * | * | * | * | * |
| 204 | 00h | * | 00h | * | FEh | * | 00h | * | * | * | * | * |
| 205 | 00h | * | 00h | * | FEh | * | 01h~79h | * | * | * | * | * |
| 206 | 00h | * | 00h | * | 02h | * | | * | 80h~FFh | * | * | * |
| 207 | 00h | * | 00h | * | 02h | * | | * | 00h | * | * | * |
| 208 | 00h | * | 00h | * | 02h | * | | * | 01h~79h | * | * | * |
| 209 | 00h | * | 00h | * | FFh | * | FFh | * | * | * | * | * |
| 210 | 00h | * | 00h | * | FFh | * | 80h~FEh | * | * | * | * | * |
| 211 | 00h | * | 00h | * | FFh | * | 01h | * | * | * | * | * |
| 212 | 00h | * | 00h | * | FFh | * | 02h~79h | * | * | * | * | * |
| 213 | 00h | * | 00h | * | 01h | * | | FFh | * | * | * | * |
| 214 | 00h | * | 00h | * | 01h | * | | 80h~FEh | * | * | * | * |
| 215 | 00h | * | 00h | * | 01h | * | | 01h | * | * | * | * |
| 216 | 00h | * | 00h | * | 01h | * | | 02h~79h | * | * | * | * |
| 217 | 00h | * | 00h | * | FFh | * | 00h | * | 80h~FFh | * | * | * |
| 218 | 00h | * | 00h | * | FFh | * | 00h | * | 00h | * | * | * |
| 219 | 00h | * | 00h | * | FFh | * | 00h | * | 01h~79h | * | * | * |
| 220 | 00h | * | 00h | * | 01h | * | | 00h | * | 80h~FFh | * | * |

| * | 00h~FFh |
|---|---|

FIG. 8L

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| | | | | | | PATTERN CONTENTS | | | | | | |
| 221 | 00h | * | 00h | * | 01h | * | * | 00h | * | 00h | * | * |
| 222 | 00h | * | 00h | * | 01h | * | * | 00h | * | 01h~79h | * | * |
| 223 | 00h | * | 00h | * | 00h | * | FEh | * | * | * | * | * |
| 224 | 00h | * | 00h | * | 00h | * | 80h~FDh | * | * | * | * | * |
| 225 | 00h | * | 00h | * | 00h | * | 02h | * | * | * | * | * |
| 226 | 00h | * | 00h | * | 00h | * | 03h~79h | * | * | * | * | * |
| 227 | 00h | * | 00h | * | 00h | * | FFh | * | 80h~FFh | * | * | * |
| 228 | 00h | * | 00h | * | 00h | * | FFh | * | 00h | * | * | * |
| 229 | 00h | * | 00h | * | 00h | * | FFh | * | 01h~79h | * | * | * |
| 230 | 00h | * | 00h | * | 00h | * | 01h | * | * | 80h~FFh | * | * |
| 231 | 00h | * | 00h | * | 00h | * | 01h | * | * | 00h | * | * |
| 232 | 00h | * | 00h | * | 00h | * | 01h | * | * | 01h~79h | * | * |
| 233 | 00h | * | 00h | * | 00h | * | 00h | * | FFh | * | * | * |
| 234 | 00h | * | 00h | * | 00h | * | 00h | * | 80h~FEh | * | * | * |
| 235 | 00h | * | 00h | * | 00h | * | 00h | * | 01h | * | * | * |
| 236 | 00h | * | 00h | * | 00h | * | 00h | * | 02h~79h | * | * | * |
| 237 | 00h | * | 00h | * | 00h | * | 00h | * | 00h | * | 80h~FFh | * |
| 238 | 00h | * | 00h | * | 00h | * | 00h | * | 00h | * | 00h | * |
| 239 | 00h | * | 00h | * | 00h | * | 00h | * | 00h | * | 01h~79h | * |

| * | 00h~FFh |
|---|---|

F I G. 9
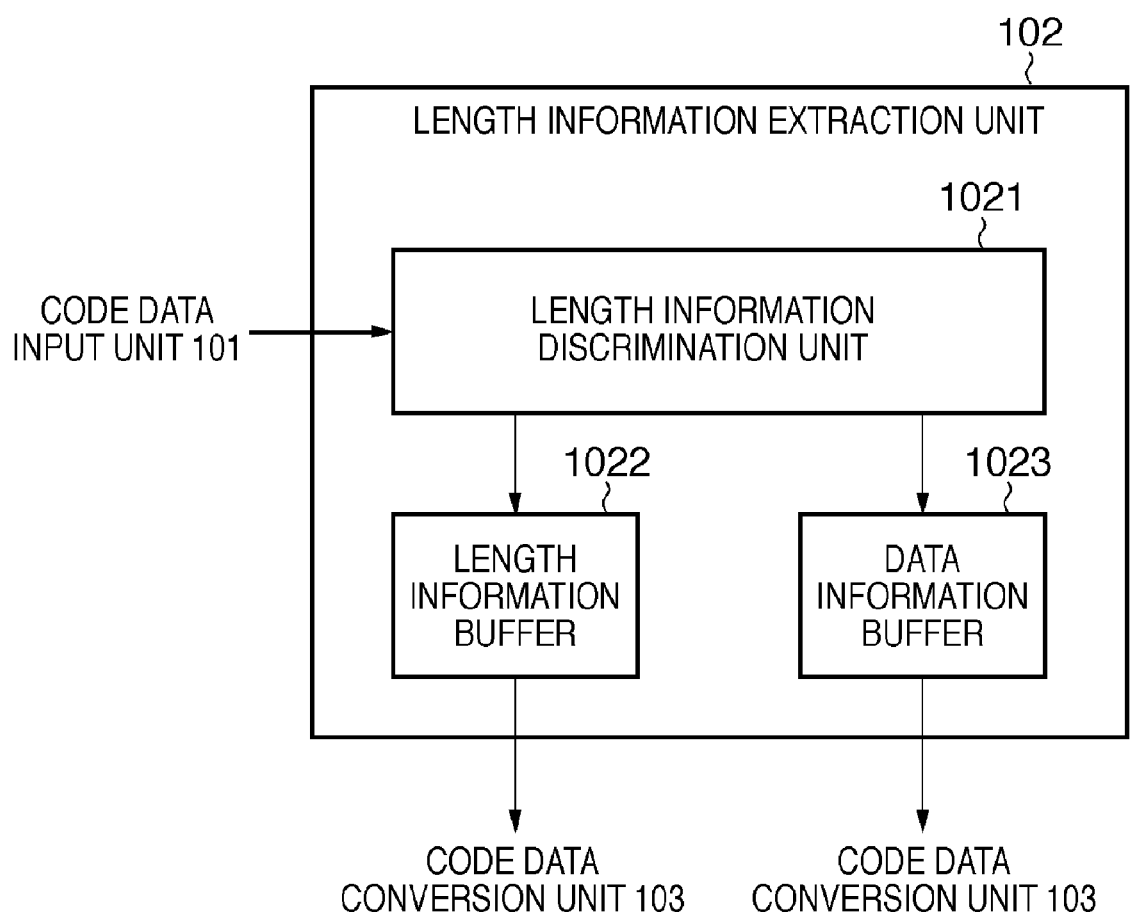

F I G. 21A
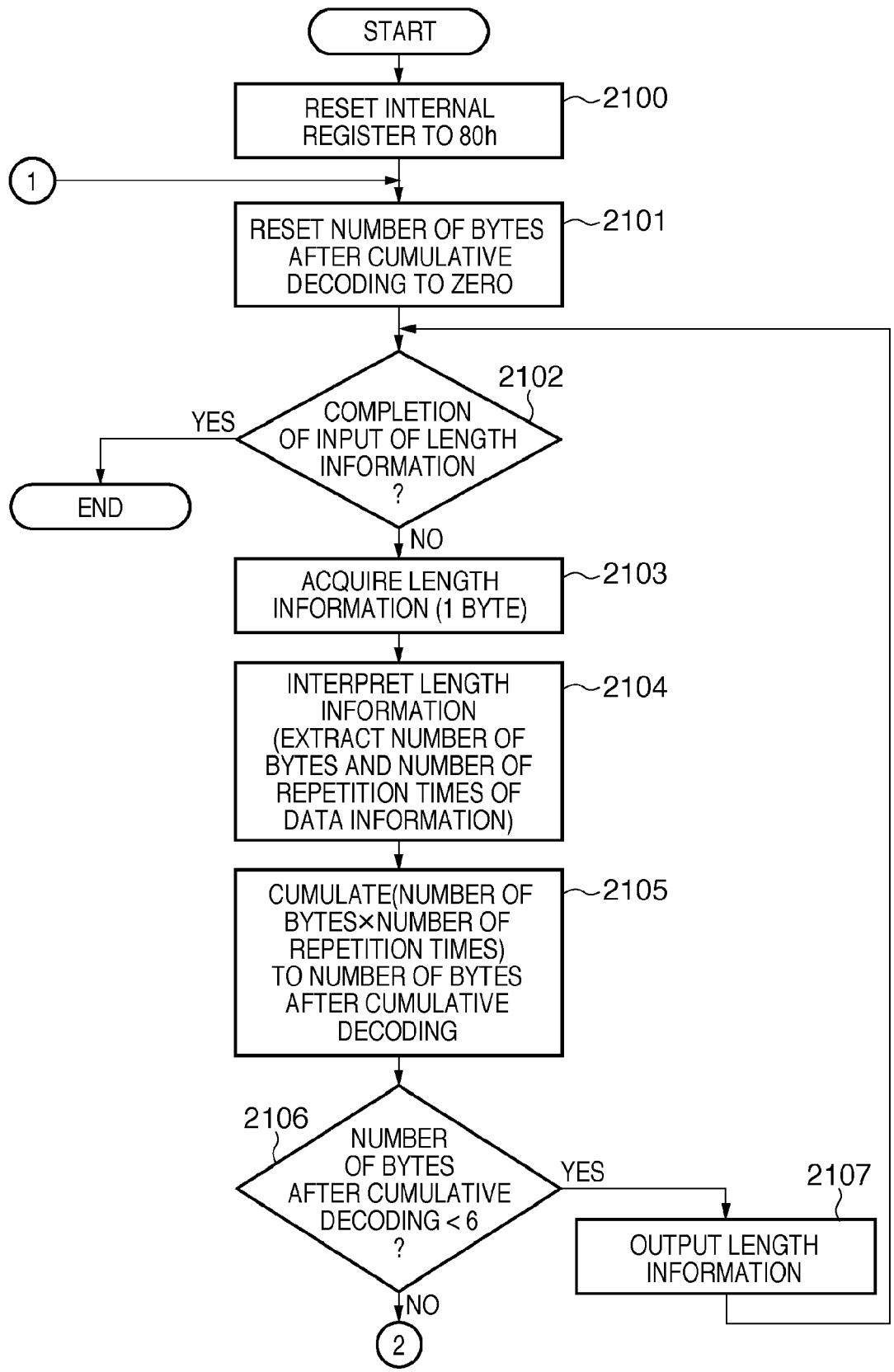

FIG. 23A

| PATTERN NUMBER | PATTERN CONTENTS ||||||||||||
|---|---|---|---|---|---|---|---|---|---|---|---|
| | byte 0 | byte 1 | byte 2 | byte 3 | byte 4 | byte 5 | byte 6 | byte 7 | byte 8 | byte 9 | byte 10 | byte 11 |
| 1 | FBh | * | | | | | | | | | | |
| 2 | 80h~FAh | * | | | | | | | | | | |
| 3 | 05h | * | * | | | | | | | | | |
| 4 | 06h~79h | * | * | | | | | | | | | |
| 5 | FCh | * | 80h~FFh | * | | | | | | | | |
| 6 | FCh | * | 00h | * | | | | | | | | |
| 7 | FCh | * | 01h~79h | * | | | | | | | | |
| 8 | 04h | * | * | * | * | * | 80h~FFh | * | * | * | * | * |
| 9 | 04h | * | * | * | * | * | 00h | * | * | * | * | * |
| 10 | 04h | * | * | * | * | * | 01h~79h | * | * | * | * | * |
| 11 | FDh | * | FFh | * | * | * | * | * | * | * | * | * |
| 12 | FDh | * | 80h~FEh | * | * | * | * | * | * | * | * | * |
| 13 | FDh | * | 01h | * | * | * | * | * | * | * | * | * |
| 14 | FDh | * | 02h~79h | * | * | * | * | * | * | * | * | * |
| 15 | 03h | * | * | * | FFh | * | * | * | * | * | * | * |
| 16 | 03h | * | * | * | 80h~FEh | * | * | * | * | * | * | * |
| 17 | 03h | * | * | * | 01h | * | * | * | * | * | * | * |
| 18 | 03h | * | * | * | 02h~79h | * | * | * | * | * | * | * |
| 19 | FDh | * | 00h | * | 80h~FFh | * | * | * | * | * | * | * |
| 20 | FDh | * | 00h | * | 00h | * | * | * | * | * | * | * |

\* : 00h~FFh

FIG. 23B

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 21 | FDh | * | 00h | * | 01h~79h | * | * | * | * | * | * | * |
| 22 | 03h | * | * | * | * | 00h | * | 80h~FFh | * | * | * | * |
| 23 | 03h | * | * | * | * | 00h | * | 00h | * | * | * | * |
| 24 | 03h | * | * | * | * | 00h | * | 01h~79h | * | * | * | * |
| 25 | FEh | * | FEh | * | * | * | * | * | * | * | * | * |
| 26 | FEh | * | 80h~FDh | * | * | * | * | * | * | * | * | * |
| 27 | FEh | * | 02h | * | FEh | * | * | * | * | * | * | * |
| 28 | FEh | * | 03h~79h | * | 80h~FDh | * | * | * | * | * | * | * |
| 29 | 02h | * | * | * | 02h | * | * | * | * | * | * | * |
| 30 | 02h | * | * | * | 03h~79h | * | * | * | * | * | * | * |
| 31 | 02h | * | * | * | 80h~FFh | * | * | * | * | * | * | * |
| 32 | 02h | * | FFh | * | 80h~FFh | * | * | * | * | * | * | * |
| 33 | FEh | * | FFh | * | 00h | * | * | * | * | * | * | * |
| 34 | FEh | * | FFh | * | 01h~79h | * | * | * | * | * | * | * |
| 35 | FEh | * | 01h | * | * | 80h~FFh | * | * | * | * | * | * |
| 36 | FEh | * | 01h | * | * | 00h | * | * | * | * | * | * |
| 37 | FEh | * | 01h | * | * | 01h~79h | * | * | * | * | * | * |
| 38 | 02h | * | * | * | FFh | * | 80h~FFh | * | * | * | * | * |
| 39 | 02h | * | * | * | FFh | * | 00h | * | * | * | * | * |
| 40 | 02h | * | * | * | | | | | | | | |

\* 00h~FFh

FIG. 23C

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 41 | 02h | * | * | * | FFh | * | 01h~79h | * | * | * | * | * |
| 42 | 02h | * | * | * | 01h | * | 80h~FFh | * | * | * | * | * |
| 43 | 02h | * | * | * | 01h | * | 00h | * | * | * | * | * |
| 44 | 02h | * | * | * | 01h | * | 01h~79h | * | * | * | * | * |
| 45 | FEh | * | 00h | * | FFh | * | * | * | * | * | * | * |
| 46 | FEh | * | 00h | * | 80h~FEh | * | * | * | * | * | * | * |
| 47 | FEh | * | 00h | * | 01h | * | * | * | * | * | * | * |
| 48 | FEh | * | 00h | * | 02h~79h | * | * | * | * | * | * | * |
| 49 | 02h | * | * | * | 00h | * | FFh | * | * | * | * | * |
| 50 | 02h | * | * | * | 00h | * | 80h~FEh | * | * | * | * | * |
| 51 | 02h | * | * | * | 00h | * | 01h | * | * | * | * | * |
| 52 | 02h | * | * | * | 00h | * | 02h~79h | * | * | * | * | * |
| 53 | FEh | * | 00h | * | 00h | * | 80h~FFh | * | * | * | * | * |
| 54 | FEh | * | 00h | * | 00h | * | 00h | * | * | * | * | * |
| 55 | FEh | * | 00h | * | 00h | * | 01h~79h | * | * | * | * | * |
| 56 | 02h | * | * | * | 00h | * | 00h | 80h~FFh | * | * | * | * |
| 57 | 02h | * | * | * | 00h | * | 00h | 00h | * | * | * | * |
| 58 | 02h | * | * | * | 00h | * | 00h | 01h~79h | * | * | * | * |
| 59 | FFh | * | FDh | * | * | * | * | * | * | * | * | * |
| 60 | FFh | * | 80h~FCh | * | * | * | * | * | * | * | * | * |

| | |
|---|---|
| * | 00h~FFh |

F I G. 23D

| PATTERN NUMBER | byte 0 | byte 1 | byte 2 | byte 3 | byte 4 | PATTERN CONTENTS byte 5 | byte 6 | byte 7 | byte 8 | byte 9 | byte 10 | byte 11 |
|---|---|---|---|---|---|---|---|---|---|---|---|---|
| 61 | FFh | * | 03h | * | * | * | * | * | * | * | * | * |
| 62 | FFh | * | 04h~79h | * | * | * | * | * | * | * | * | * |
| 63 | 01h | * | * | FDh | * | * | * | * | * | * | * | * |
| 64 | 01h | * | * | 80h~FCh | * | * | * | * | * | * | * | * |
| 65 | 01h | * | * | 03h | * | * | * | * | * | * | * | * |
| 66 | 01h | * | * | 04h~79h | * | * | * | * | * | * | * | * |
| 67 | FFh | * | FEh | * | 80h~FFh | * | * | * | * | * | * | * |
| 68 | FFh | * | FEh | * | 00h | * | * | * | * | * | * | * |
| 69 | FFh | * | FEh | * | 01h~79h | * | * | * | * | * | * | * |
| 70 | FFh | * | 02h | * | * | * | 80h~FFh | * | * | * | * | * |
| 71 | FFh | * | 02h | * | * | * | 00h | * | * | * | * | * |
| 72 | FFh | * | 02h | * | * | * | 01h~79h | * | * | * | * | * |
| 73 | 01h | * | * | FFh | * | 80h~FFh | * | * | * | * | * | * |
| 74 | 01h | * | * | FFh | * | 00h | * | * | * | * | * | * |
| 75 | 01h | * | * | FFh | * | 01h~79h | * | * | * | * | * | * |
| 76 | 01h | * | 02h | * | * | * | * | 80h~FFh | * | * | * | * |
| 77 | 01h | * | 02h | * | * | * | * | 00h | * | * | * | * |
| 78 | 01h | * | 02h | * | * | * | * | 01h~79h | * | * | * | * |
| 79 | FFh | * | FFh | * | FFh | * | * | * | * | * | * | * |
| 80 | FFh | * | FFh | * | 80h~FEh | * | * | * | * | * | * | * |

| * | 00h~FFh |
|---|---|

FIG. 23E

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 81 | FFh | * | FFh | * | 01h | * | * | * | * | * | * | * |
| 82 | FFh | * | FFh | * | 02h~79h | * | * | * | * | * | * | * |
| 83 | FFh | * | 01h | * | * | FFh | * | * | * | * | * | * |
| 84 | FFh | * | 01h | * | * | 80h~FEh | * | * | * | * | * | * |
| 85 | FFh | * | 01h | * | * | 01h | * | * | * | * | * | * |
| 86 | FFh | * | 01h | * | * | 02h~79h | * | * | * | * | * | * |
| 87 | 01h | * | * | FFh | * | FFh | * | * | * | * | * | * |
| 88 | 01h | * | * | FFh | * | 80h~FEh | * | * | * | * | * | * |
| 89 | 01h | * | * | FFh | * | 01h | * | * | * | * | * | * |
| 90 | 01h | * | * | FFh | * | 02h~79h | * | * | * | * | * | * |
| 91 | 01h | * | * | 01h | * | * | FFh | * | * | * | * | * |
| 92 | 01h | * | * | 01h | * | * | 80h~FEh | * | * | * | * | * |
| 93 | 01h | * | * | 01h | * | * | 01h | * | * | * | * | * |
| 94 | 01h | * | * | 01h | * | * | 02h~79h | * | * | * | * | * |
| 95 | FFh | * | FFh | * | 00h | * | 80h~FFh | * | * | * | * | * |
| 96 | FFh | * | FFh | * | 00h | * | 00h | * | * | * | * | * |
| 97 | FFh | * | FFh | * | 00h | * | 01h~79h | * | * | * | * | * |
| 98 | FFh | * | 01h | * | * | 00h | * | 80h~FFh | * | * | * | * |
| 99 | FFh | * | 01h | * | * | 00h | * | 00h | * | * | * | * |
| 100 | FFh | * | 01h | * | * | 00h | * | 01h~79h | * | * | * | * |

* : 00h~FFh

FIG. 23F

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 101 | 01h | * | * | FFh | * | 00h | * | 80h~FFh | * | * | * | * |
| 102 | 01h | * | * | FFh | * | 00h | * | 00h | * | * | * | * |
| 103 | 01h | * | * | FFh | * | 00h | * | 01h~79h | * | * | * | * |
| 104 | 01h | * | * | 01h | * | * | 00h | * | 80h~FFh | * | * | * |
| 105 | 01h | * | * | 01h | * | * | 00h | * | 00h | * | * | * |
| 106 | 01h | * | * | 01h | * | * | 00h | * | 01h~79h | * | * | * |
| 107 | FFh | 00h | * | * | FEh | * | * | * | * | * | * | * |
| 108 | FFh | 00h | * | * | 80h~FDh | * | * | * | * | * | * | * |
| 109 | FFh | 00h | * | * | 02h | * | * | * | * | * | * | * |
| 110 | FFh | 00h | * | * | 03h~79h | * | * | * | * | * | * | * |
| 111 | 01h | * | * | * | * | FEh | * | * | * | * | * | * |
| 112 | 01h | * | * | * | * | 80h~FDh | * | * | * | * | * | * |
| 113 | 01h | * | 00h | * | * | 02h | * | * | * | * | * | * |
| 114 | 01h | * | 00h | * | * | 03h~79h | * | * | * | * | * | * |
| 115 | FFh | 00h | * | * | FFh | * | 80h~FFh | * | * | * | * | * |
| 116 | FFh | 00h | * | * | FFh | * | 00h | * | * | * | * | * |
| 117 | FFh | 00h | * | * | FFh | * | 01h~79h | * | * | * | * | * |
| 118 | FFh | 00h | * | * | 00h | * | * | 80h~FFh | * | * | * | * |
| 119 | FFh | 00h | * | * | 01h | * | * | 00h | * | * | * | * |
| 120 | FFh | 00h | * | * | 01h | * | * | 01h~79h | * | * | * | * |

| | |
|---|---|
| | 00h~FFh |
| * | |

FIG. 23G

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 121 | 01h | * | * | 00h | * | FFh | * | 80h~FFh | * | * | * | * |
| 122 | 01h | * | * | 00h | * | FFh | * | 00h | * | * | * | * |
| 123 | 01h | * | * | 00h | * | FFh | * | 01h~79h | * | * | * | * |
| 124 | 01h | * | * | 00h | * | 01h | * | * | 80h~FFh | * | * | * |
| 125 | 01h | * | * | 00h | * | 01h | * | * | 00h | * | * | * |
| 126 | 01h | * | * | 00h | * | 01h | * | * | 01h~79h | * | * | * |
| 127 | FFh | * | 00h | * | 00h | * | FFh | * | * | * | * | * |
| 128 | FFh | * | 00h | * | 00h | * | 80h~FEh | * | * | * | * | * |
| 129 | FFh | * | 00h | * | 00h | * | 01h | * | * | * | * | * |
| 130 | FFh | * | 00h | * | 00h | * | 02h~79h | * | * | * | * | * |
| 131 | 01h | * | * | 00h | * | 00h | * | FFh | * | * | * | * |
| 132 | 01h | * | * | 00h | * | 00h | * | 80h~FEh | * | * | * | * |
| 133 | 01h | * | * | 00h | * | 00h | * | 01h | * | * | * | * |
| 134 | 01h | * | * | 00h | * | 00h | * | 02h~79h | * | * | * | * |
| 135 | FFh | * | 00h | * | 00h | * | 00h | 00h | 80h~FFh | * | * | * |
| 136 | FFh | * | 00h | * | 00h | * | 00h | 00h | 00h | * | * | * |
| 137 | FFh | * | 00h | * | 00h | * | 00h | 00h | 01h~79h | * | * | * |
| 138 | 01h | * | * | 00h | * | 00h | * | 00h | * | 80h~FFh | * | * |
| 139 | 01h | * | * | 00h | * | 00h | * | 00h | * | 00h | * | * |
| 140 | 01h | * | * | 00h | * | 00h | * | 00h | * | 01h~79h | * | * |

| * | 00h~FFh |
|---|---|

FIG. 23H

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 141 | 00h | * | FCh | * | * | * | * | * | * | * | * | * |
| 142 | 00h | * | 80h~FBh | * | * | * | * | * | * | * | * | * |
| 143 | 00h | * | 04h | * | * | * | * | * | * | * | * | * |
| 144 | 00h | * | 05h~79h | * | * | * | * | * | * | * | * | * |
| 145 | 00h | * | FDh | * | 80h~FFh | * | * | * | * | * | * | * |
| 146 | 00h | * | FDh | * | 00h | * | * | * | * | * | * | * |
| 147 | 00h | * | FDh | * | 01h~79h | * | * | * | * | * | * | * |
| 148 | 00h | * | 03h | * | * | * | * | 80h~FFh | * | * | * | * |
| 149 | 00h | * | 03h | * | * | * | * | 00h | * | * | * | * |
| 150 | 00h | * | 03h | * | * | * | * | 01h~79h | * | * | * | * |
| 151 | 00h | * | FEh | * | FFh | * | * | * | * | * | * | * |
| 152 | 00h | * | FEh | * | 80h~FEh | * | * | * | * | * | * | * |
| 153 | 00h | * | FEh | * | 01h | * | * | * | * | * | * | * |
| 154 | 00h | * | FEh | * | 02h~79h | * | * | * | * | * | * | * |
| 155 | 00h | * | 02h | * | * | * | FFh | * | * | * | * | * |
| 156 | 00h | * | 02h | * | * | * | 80h~FEh | * | * | * | * | * |
| 157 | 00h | * | 02h | * | * | * | 01h | * | * | * | * | * |
| 158 | 00h | * | 02h | * | * | * | 02h~79h | * | * | * | * | * |
| 159 | 00h | * | FEh | * | 00h | * | 80h~FFh | * | * | * | * | * |
| 160 | 00h | * | FEh | * | 00h | * | 00h | * | * | * | * | * |

PATTERN CONTENTS

Legend: * ; □ = 00h~FFh

FIG. 23I

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 161 | 00h | * | FEh | * | 00h | * | 01h~79h | * | * | * | * | * |
| 162 | 00h | * | 02h | * | * | * | 00h | * | 80h~FFh | * | * | * |
| 163 | 00h | * | 02h | * | * | * | 00h | * | 00h | * | * | * |
| 164 | 00h | * | 02h | * | * | * | 00h | * | 01h~79h | * | * | * |
| 165 | 00h | * | FFh | * | FEh | * | * | * | * | * | * | * |
| 166 | 00h | * | FFh | * | 80h~FDh | * | * | * | * | * | * | * |
| 167 | 00h | * | FFh | * | 02h | * | * | * | * | * | * | * |
| 168 | 00h | * | FFh | * | 03h~79h | FEh | * | * | * | * | * | * |
| 169 | 00h | * | 01h | * | * | 80h~FDh | * | * | * | * | * | * |
| 170 | 00h | * | 01h | * | * | 02h | * | * | * | * | * | * |
| 171 | 00h | * | 01h | * | * | 03h~79h | * | * | * | * | * | * |
| 172 | 00h | * | 01h | * | * | * | * | * | * | * | * | * |
| 173 | 00h | * | FFh | * | FFh | * | 80h~FFh | * | * | * | * | * |
| 174 | 00h | * | FFh | * | FFh | * | 00h | * | * | * | * | * |
| 175 | 00h | * | FFh | * | FFh | * | 01h~79h | * | * | * | * | * |
| 176 | 00h | * | FFh | * | 01h | * | * | 80h~FFh | * | * | * | * |
| 177 | 00h | * | FFh | * | 01h | * | * | 00h | * | * | * | * |
| 178 | 00h | * | FFh | * | 01h | * | * | 01h~79h | * | * | * | * |
| 179 | 00h | * | 01h | * | FFh | * | * | 80h~FFh | * | * | * | * |
| 180 | 00h | * | 01h | * | FFh | * | * | 00h | * | * | * | * |

| * | 00h~FFh |
|---|---|

FIG. 23J

| PATTERN NUMBER | PATTERN CONTENTS ||||||||||||
| --- | --- | --- | --- | --- | --- | --- | --- | --- | --- | --- | --- |
| | byte 0 | byte 1 | byte 2 | byte 3 | byte 4 | byte 5 | byte 6 | byte 7 | byte 8 | byte 9 | byte 10 | byte 11 |
| 181 | 00h | * | 01h | * | * | FFh | * | 01h~79h | * | * | | * |
| 182 | 00h | * | 01h | * | * | 01h | * | * | 80h~FFh | * | | * |
| 183 | 00h | * | 01h | * | * | 01h | * | * | 00h | * | | * |
| 184 | 00h | * | 01h | * | 00h | 01h | * | * | 01h~79h | * | | * |
| 185 | 00h | * | FFh | * | * | * | FFh | * | * | * | | |
| 186 | 00h | * | FFh | * | 00h | * | 80h~FEh | * | * | * | | * |
| 187 | 00h | * | FFh | * | 00h | * | 01h | * | * | * | | * |
| 188 | 00h | * | FFh | * | 00h | * | 02h~79h | * | * | * | | * |
| 189 | 00h | * | 01h | * | * | * | * | FFh | * | * | | * |
| 190 | 00h | * | 01h | * | 00h | 00h | * | 80h~FEh | * | * | | * |
| 191 | 00h | * | 01h | * | 00h | 00h | * | 01h | * | * | | * |
| 192 | 00h | * | 01h | * | 00h | 00h | * | 02h~79h | * | * | | * |
| 193 | 00h | * | FFh | * | * | 00h | * | * | 80h~FFh | * | | * |
| 194 | 00h | * | FFh | * | * | 00h | * | 00h | 00h | * | | * |
| 195 | 00h | * | FFh | * | * | 00h | * | 00h | 01h~79h | * | | * |
| 196 | 00h | * | 01h | * | * | 00h | * | 00h | * | 80h~FFh | * | * |
| 197 | 00h | * | 01h | * | * | 00h | * | 00h | * | 00h | * | * |
| 198 | 00h | * | 01h | * | * | 00h | * | 00h | * | 01h~79h | * | * |
| 199 | 00h | * | 00h | * | FDh | * | * | * | * | * | | |
| 200 | 00h | * | 00h | * | 80h~FCh | * | * | * | * | * | | |

| | |
| --- | --- |
| * | 00h~FFh |

FIG. 23K

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 201 | 00h | * | 00h | * | 03h | * | * | * | * | * | * | * |
| 202 | 00h | * | 00h | * | 04h~79h | * | * | * | * | * | * | * |
| 203 | 00h | * | 00h | * | FEh | * | 80h~FFh | * | * | * | * | * |
| 204 | 00h | * | 00h | * | FEh | * | 00h | * | * | * | * | * |
| 205 | 00h | * | 00h | * | FEh | * | 01h~79h | * | * | * | * | * |
| 206 | 00h | * | 00h | * | 02h | * | * | * | 80h~FFh | * | * | * |
| 207 | 00h | * | 00h | * | 02h | * | * | * | 00h | * | * | * |
| 208 | 00h | * | 00h | * | 02h | * | * | * | 01h~79h | * | * | * |
| 209 | 00h | * | 00h | * | FFh | * | FFh | * | * | * | * | * |
| 210 | 00h | * | 00h | * | FFh | * | 80h~FEh | * | * | * | * | * |
| 211 | 00h | * | 00h | * | FFh | * | 01h | * | * | * | * | * |
| 212 | 00h | * | 00h | * | FFh | * | 02h~79h | * | * | * | * | * |
| 213 | 00h | * | 00h | * | 01h | * | * | FFh | * | * | * | * |
| 214 | 00h | * | 00h | * | 01h | * | * | 80h~FEh | * | * | * | * |
| 215 | 00h | * | 00h | * | 01h | * | * | 01h | * | * | * | * |
| 216 | 00h | * | 00h | * | 01h | * | * | 02h~79h | * | * | * | * |
| 217 | 00h | * | 00h | * | FFh | * | 00h | * | 80h~FFh | * | * | * |
| 218 | 00h | * | 00h | * | FFh | * | 00h | * | 00h | * | * | * |
| 219 | 00h | * | 00h | * | FFh | * | 00h | * | 01h~79h | * | * | * |
| 220 | 00h | * | 00h | * | 01h | * | 00h | 00h | * | 80h~FFh | * | * |

PATTERN CONTENTS

| * | 00h~FFh |
|---|---|

FIG. 23L

PATTERN CONTENTS

| PATTERN NUMBER | byte 0 | byte 1 | byte 2 | byte 3 | byte 4 | byte 5 | byte 6 | byte 7 | byte 8 | byte 9 | byte 10 | byte 11 |
|---|---|---|---|---|---|---|---|---|---|---|---|---|
| 221 | 00h | * | 00h | * | 01h | * | * | 00h | * | * | * | * |
| 222 | 00h | * | 00h | * | 01h | * | * | 00h | * | 00h | * | * |
| 223 | 00h | * | 00h | * | 00h | * | FEh | * | * | 01h~79h | * | * |
| 224 | 00h | * | 00h | * | 00h | * | 80h~FDh | * | * | * | * | * |
| 225 | 00h | * | 00h | * | 00h | * | 02h | * | * | * | * | * |
| 226 | 00h | * | 00h | * | 00h | * | 03h~79h | * | * | * | * | * |
| 227 | 00h | * | 00h | * | 00h | * | FFh | * | 80h~FFh | * | * | * |
| 228 | 00h | * | 00h | * | 00h | * | FFh | * | 00h | * | * | * |
| 229 | 00h | * | 00h | * | 00h | * | FFh | * | 01h~79h | * | * | * |
| 230 | 00h | * | 00h | * | 00h | * | 01h | * | * | 80h~FFh | * | * |
| 231 | 00h | * | 00h | * | 00h | * | 01h | * | * | 00h | * | * |
| 232 | 00h | * | 00h | * | 00h | * | 01h | * | * | 01h~79h | * | * |
| 233 | 00h | * | 00h | * | 00h | * | 00h | * | FFh | * | * | * |
| 234 | 00h | * | 00h | * | 00h | * | 00h | * | 80h~FEh | * | * | * |
| 235 | 00h | * | 00h | * | 00h | * | 00h | * | 01h | * | * | * |
| 236 | 00h | * | 00h | * | 00h | * | 00h | * | 02h~79h | * | * | * |
| 237 | 01h | * | 00h | * | 00h | * | 00h | * | 00h | * | 80h~FFh | * |
| 238 | 00h | * | 00h | * | 00h | * | 00h | * | 00h | * | 00h | * |
| 239 | 00h | * | 00h | * | 00h | * | 00h | * | 00h | * | 01h~79h | * |

| * | 00h~FFh |
|---|---|

FIG. 24

| PATTERN NUMBER | PATTERN CONTENTS ||||||||
|---|---|---|---|---|---|---|---|---|
| | byte 0 | byte 1 | byte 2 | byte 3 | byte 4 | byte 5 | byte 6 | byte 7 |
| 1 | FBh | * | * | * | * | * | * | * |
| 2 | 05h | * | * | * | * | * | * | * |
| 3 | FCh | * | 00h | * | * | * | * | * |
| 4 | FDh | * | FFh | * | * | * | * | * |
| 5 | FDh | * | 01h | * | * | * | * | * |
| 6 | 03h | * | * | * | * | FFh | * | * |
| 7 | FEh | * | FEh | * | * | * | * | * |
| 8 | FEh | * | 02h | * | * | * | * | * |
| 9 | 02h | * | * | * | FEh | * | * | * |
| 10 | FEh | * | FFh | * | 00h | * | * | * |
| 11 | 02h | * | * | * | FFh | * | 00h | * |
| 12 | FEh | * | 00h | * | FFh | * | * | * |
| 13 | FFh | * | FDh | * | * | * | * | * |
| 14 | FFh | * | 03h | * | * | * | * | * |
| 15 | 01h | * | * | FDh | * | * | * | * |
| 16 | FFh | * | FEh | * | 00h | * | * | * |
| 17 | 01h | * | * | FEh | * | 00h | * | * |
| 18 | FFh | * | FFh | * | FFh | * | * | * |
| 19 | FFh | * | FFh | * | 01h | * | * | * |
| 20 | FFh | * | 01h | * | * | FFh | * | * |
| 21 | 01h | * | * | FFh | * | FFh | * | * |
| 22 | 01h | * | * | FFh | * | 01h | * | * |
| 23 | FFh | * | 00h | * | FEh | * | * | * |
| 24 | FFh | * | 00h | * | FFh | * | 00h | * |
| 25 | 00h | * | FCh | * | * | * | * | * |
| 26 | 00h | * | FDh | * | 00h | * | * | * |
| 27 | 00h | * | FEh | * | FFh | * | * | * |
| 28 | 00h | * | FEh | * | 01h | * | * | * |
| 29 | 00h | * | FFh | * | FEh | * | * | * |
| 30 | 00h | * | FFh | * | 02h | * | * | * |
| 31 | 00h | * | FFh | * | FFh | * | 00h | * |
| 32 | 00h | * | FFh | * | 00h | * | FFh | * |

| * | 00h~FFh |
|---|---|

F I G. 25

| 05 | 01 | 02 | 03 | 04 | 05 | 06 | FF | 06 | 03 | 07 | 08 | 09 | 0A | FB | 0B | 05 | 0B | 0C | 0D | 0E | 0F | 10 | 00 | 11 | FC | 12 | FF | 12 |

DATA CONVERSION APPARATUS AND CONTROL METHOD THEREOF

BACKGROUND OF THE INVENTION

1. Field of the Invention

The present invention relates to a data conversion apparatus which handles code data, and a control method thereof.

2. Description of the Related Art

In order to reduce a bus width required for data transfer and an area required for data storage in a system that handles a data sequence, a technique for compressing data by encode processing prior to data transfer or storage is available. Processing that restores data when the contents of that data are required is decode processing.

Various kinds of encoding formats are available. However, as for document image data in which identical pixel values often run, a runlength encoding format which can be implemented by a simple and low-cost hardware arrangement is normally adopted. At this time, when one pixel is expressed by 1 byte, it is a common practice to attain runlength compression for respective bytes using 1 byte as length information.

On the other hand, the data size of image data used in a print operation of a printer (or printer engine) is also reduced by the aforementioned data encode/decode processing. In this case, encoded image data is decoded to catch up timings at which the printer requires data, and the decoded data is sequentially transferred to the printer. That is, the decode processing requires realtimeness. For this reason, in order to prevent data used in the print operation from being omitted, the decode processing speed has to be equal to or higher than the data request speed of the printer.

Processing for decoding runlength-encoded code data is sequential processing for respective unit codes composing the code data. This is because the runlength-encoded code data includes a run of a plurality of sets of length information and data information, and the runlength encoding is a variable length encoding method in which the number of pieces of subsequent data information is determined depending on the contents of the length information. Each set is called a unit code. In order to find the next length information, previous length information has to be evaluated, and simple parallel processing cannot be executed.

On the other hand, the number of data that can be output by evaluating one length information is variable, and is normally 1 in case of the minimum number of data. Therefore, the processing speed of a decoding circuit which operates in synchronism with clocks is 1 data/cycle in case of the minimum number of data. For example, upon decoding code data runlength-encoded for 1-byte units, the processing speed is 1 byte/cycle in case of the minimum number of data. When this processing speed is expressed by a throughput (a data size that can be processed per unit time), a minimum throughput is 1 or simply, a throughput is 1.

In recent years, since the printer technology has been improved, printers which can execute print operations with higher resolutions and higher speeds than the conventional printers are available. When the resolution and print speed become higher, a data size required for a print operation per unit time also becomes larger, and a data size to be transferred to a printer inevitably increases. Some high-resolution or high-speed printers require data transfer of, for example, six data per cycle. In this case, the processing speed of runlength decoding (throughput=1) is lower than the data request speed of a printer (throughput=6). For this reason, with an arrangement which simply decodes data in real time and transfers decoded data to a printer, the data transfer speed to the printer cannot catch up the data request speed.

For this reason, a technique which decodes code data in advance, stores decoded data in an intermediate buffer, and reads out and transfers the decoded data from the intermediate buffer in response to a request from a printer so as to avoid any data omissions may be used. Or a method which drives a decoding circuit using a clock signal having a frequency six times that of a data transfer circuit to configure a circuit that allows to decode six data per data transfer cycle may be used. Or a technique that simultaneously decodes a plurality of unit codes (sets of length information and data information) as many as the number of unit codes required to achieve a target throughput has been proposed (for example, Japanese Patent Laid-Open No. 2007-189527).

However, since the intermediate buffer in the aforementioned related art is implemented by a page memory device that stores a data size required by a printer for one print operation, it requires considerably high cost. Also, driving using the clock signal having the frequency six times that of the data transfer circuit requires high cost. This is because use of the frequency six times the operation frequency of the data transfer circuit requires high technical difficulties in terms of the semiconductor physical design, manufacturing technique, and manufacture.

With the technique which simultaneously expands a plurality of unit codes (sets of length information and data information) in a number as large as the number of unit codes required to achieve a target throughput in the aforementioned related art, when a circuit is configured to realize a throughput=6, the circuit scale and operation speed pose problems. This is because the above technique determines an operation by collating the alignment sequence of length information of input code data with a plurality of patterns which are stored in advance, but the number of patterns increases combinatorially. More specifically, in an arrangement that realizes a throughput=4, the number of patterns is 41. However, for example, in an arrangement that realizes a throughput=6, the number of patterns is 239, and a large circuit scale and a long processing delay time of a pattern matching circuit with input data are required. When the circuit scale increases, cost also increases, and when the processing delay time becomes longer, it technically becomes difficult to process data within one cycle, resulting in high cost.

SUMMARY OF THE INVENTION

The present invention has been made in consideration of the aforementioned problems, and has as its object to provide a technique that generates encoded data which can be decoded with a high throughput by a relatively simple arrangement.

In order to achieve the above object, for example, a data conversion apparatus of the present invention comprises the following arrangement. That is, there is provided a data conversion apparatus, which converts encoded data that is Packbit-encoded to have a set of length information and data information as a unit code, into new Packbit-encoded data, which is expressed by length information indicating the number of output data not more than M output data smaller than the maximum number of output data after decoding that can be expressed by one length information of Packbit-encoded data, and data information, the apparatus comprising an input unit which inputs encoded data to be converted; a separation unit which separates the input encoded data into length information and data information; a count unit which receives the length information obtained by the separation unit, and cumulatively counts the number of output data after decoding indicated by the received length information; a length information division unit which receives the length information separated by the separation unit, and divides the received length information, and which (a) outputs the received length information while a value counted by the count unit is smaller than M, (b) outputs length information of interest when the value counted by the count unit reaches M, outputs delimiter information indicating that the value reaches M, and resetting the count unit, and (c) divides the length information of interest into first length information indicating a difference between M and a counted value until length information immediately before the length information of interest, and second length information indicating the remaining number of output data when the value counted by the count unit is larger than M, outputs the first length information, outputs delimiter information indicating that the value reaches M, and sets the second length information as an initial count target to be counted by the count unit; a length information generating unit which receives the length information from the length information division unit, and generates, when a plurality of pieces of length information each indicating that data information is output once successively appear in the pieces of already received length information every time the delimiter information is input, new one length information from these pieces of successive length information; and a data combining unit which refers to the length information obtained via the length information generating unit, combines the length information and the data information separated by the separation unit, and outputs the combined information as new Packbit-encoded data.

According to the present invention, Packbit-encoded data can be re-converted into encoded data which has a throughput=M, i.e., allows to decode M data per cycle.

Further features of the present invention will become apparent from the following description of exemplary embodiments with reference to the attached drawings.

BRIEF DESCRIPTION OF THE DRAWINGS

FIG. 2 is a view showing a table of encoded data according to the embodiment;

FIG. 3 is a view showing an example of code data according to the embodiment;

FIG. 4 is a view showing bytes of the code data shown in FIG. 3 distinctly as length information and data information;

FIG. 5 is a view showing data obtained by decoding the code data shown in FIGS. 3 and 4;

FIG. 7 is a view showing patterns of code data which can obtain data of 4 bytes or more per cycle;

FIGS. 8A-8L are a view showing patterns of code data which can obtain data of 6 bytes or more per cycle;

FIG. 9 is a block diagram of a length information extraction unit according to the first embodiment;

FIGS. 21A and 21B are a flowchart showing the sequence of length information division processing in a length information division unit;

FIGS. 23A to 23L are a view distinctly showing patterns which are output from the data conversion apparatus of the first embodiment, and patterns which are not output, of those of the code data shown in FIGS. 8A to 8L;

FIG. 24 is a view showing only patterns which are output from a data conversion apparatus 1 of the first embodiment of those of the code data shown in FIGS. 23A to 23D;

FIG. 25 is a view showing an example of code data generated according to the first embodiment;

DESCRIPTION OF THE EMBODIMENTS

Embodiments according to the present invention will be described in detail hereinafter with reference to the accompanying drawings.

First Embodiment

This embodiment will explain a data conversion apparatus for Packbit-encoded data.

In general, encoded data obtained by Packbit-encoding expresses each unit code by a set of length information and data information. Especially, the maximum number of output data indicated by length information in Packbit-encoded data using a byte as a unit is 128. This embodiment will exemplify a case in which Packbit-encoded data is re-converted into M or less encoded data, which are smaller than this maximum number of data, i.e., into encoded data with a throughput=M and high decoding efficiency. For the sake of simplicity, this embodiment will explain an example of M=6.

Figure 1:
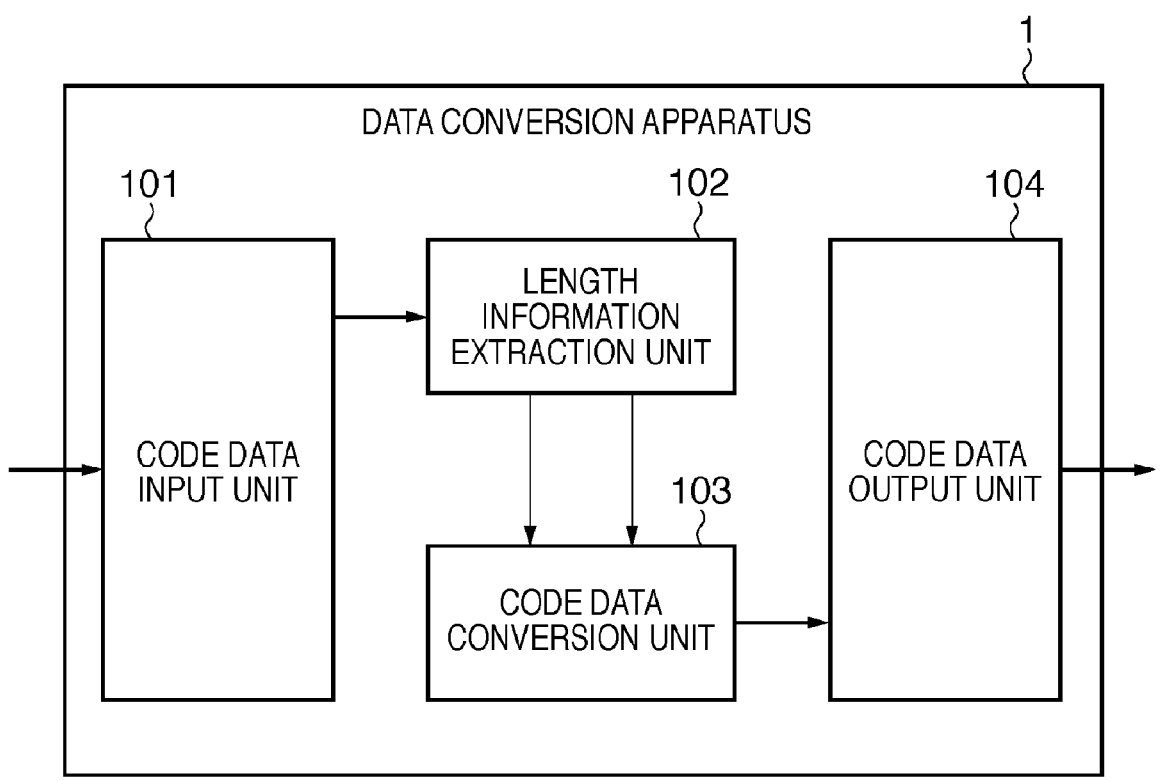
FIG. 1 is a block diagram of a data conversion apparatus according to an embodiment of the present invention.

FIG. 1 is a block diagram showing the internal arrangement of a data conversion apparatus 1 according to this embodiment. Referring to FIG. 1, reference numeral 101 denotes a code data input unit; 102, a length information extraction unit; 103, a code data conversion unit; and 104, a code data output unit.

The code data input unit 101 is connected to the length information extraction unit 102, and transfers externally received code data to be re-encoded (data to be converted) to the length information extraction unit 102 every 12 bytes.

The length information extraction unit 102 is connected to the code data input unit 101 and code data conversion unit 103. The length information extraction unit 102 divides the code data received from the code data input unit 101 into length information and data information for respective bytes, and transfers them to the code data conversion unit 103. Details of the processing sequence for dividing code data into length information and data information will be described later.

The code data conversion unit 103 is connected to the length information extraction unit 102 and code data output unit 104. The code data conversion unit 103 receives the length information and data information from the length information extraction unit 102, converts them into code data, and transfers the code data to the code data output unit 104. Details of the processing sequence for converting the received length information and data information will also be described later.

The code data output unit 104 is connected to the code data conversion unit 103, and outputs the code data received from the code data conversion unit 103.

FIG. 2 shows a specification table associated with length information included in code data to be handled by the data conversion apparatus 1. Code data can be decoded according to this specification table. Note that code data to be handled by the data conversion apparatus 1 is obtained by runlength-encoding data for respective bytes. The code data obtained by runlength-encoding includes a plurality of successive unit codes each including a set of length information (1 byte) and subsequent data information (variable-length bytes). Each unit code certainly includes length information of 1 byte at its head position. Immediately after the length information, data information of variable-length bytes follows. The length information has byte count information or repetition time count information of the data information. By interpreting the length information using the length information specification table shown in FIG. 2, the number of bytes of the data information or the number of repetition times of output of data information upon decoding can be determined.

"h" at the end of each length information in FIG. 2 indicates a hexadecimal number. As can be seen from FIG. 2, when the most significant bit (MSB) of length information is "0", i.e., when the length information is equal to or smaller than "7Fh", the number of bytes of the subsequent data information is set according to the length information. When the MSB of length information is equal to or larger than "1" (however, "80h" is not defined), the subsequent data information is surely 1 byte, and the number of output times of that data depends on the length information.

In this manner, immediately after a unit code of interest, the next unit code follows. Hence, when the number of bytes of data information of the unit code of interest is determined, the byte position of the next unit code can be determined, thus extracting length information of the next unit code. As described above, the runlength-encoded code data is code data which can uniquely undergo decoding processing by interpreting length information in turn from the head of the data and processing variable-length data information.

FIG. 3 shows an example of code data to be handled by the data conversion apparatus 1. One box in FIG. 3 represents 1-byte data, and a numerical value described in each box is data expressed by a hexadecimal number.

FIG. 4 is a view showing the code data shown in FIG. 3 by assigning numbers c0 to c23 for identification to respective bytes, and bounding each length information of the code data by a bold line. Bytes 0, 6, 8, 13, 15, and 22, i.e., numbers c0, c6, c8, c13, c15, and c22 are respective pieces of length information. Note that the code data does not have any position of each length information in addition to respective byte values, and FIG. 4 is provided only for the purpose of illustration. Whether each byte in code data is length information or data information can be determined by interpreting the code data in turn from its first byte, as described above.

FIG. 5 is a view showing data obtained by decoding the code data shown in FIGS. 3 and 4. A box in FIG. 5 represents 1-byte data, and a numerical value described in the box indicates the contents of data by a hexadecimal number. Respective byte data are assigned in turn identification numbers d0 to d31 for the purpose of illustration. According to FIG. 4, since the first 1 byte (length information) is "04", subsequent 5 bytes {01, 02, 03, 04, 05} are finally output. Therefore, 5 bytes from the head in FIG. 5 assume these values.

Figure 6:
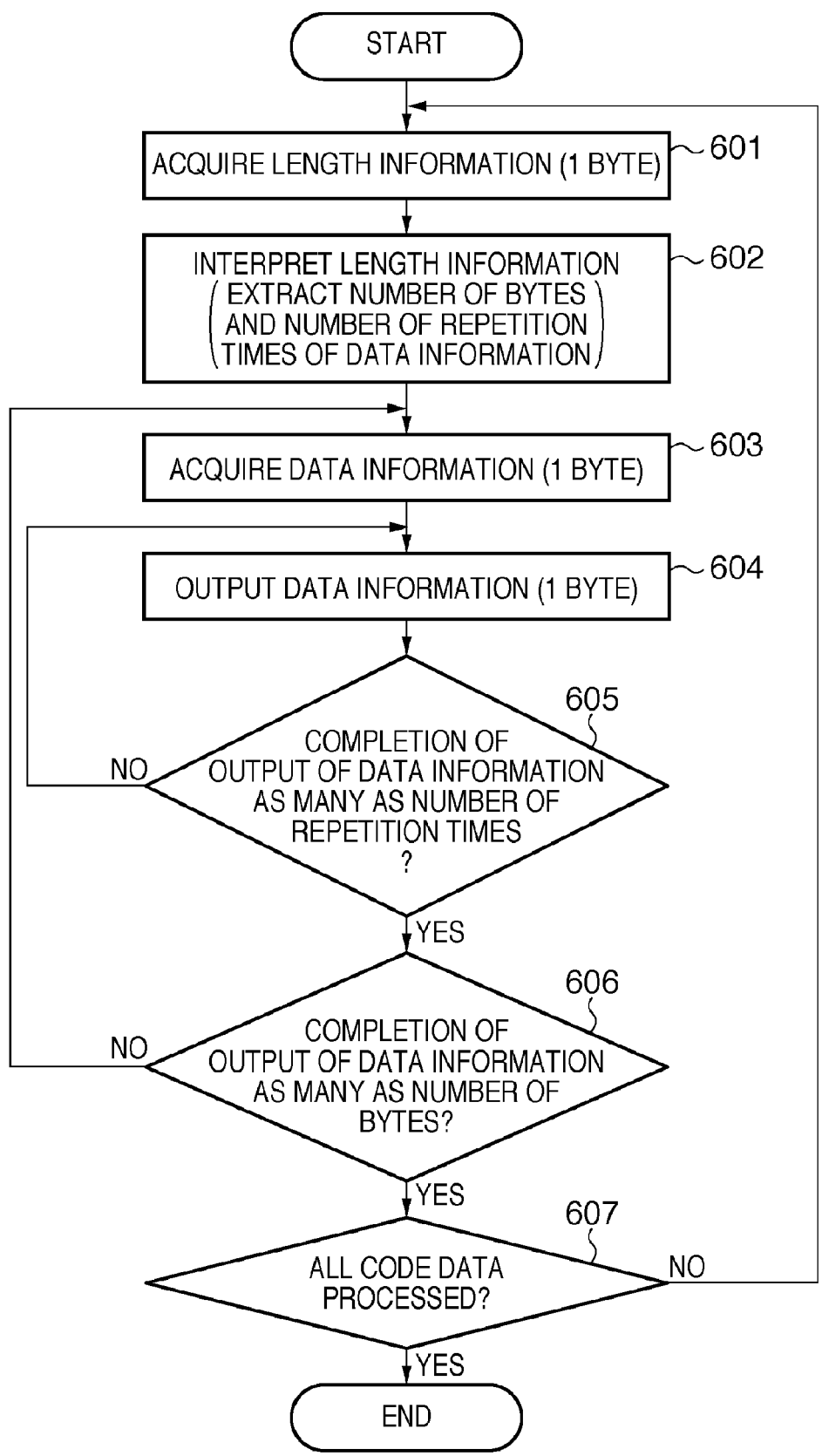
FIG. 6 is a flowchart showing the sequence of decoding processing for decoding the encoded data shown in FIG. 3.

FIG. 6 is a flowchart showing one sequence of decoding of code data to be handled by the data conversion apparatus 1. FIG. 6 shows a sequence for processing code data in turn from the first byte for respective bytes.

In step 601, 1 byte of byte data located at the head of code data to be processed is acquired. In step 602, the acquired byte data is interpreted as length information with reference to the table shown in FIG. 2 to obtain the number of bytes and the number of repetition times of output of data information. Also, the value of a byte counter as an internal counter which stores the number of acquired bytes is reset to zero.

In step 603, 1 byte of byte data located at the head of the code data to be processed is obtained to increment the byte counter by 1, and a repetition counter as an internal counter that stores the number of repetition times of output is reset to zero.

In step 604, the acquired byte data is output by 1 byte as data information, and the repetition counter is incremented by 1.

In step 605, the value of the repetition counter is compared with the number of repetition times of output obtained in step 602. If a byte or bytes as many as the number of repetition times are already output, the process advances to step 606; otherwise, the process returns to step 604. In step 606, the value of the byte counter is compared with the number of bytes of the data information obtained in step 602. If a byte or bytes in a number as large as the number of bytes are already output, the process advances to step 607; otherwise, the process return to step 603.

If it is determined in step 607 if processing is complete for all bytes of the code data, the processing ends; otherwise, the process returns to step 601.

The sequence of obtaining the data shown in FIG. 5 by decoding the code data shown in FIG. 4 will be described below with reference to the flowchart shown in FIG. 6 using the step numbers and identification numbers in these drawings.

Step 601: One byte (c0) at the head of a part to be processed of the code data is acquired as length information.

Step 602: A value "04h" ("h" at the end of the value expresses a hexadecimal number) of the length information (c0) is compared with the table shown in FIG. 2 to obtain the number of bytes=5 and the number of repetition times=1. The byte counter is reset to zero.

Step 603: One byte (c1) at the head of the part to be processed of the code data is acquired as data information, and the byte counter is incremented by 1 to obtain a value "1". Also, the repetition counter is reset to zero.

Step 604: A value "01h" of the data information (c1) is output (d0), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "1" of the byte counter is compared with the number of bytes=5 to determine that the output of bytes as many as the number of bytes is not complete yet, and the process returns to step 603.

Step 603: One byte (c2) at the head of the part to be processed of the code data is acquired as data information, and the byte counter is incremented by 1 to obtain a value "2". Also, the repetition counter is reset to zero.

Step 604: A value "02h" of the data information (c2) is output (d1), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "2" of the byte counter is compared with the number of bytes=5 to determine that the output of bytes as many as the number of bytes is not complete yet, and the process returns to step 603.

Step 603: One byte (c3) at the head of the part to be processed of the code data is acquired as data information, and the byte counter is incremented by 1 to obtain a value "3". Also, the repetition counter is reset to zero.

Step 604: A value "03h" of the data information (c3) is output (d2), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "3" of the byte counter is compared with the number of bytes=5 to determine that the output of bytes as many as the number of bytes is not complete yet, and the process returns to step 603.

Step 603: One byte (c4) at the head of the part to be processed of the code data is acquired as data information, and the byte counter is incremented by 1 to obtain a value "4". Also, the repetition counter is reset to zero.

Step 604: A value "04h" of the data information (c4) is output (d3), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "4" of the byte counter is compared with the number of bytes=5 to determine that the output of bytes as many as the number of bytes is not complete yet, and the process returns to step 603.

Step 603: One byte (c5) at the head of the part to be processed of the code data is acquired as data information, and the byte counter is incremented by 1 to obtain a value "5". Also, the repetition counter is reset to zero.

Step 604: A value "05h" of the data information (c5) is output (d4), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "5" of the byte counter is compared with the number of bytes=5 to determine that the output of bytes as many as the number of bytes is complete, and the process advances to step 607.

Step 607: Since code data to be processed still remain (c6), the process returns to step 601.

Step 601: One byte (c6) at the head of the part to be processed of the code data is acquired as length information.

Step 602: A value "FEh" (suffix "h" expresses a hexadecimal number) of the length information (c6) is compared with the table shown in FIG. 2 to obtain the number of bytes=1 and the number of repetition times=3. The byte counter is reset to zero.

Step 603: One byte (c7) at the head of the part to be processed of the code data is acquired as data information, and the byte counter is incremented by 1 to obtain a value "1". Also, the repetition counter is reset to zero.

Step 604: A value "06h" of the data information (c7) is output (d5), and the repetition counter is incremented by 1 to obtain a value "1".

Step 605: The value "1" of the repetition counter is compared with the number of repetition times=3 to determine that the output of bytes as many as the number of repetition times is not complete yet, and the process returns to step 604.

Step 604: The value "06h" of the data information (c7) is output (d6), and the repetition counter is incremented by 1 to obtain a value "2".

Step 605: The value "2" of the repetition counter is compared with the number of repetition times=3 to determine that the output of bytes as many as the number of repetition times is not complete yet, and the process returns to step 604.

Step 604: The value "06h" of the data information (c7) is output (d7), and the repetition counter is incremented by 1 to obtain a value "3".

Step 605: The value "3" of the repetition counter is compared with the number of repetition times=3 to determine that the output of bytes as many as the number of repetition times is complete, and the process advances to step 606.

Step 606: The value "1" of the byte counter is compared with the number of bytes=1 to determine that the output of a byte as many as the number of bytes is complete, and the process advances to step 607.

Step 607: Since code data to be processed still remain (c8), the process returns to step 601.

Step 601: One byte (c8) at the head of the part to be processed of the code data is acquired as length information.

Step 602: A value "03h" (suffix "h" expresses a hexadecimal number) of the length information (c8) is compared with the table shown in FIG. 2 to obtain the number of bytes=4 and the number of repetition times=1. The byte counter is reset to zero.

Step 603: One byte (c9) at the head of the part to be processed of the code data is acquired as data information, and the byte counter is incremented by 1 to obtain a value "1". Also, the repetition counter is reset to zero.

Step 604: A value "07h" of the data information (c9) is output (d8), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "1" of the byte counter is compared with the number of bytes=4 to determine that the output of bytes as many as the number of bytes is not complete yet, and the process returns to step 603.

Step 603: One byte (c10) at the head of the part to be processed of the code data is acquired as data information, and the byte counter is incremented by 1 to obtain a value "2". Also, the repetition counter is reset to zero.

Step 604: A value "08h" of the data information (c10) is output (d9), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "2" of the byte counter is compared with the number of bytes=4 to determine that the output of bytes as many as the number of bytes is not complete yet, and the process returns to step 603.

Step 603: One byte (c11) at the head of the part to be processed of the code data is acquired as data information, and the byte counter is incremented by 1 to obtain a value "3". Also, the repetition counter is reset to zero.

Step 604: A value "09h" of the data information (c11) is output (d10), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "3" of the byte counter is compared with the number of bytes=4 to determine that the output of bytes as many as the number of bytes is not complete yet, and the process returns to step 603.

Step 603: One byte (c12) at the head of the part to be processed of the code data is acquired as data information, and the byte counter is incremented by 1 to obtain a value "4". Also, the repetition counter is reset to zero.

Step 604: A value "0Ah" of the data information (c12) is output (d11), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "4" of the byte counter is compared with the number of bytes=4 to determine that the output of bytes as many as the number of bytes is complete, and the process advances to step 607.

Step 607: Since code data to be processed still remain (c13), the process returns to step 601.

Step 601: One byte (c13) at the head of the part to be processed of the code data is acquired as length information.

Step 602: A value "FAh" (suffix "h" expresses a hexadecimal number) of the length information (c13) is compared with the table shown in FIG. 2 to obtain the number of bytes=1 and the number of repetition times=7. The byte counter is reset to zero.

Step 603: One byte (c14) at the head of the part to be processed of the code data is acquired as data information, and the byte counter is incremented by 1 to obtain a value "1". Also, the repetition counter is reset to zero.

Step 604: A value "0Bh" of the data information (c14) is output (d12), and the repetition counter is incremented by 1 to obtain a value "1".

Step 605: The value "1" of the repetition counter is compared with the number of repetition times=7 to determine that the output of bytes as many as the number of repetition times is not complete yet, and the process returns to step 604.

Step 604: The value "0Bh" of the data information (c14) is output (d13), and the repetition counter is incremented by 1 to obtain a value "2".

Step 605: The value "2" of the repetition counter is compared with the number of repetition times=7 to determine that the output of bytes as many as the number of repetition times is not complete yet, and the process returns to step 604.

Step 604: The value "0Bh" of the data information (c14) is output (d14), and the repetition counter is incremented by 1 to obtain a value "3".

Step 605: The value "3" of the repetition counter is compared with the number of repetition times=7 to determine that the output of bytes as many as the number of repetition times is not complete yet, and the process returns to step 604.

Step 604: The value "0Bh" of the data information (c14) is output (d15), and the repetition counter is incremented by 1 to obtain a value "4".

Step 605: The value "4" of the repetition counter is compared with the number of repetition times=7 to determine that the output of bytes as many as the number of repetition times is not complete yet, and the process returns to step 604.

Step 604: The value "0Bh" of the data information (c14) is output (d16), and the repetition counter is incremented by 1 to obtain a value "5".

Step 605: The value "5" of the repetition counter is compared with the number of repetition times=7 to determine that the output of bytes as many as the number of repetition times is not complete yet, and the process returns to step 604.

Step 604: The value "0Bh" of the data information (c14) is output (d17), and the repetition counter is incremented by 1 to obtain a value "6".

Step 605: The value "6" of the repetition counter is compared with the number of repetition times=7 to determine that the output of bytes as many as the number of repetition times is not complete yet, and the process returns to step 604.

Step 604: The value "0Bh" of the data information (c14) is output (d18), and the repetition counter is incremented by 1 to obtain a value "7".

Step 605: The value "7" of the repetition counter is compared with the number of repetition times=7 to determine that the output of bytes as many as the number of repetition times is complete, and the process advances to step 606.

Step 606: The value "1" of the byte counter is compared with the number of bytes=1 to determine that the output of a byte as many as the number of bytes is complete, and the process advances to step 607.

Step 607: Since code data to be processed still remain (c15), the process returns to step 601.

Step 601: One byte (c15) at the head of the part to be processed of the code data is acquired as length information.

Step 602: A value "05h" (suffix "h" expresses a hexadecimal number) of the length information (c15) is compared with the table shown in FIG. 2 to obtain the number of bytes=6 and the number of repetition times=1. The byte counter is reset to zero.

Step 603: One byte (c16) at the head of the part to be processed of the code data is acquired as data information, and the byte counter is incremented by 1 to obtain a value "1". Also, the repetition counter is reset to zero.

Step 604: A value "0Ch" of the data information (c16) is output (d19), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "1" of the byte counter is compared with the number of bytes=6 to determine that the output of bytes as many as the number of bytes is not complete yet, and the process returns to step 603.

Step 603: One byte (c17) at the head of the part to be processed of the code data is acquired as data information, and the byte counter is incremented by 1 to obtain a value "2". Also, the repetition counter is reset to zero.

Step 604: A value "0Dh" of the data information (c17) is output (d20), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "2" of the byte counter is compared with the number of bytes=6 to determine that the output of bytes as many as the number of bytes is not complete yet, and the process returns to step 603.

Step 603: One byte (c18) at the head of the part to be processed of the code data is acquired as data information, and the byte counter is incremented by 1 to obtain a value "3". Also, the repetition counter is reset to zero.

Step 604: A value "0Eh" of the data information (c18) is output (d21), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "3" of the byte counter is compared with the number of bytes=6 to determine that the output of bytes as many as the number of bytes is not complete yet, and the process returns to step 603.

Step 603: One byte (c19) at the head of the part to be processed of the code data is acquired as data information, and the byte counter is incremented by 1 to obtain a value "4". Also, the repetition counter is reset to zero.

Step 604: A value "0Fh" of the data information (c19) is output (d22), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "4" of the byte counter is compared with the number of bytes=6 to determine that the output of bytes as many as the number of bytes is not complete yet, and the process returns to step 603.

Step 603: One byte (c20) at the head of the part to be processed of the code data is acquired as data information, and the byte counter is incremented by 1 to obtain a value "5". Also, the repetition counter is reset to zero.

Step 604: A value "10h" of the data information (c20) is output (d23), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "5" of the byte counter is compared with the number of bytes=6 to determine that the output of bytes as many as the number of bytes is not complete yet, and the process returns to step 603.

Step 603: One byte (c21) at the head of the part to be processed of the code data is acquired as data information, and the byte counter is incremented by 1 to obtain a value "6". Also, the repetition counter is reset to zero.

Step 604: A value "11h" of the data information (c21) is output (d24), and the repetition counter is incremented by 1 to obtain a value "1".

Step 605: The value "1" of the repetition counter is compared with the number of repetition times=1 to determine that the output of a byte as many as the number of repetition times is complete, and the process advances to step 606.

Step 606: The value "6" of the byte counter is compared with the number of bytes=6 to determine that the output of bytes as many as the number of bytes is complete, and the process advances to step 607.

Step 607: Since code data to be processed still remain (c22), the process returns to step 601.

Step 601: One byte (c22) at the head of the part to be processed of the code data is acquired as length information.

Step 602: A value "FAh" (suffix "h" expresses a hexadecimal number) of the length information (c22) is compared with the table shown in FIG. 2 to obtain the number of bytes=1 and the number of repetition times=7. The byte counter is reset to zero.

Step 603: One byte (c23) at the head of the part to be processed of the code data is acquired as data information, and the byte counter is incremented by 1 to obtain a value "1". Also, the repetition counter is reset to zero.

Step 604: A value "12h" of the data information (c23) is output (d25), and the repetition counter is incremented by 1 to obtain a value "1".

Step 605: The value "1" of the repetition counter is compared with the number of repetition times=7 to determine that the output of bytes as many as the number of repetition times is not complete yet, and the process returns to step 604.

Step 604: The value "12h" of the data information (c23) is output (d26), and the repetition counter is incremented by 1 to obtain a value "2".

Step 605: The value "2" of the repetition counter is compared with the number of repetition times=7 to determine that the output of bytes as many as the number of repetition times is not complete yet, and the process returns to step 604.

Step 604: The value "12h" of the data information (c23) is output (d27), and the repetition counter is incremented by 1 to obtain a value "3".

Step 605: The value "3" of the repetition counter is compared with the number of repetition times=7 to determine that the output of bytes as many as the number of repetition times is not complete yet, and the process returns to step 604.

Step 604: The value "12h" of the data information (c23) is output (d28), and the repetition counter is incremented by 1 to obtain a value "4".

Step 605: The value "4" of the repetition counter is compared with the number of repetition times=7 to determine that the output of bytes as many as the number of repetition times is not complete yet, and the process returns to step 604.

Step 604: The value "12h" of the data information (c23) is output (d29), and the repetition counter is incremented by 1 to obtain a value "5".

Step 605: The value "5" of the repetition counter is compared with the number of repetition times=7 to determine that the output of bytes as many as the number of repetition times is not complete yet, and the process returns to step 604.

Step 604: The value "12h" of the data information (c23) is output (d30), and the repetition counter is incremented by 1 to obtain a value "6".

Step 605: The value "6" of the repetition counter is compared with the number of repetition times=7 to determine that the output of bytes as many as the number of repetition times is not complete yet, and the process returns to step 604.

Step 604: The value "12h" of the data information (c23) is output (d31), and the repetition counter is incremented by 1 to obtain a value "7".

Step 605: The value "7" of the repetition counter is compared with the number of repetition times=7 to determine that the output of bytes as many as the number of repetition times is complete, and the process advances to step 606.

Step 606: The value "1" of the byte counter is compared with the number of bytes=1 to determine that the output of a byte as many as the number of bytes is complete, and the process advances to step 607.

Step 607: Since no code data to be processed remains, the sequence ends.

Note that the decoding sequence is not limited to that shown in this flowchart.

FIG. 7 shows a list that enumerates patterns of code data which can obtain data of 4 bytes or more when code data to be handled by the data conversion apparatus 1 are decoded. There are many code data which are decoded to obtain data of 4 bytes or more, and when these code data are classified into a plurality of patterns by the following classification methods, they can be classified into 41 patterns, as shown in FIG. 7. As one classification method, code data in which a plurality of pieces of length information enough and required to obtain data of 4 bytes or more have identical byte positions are classified as identical patterns. As another classification method, code data in which a plurality of pieces of length information enough and required to obtain data of 4 bytes or more include either identical byte count information or repetition time count information are classified as identical patterns. As still another classification method, code data which have just 4 bytes as the number of bytes obtained by decoding, and those which have 5 bytes or more are classified as different patterns. In order to express code data classified to such patterns, some bytes of respective patterns include corresponding range value descriptions. Especially, bytes with "*" marks have a range "00h to FFh", and fit to all byte values. The total number of patterns is 41, and to which of 41 patterns code data fits is discriminated upon decoding to execute processing corresponding to the discriminated pattern, thus attaining decoding to have a throughput of 4 bytes. This decoding sequence is described in Japanese Patent Laid-Open No. 2007-189527.

FIGS. 8A to 8L show a list that enumerates patterns of code data which can obtain data of 6 bytes or more when code data to be handled by the data conversion apparatus 1 are decoded. There are many code data which are decoded to obtain data of 6 bytes or more, and when these code data are classified into a plurality of patterns by the following classification methods, they can be classified into 239 patterns, as shown in the list of FIGS. 8A to 8L. As one classification method, code data in which a plurality of pieces of length information enough and required to obtain data of 6 bytes or more have identical byte positions are classified as identical patterns. As another classification method, code data in which a plurality of pieces of length information enough and required to obtain data of 6 bytes or more include either identical byte count information or repetition time count information are classified as identical patterns. As still another classification method, code data which have just 6 bytes as the number of bytes obtained by decoding, and those which have 7 bytes or more are classified as different patterns. These 239 patterns are decoded by the same sequence as in Japanese Patent Laid-Open No. 2007-189527, thus attaining decoding to have a throughput of 6 bytes. However, as described above, a large circuit scale and a long processing delay time of a pattern matching circuit with input data are required. When the circuit scale increases, cost also increases, and when the processing delay time becomes longer, it technically becomes difficult to process data within one cycle, resulting in high cost.

FIG. 9 is a block diagram showing the internal arrangement of the length information extraction unit 102 in the data conversion apparatus 1 of this embodiment. Reference numeral 1021 denotes a length information discrimination unit; 1022, a length information buffer; and 1023, a data information buffer.

The length information discrimination unit 1021 is connected to the code data input unit 101, length information buffer 1022, and data information buffer 1023. The length information discrimination unit 1021 separates code data received from the code data input unit 101 into length information and data information. The length information discrimination unit 1021 operates in synchronism with processing clocks, receives 12-byte code data from the code data input unit 101 for each processing cycle, and decides if each byte (bytes 0 to 11) is length information. Each byte is decided by a method using discrimination circuits prepared for respective bytes, and details of the discrimination circuit of each byte will be described later. The length information discrimination unit 1021 sequentially transfers bytes which are decided as length information to the length information buffer 1022, and those which are not decided as length information to the data information buffer 1023.

The length information buffer 1022 is connected to the length information discrimination unit 1021 and code data conversion unit 103. The length information buffer 1022 stores length information received from the length information discrimination unit 1021. Also, the length information buffer 1022 transfers the stored length information to the code data conversion unit 103.

The data information buffer 1023 is connected to the length information discrimination unit 1021 and code data conversion unit 103. The data information buffer 1023 stores data information received from the length information discrimination unit 1021. Also, the data information buffer 1023 transfers the stored data information to the code data conversion unit 103.

Figure 10:
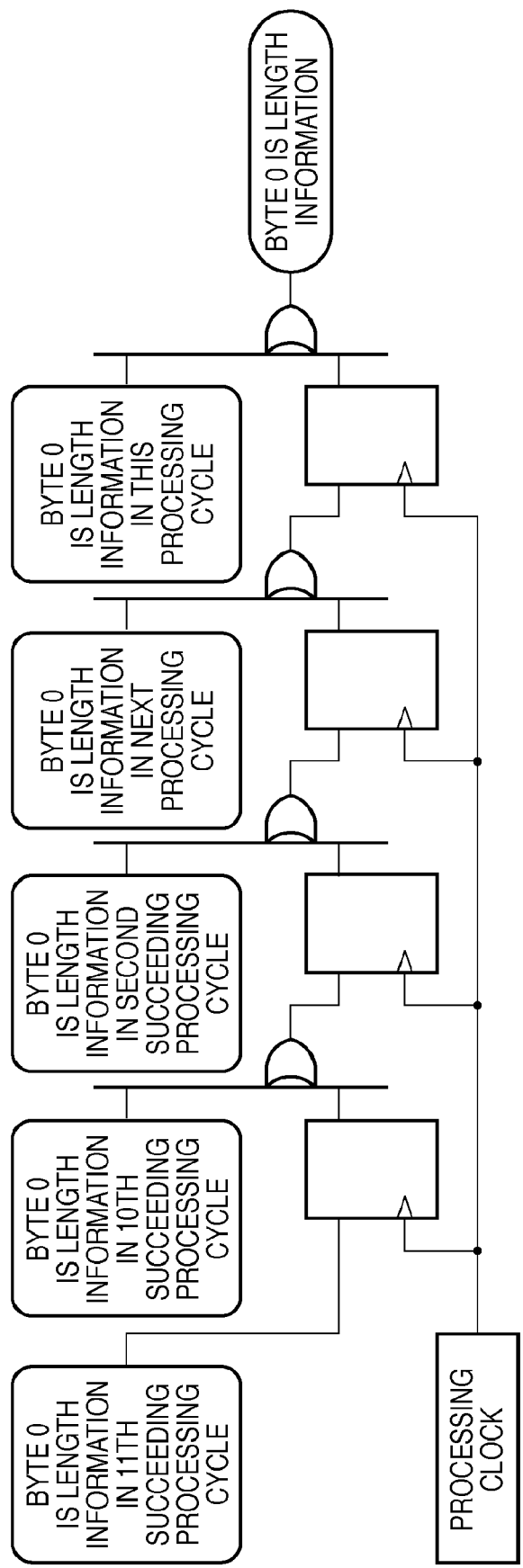
FIG. 10 is a circuit diagram of a circuit for discriminating whether or not byte 0 is length information in a length information discrimination unit.
Figure 11:
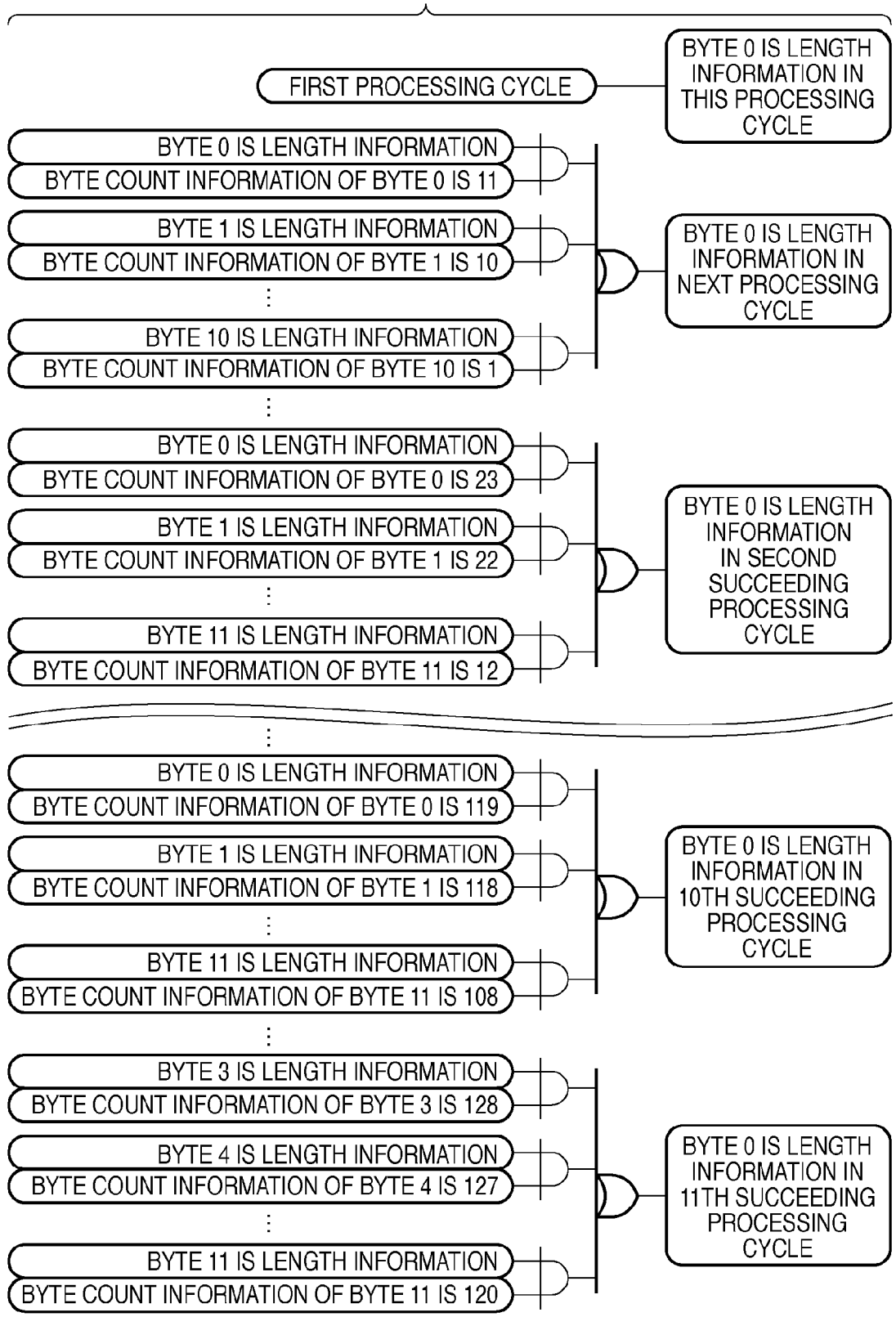
FIG. 11 is a diagram illustrating a circuit for discriminating whether or not byte 0 is length information in the length information discrimination unit.

FIGS. 10 and 11 are diagrams showing a circuit for discriminating whether or not byte 0 is length information in the length information discrimination unit 1021. Note that there are two conditions of a byte which is length information. One condition is that the byte of interest is the first byte of the whole code data. The other condition is that a byte immediately before the byte of interest corresponds to the terminal end of data information. The former condition is uniquely determined. The latter condition is determined by deciding if the data information is terminated at an immediately preceding byte. This decision is implemented by a logic that uses preceding length information such as a case in which the second preceding byte is length information and the byte count information is "1", and a case in which the third preceding byte three bytes before is length information and the byte count information is "2".

A logic "byte 0 is length information in this processing cycle" in FIG. 11 represents the former condition. Conditions from "byte 0 is length information in next processing cycle" to "byte 0 is length information in 11th succeeding processing cycle" represent the latter condition. The reason why the latter condition depends on cycles is that the length information discrimination unit 1021 simultaneously decides 12 bytes per cycle. An arrangement that uses flip-flops to allow reference in processing after a maximum of 11 cycles so as to identify a byte which is the next length information even when the byte count information of length information assumes any value ranging from 1 (minimum) to 128 (maximum) is adopted. Note that the conditions and arrangements from "byte 0 is length information in third succeeding processing cycle" to "byte 0 is length information in ninth succeeding processing cycle" are not shown in FIGS. 10 and 11 since they can be configured based on the same rules as those of other logics.

Figure 12:
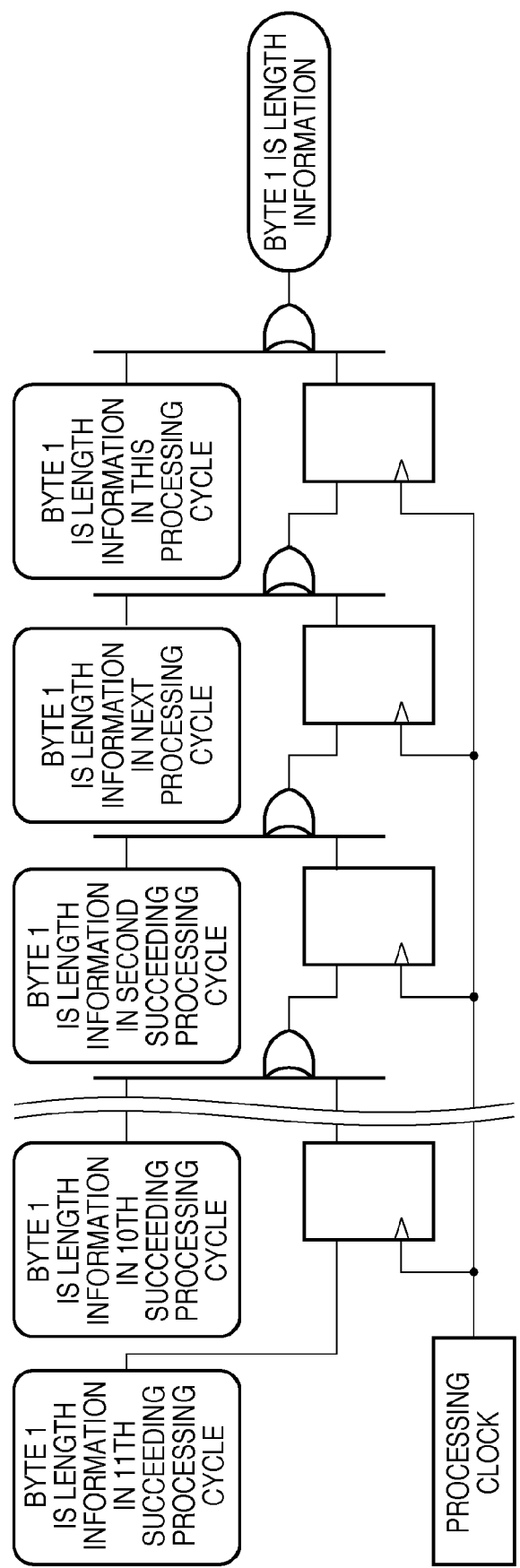
FIG. 12 is a circuit diagram of a circuit for discriminating whether or not byte 1 is length information in the length information discrimination unit.
Figure 13:
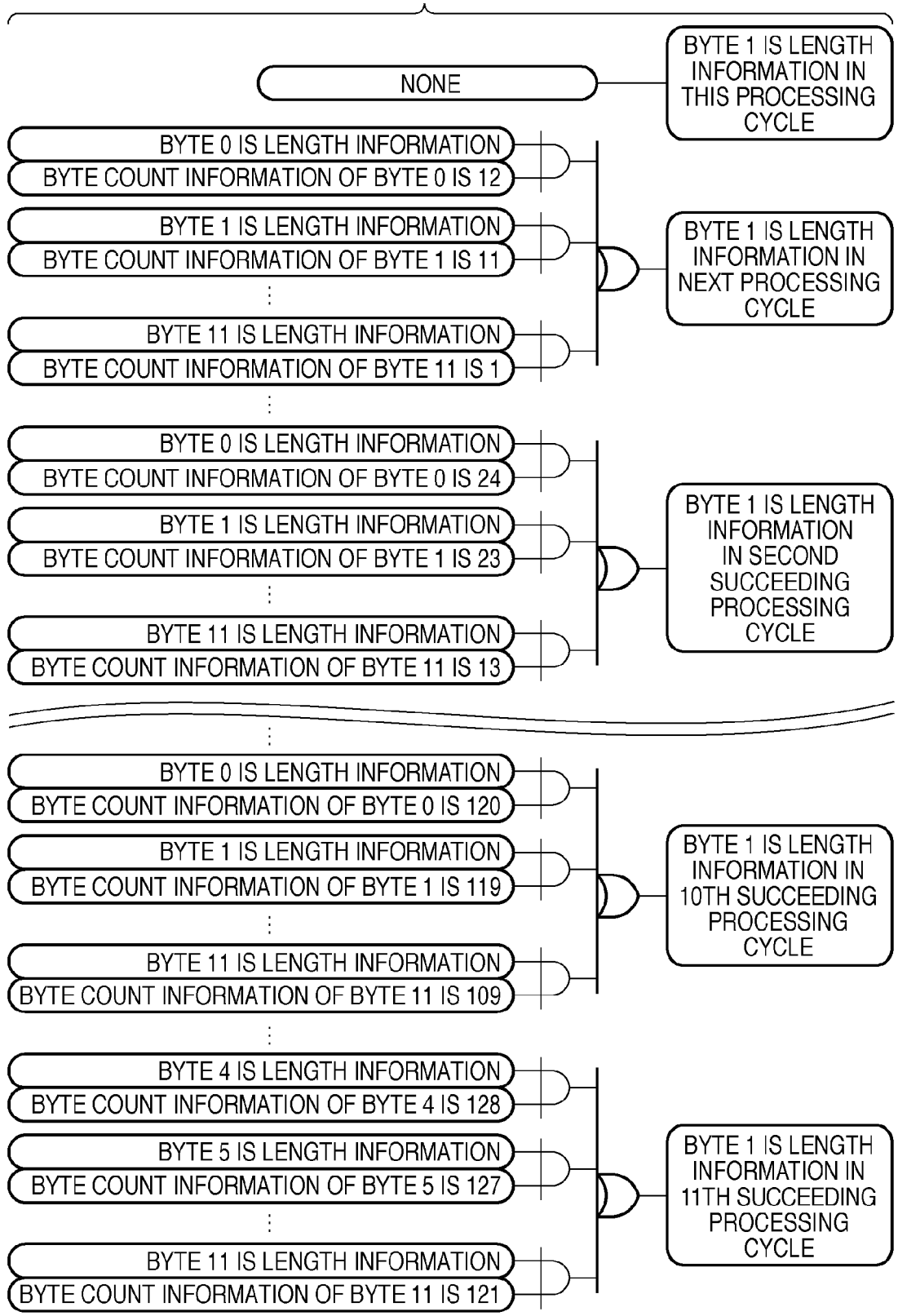
FIG. 13 is a diagram illustrating a circuit for discriminating whether or not byte 1 is length information in the length information discrimination unit.

FIGS. 12 and 13 are diagrams showing a circuit for discriminating whether or not byte 1 is length information in the length information discrimination unit 1021. In this embodiment, illustrations and descriptions of the conditions and arrangements for deciding whether or not byte 1 is length information from the third to ninth succeeding processing cycles are omitted since they can be configured based on the same rules as those of other logics.

Figure 14:
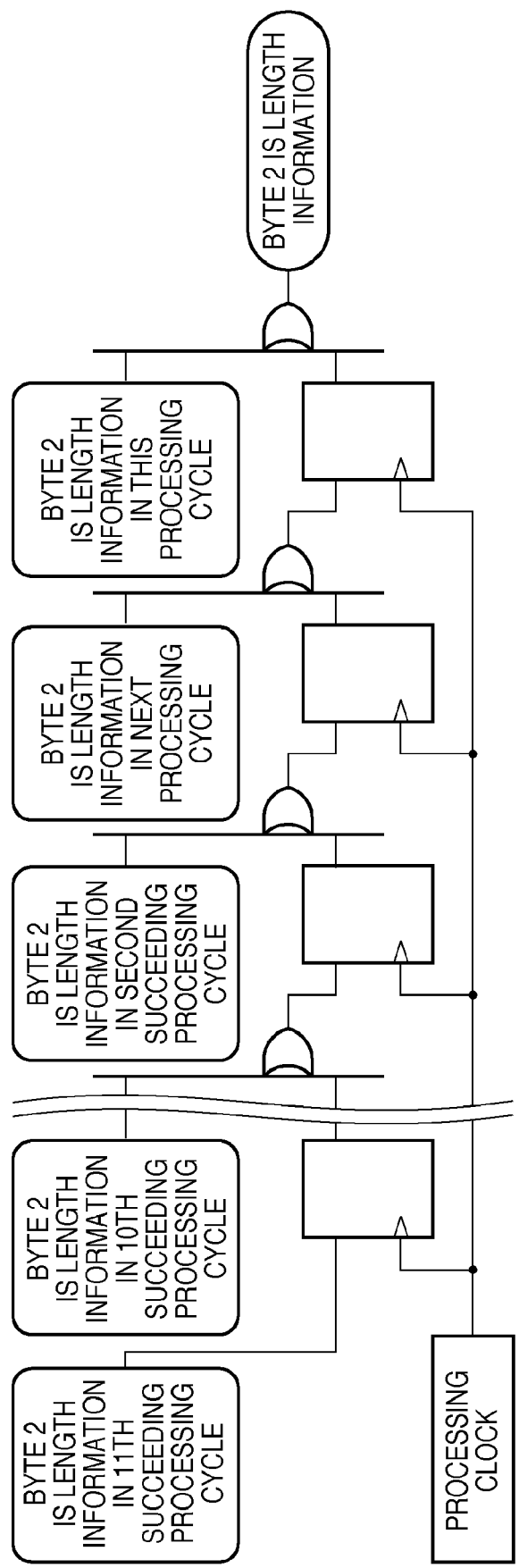
FIG. 14 is a circuit diagram of a circuit for discriminating whether or not byte 2 is length information in the length information discrimination unit.
Figure 15:
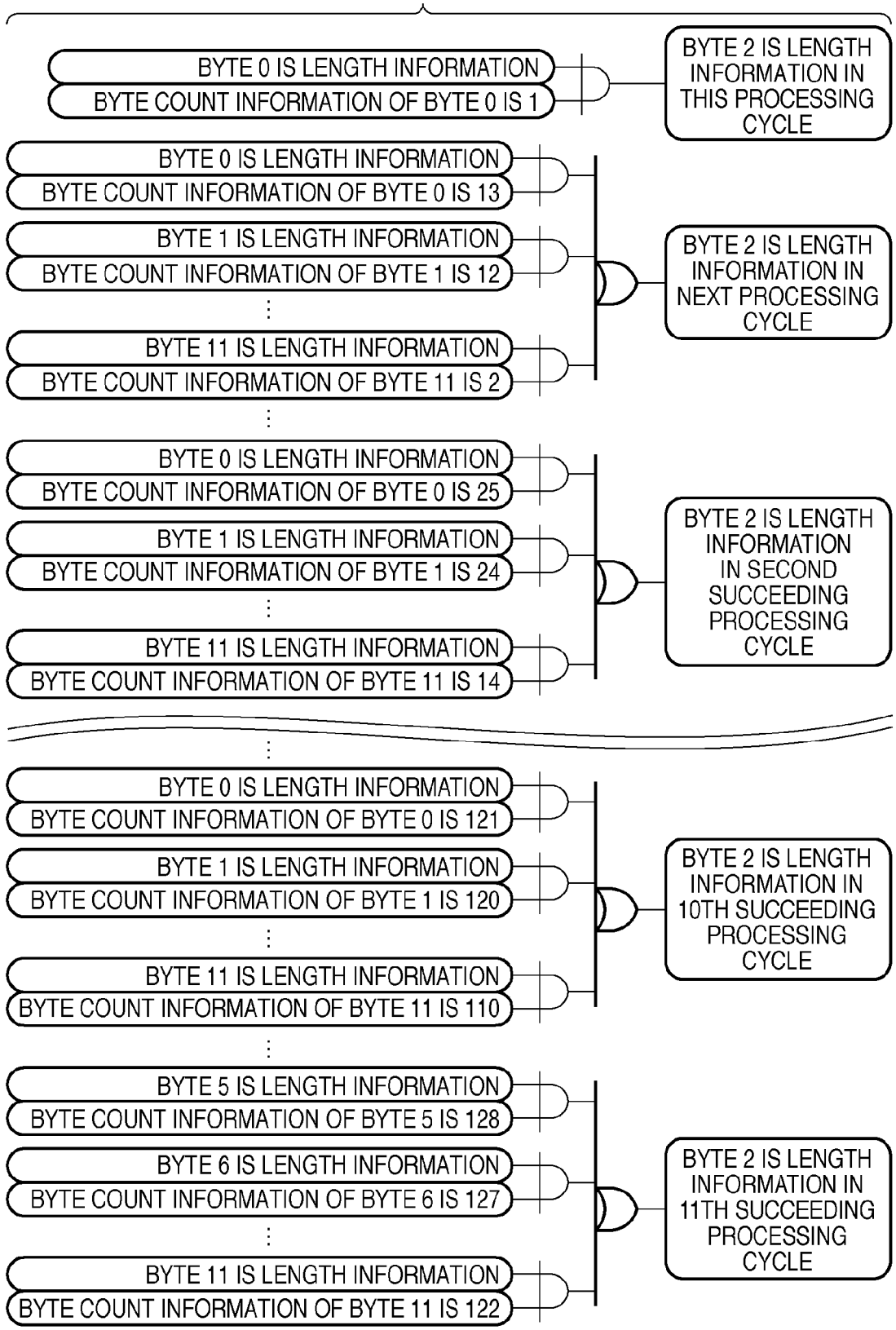
FIG. 15 is a diagram illustrating a circuit for discriminating whether or not byte 2 is length information in the length information discrimination unit.

FIGS. 14 and 15 are diagrams showing a circuit for discriminating whether or not byte 2 is length information in the length information discrimination unit 1021. In this embodiment, illustrations and descriptions of the conditions and arrangements for deciding whether or not byte 2 is length information from the third to ninth succeeding processing cycles are omitted since they can be configured based on the same rules as those of other logics.

Figure 16:
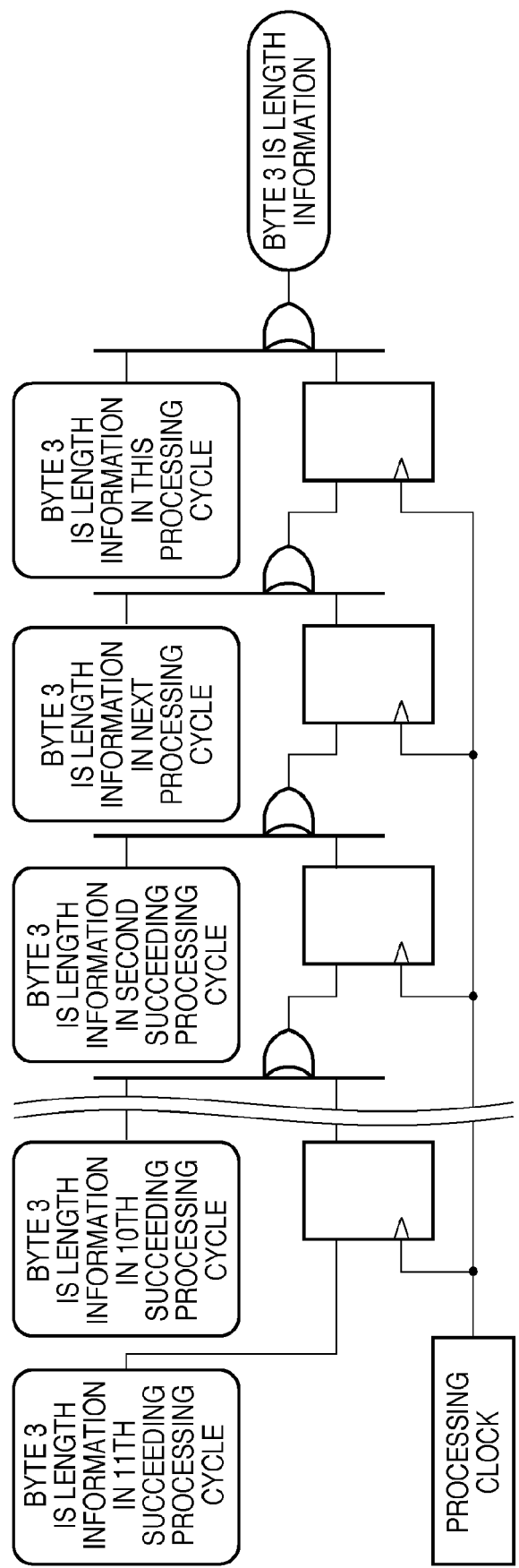
FIG. 16 is a circuit diagram of a circuit for discriminating whether or not byte 3 is length information in the length information discrimination unit.
Figure 17:
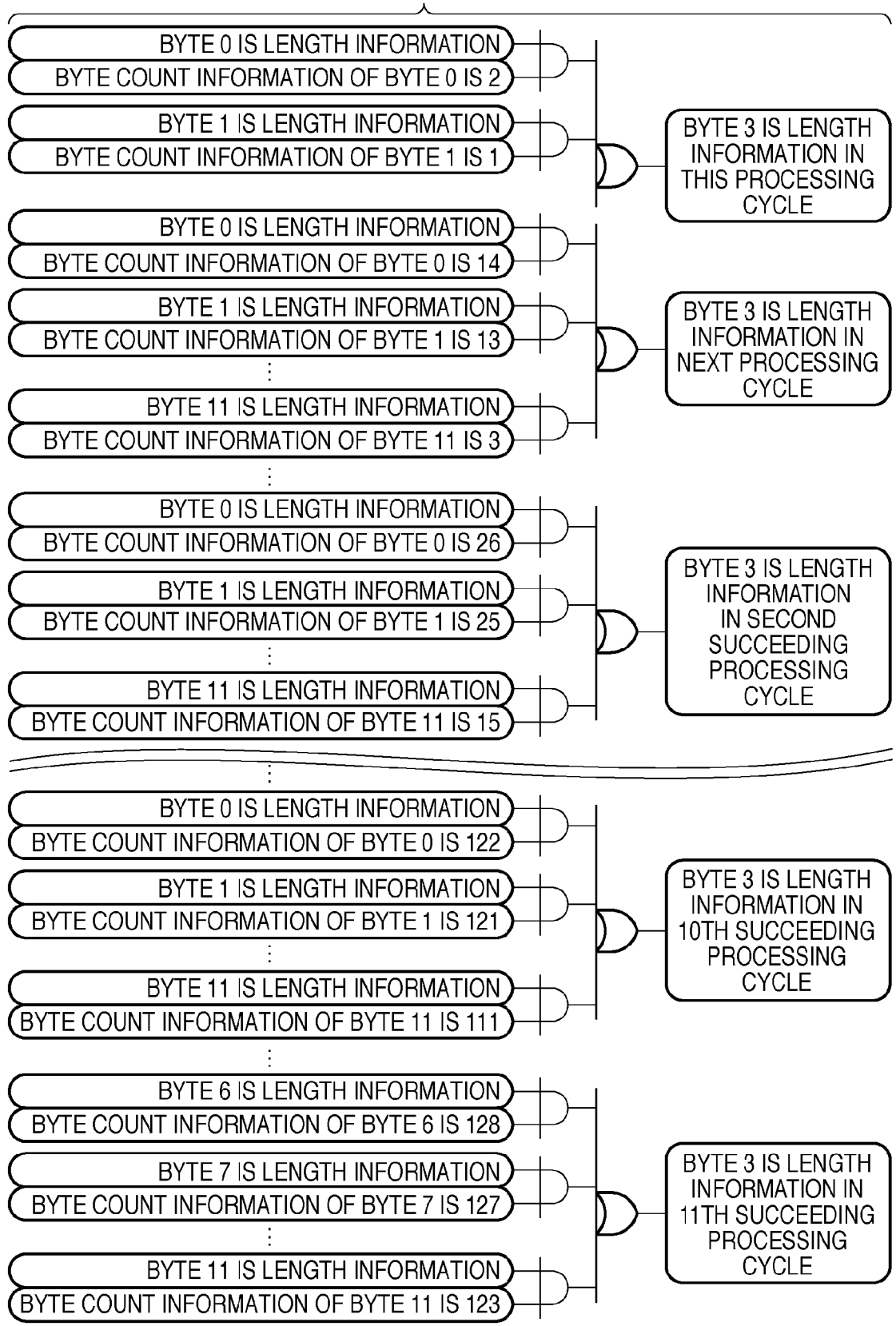
FIG. 17 is a diagram illustrating a circuit for discriminating whether or not byte 3 is length information in the length information discrimination unit.

FIGS. 16 and 17 are diagrams showing a circuit for discriminating whether or not byte 3 is length information in the length information discrimination unit 1021. In this embodiment, illustrations and descriptions of the conditions and arrangements for deciding whether or not byte 3 is length information from the third to ninth succeeding processing cycles are omitted since they can be configured based on the same rules as those of other logics.

In this embodiment, illustrations and descriptions of circuits for deciding whether or not each of bytes 4 to 10 is length information are omitted since they can be configured based on the same rules as those of other logics.

Figure 18:
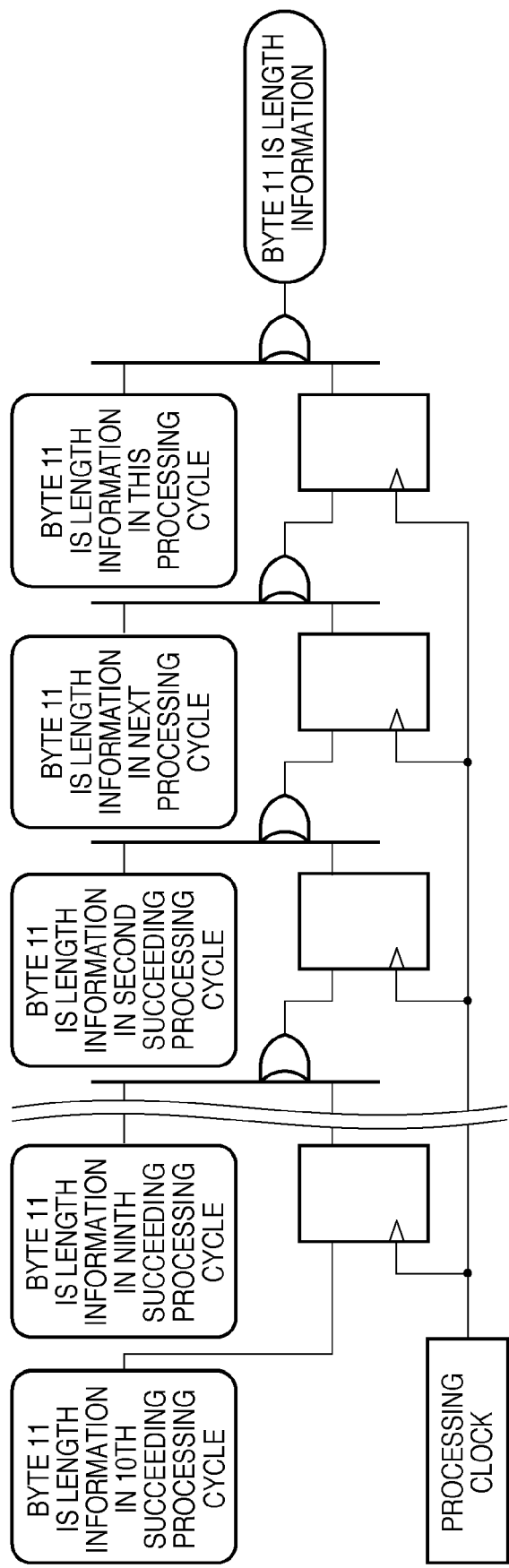
FIG. 18 is a circuit diagram of a circuit for discriminating whether or not byte 11 is length information in the length information discrimination unit.
Figure 19:
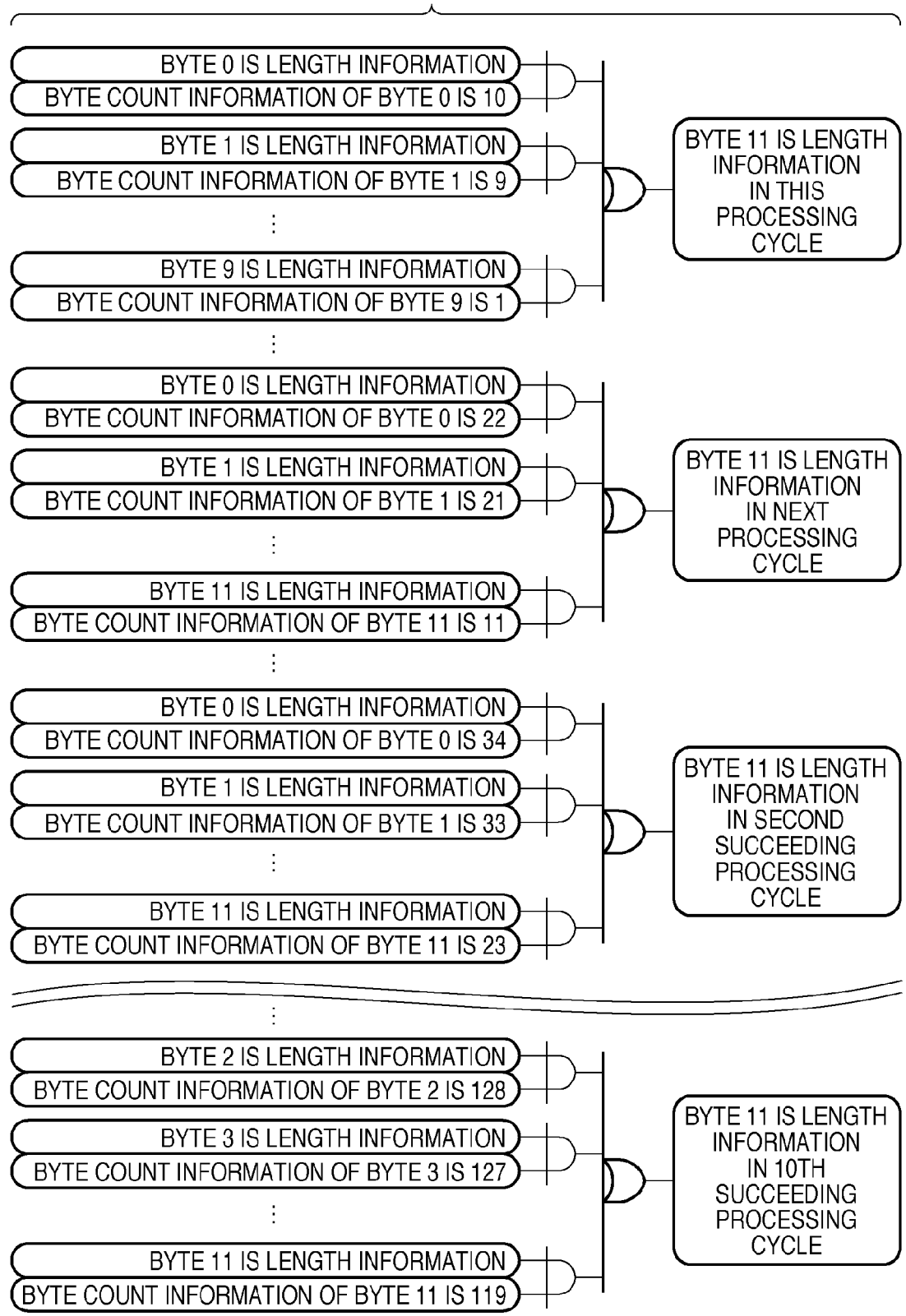
FIG. 19 is a diagram illustrating a circuit for discriminating whether or not byte 11 is length information in the length information discrimination unit.

FIGS. 18 and 19 are diagrams showing a circuit for discriminating whether or not byte 11 is length information in the length information discrimination unit 1021. In this embodiment, illustrations and descriptions of the conditions and arrangements for deciding whether or not byte 11 is length information from the third to ninth succeeding processing cycles are omitted since they can be configured based on the same rules as those of other logics.

Figure 20:
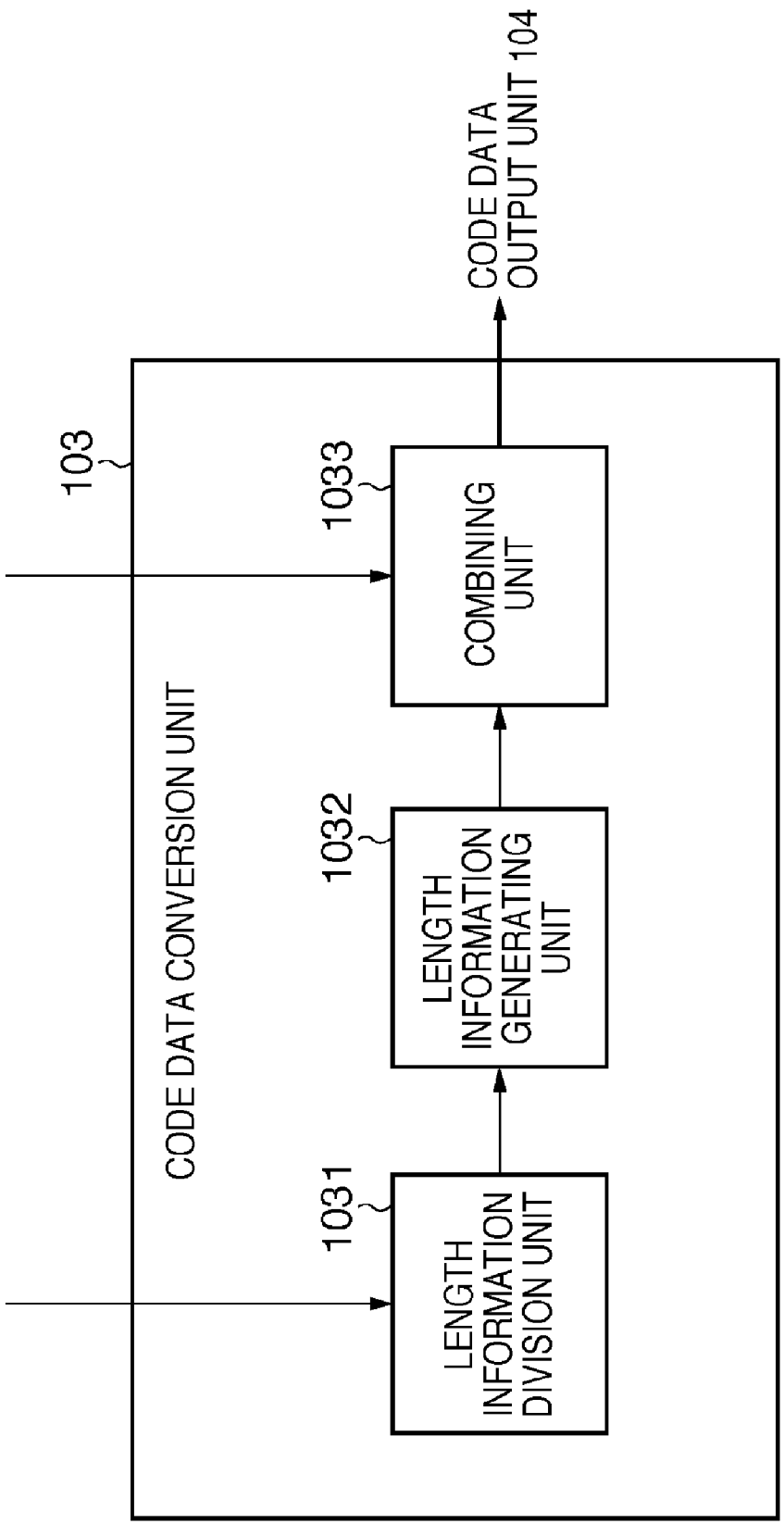
FIG. 20 is a block diagram of a code data conversion unit in the data conversion apparatus.

FIG. 20 is a block diagram showing the internal arrangement of the code data conversion unit 103 in the data conversion apparatus 1. Reference numeral 1031 denotes a length information division unit; 1032, a length information generating unit; and 1033, a combining unit.

The length information division unit 1031 is connected to the length information buffer 1022 of the length information extraction unit 102, and the length information generating unit 1032. The length information division unit 1031 executes division processing of length information received from the length information buffer 1022. The contents of the division processing will be described later. The length information division unit 1031 transfers the divided length information to the length information generating unit 1032.

The length information generating unit 1032 is connected to the length information division unit 1031 and the combining unit 1033. The length information generating unit 1032 executes generating processing of length information received from the length information division unit 1031. The contents of the generating processing will be described later. The length information generating unit 1032 transfers the generated length information to the combining unit 1033.

The combining unit 1033 is connected to the data information buffer 1023 of the length information extraction unit 102, and the length information generating unit 1032. The combining unit 1033 receives length information from the length information generating unit 1032, transfers the length information to the code data output unit 104, and reads byte count information from that length information. The combining unit 1033 receives pieces of data information as many as the number indicated by the byte count information from the data information buffer 1023, and transfers the data information to the code data output unit 104. Note that length information transferred from the length information generating unit 1032 may be appended with a repeat attribute. In case of length information appended with a repeat attribute, the combining unit 1033 re-uses the last byte of the data information transferred at the immediately preceding timing, and receives, from the data information buffer 1023, only pieces of data information as many as the remaining number of bytes. In this case, the combining unit 1033 combines the re-used one byte and the remaining bytes, and transfers them to the code data output unit 104.

In short, the combining unit 1033 executes data combining processing of length information from the length information generating unit 1032 and data information obtained by the length information extraction unit 102 to generate new encoded data, and outputs the generated encoded data.

Figure 21B:
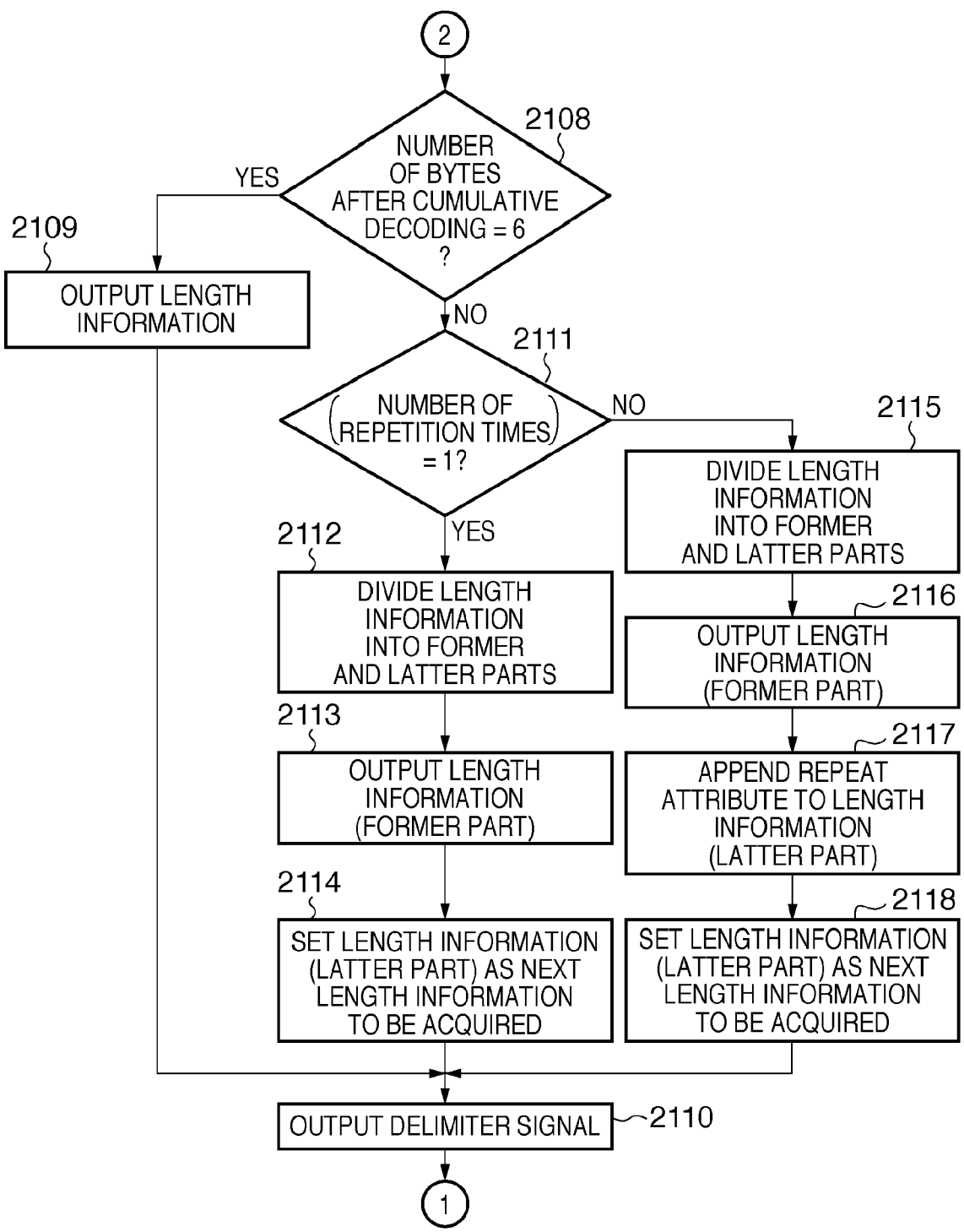

FIGS. 21A and 21B is a flowchart showing the sequence of the division processing of length information in the length information division unit 1031. Assume that the length information division unit 1031 includes a register (first register) for holding the number of bytes (number of data) after cumulative decoding, and a register (second register) for storing length information.

In step 2100, the length information division unit 1031 clears (resets) the internal register for storing length information to "80h". This "80h" is a codeword which is not used in Packbit-encoded data, as can be seen from FIG. 2. Although details will become apparent from the following description, whether or not significant length information is stored need only be discriminated. Hence, a flag may be separately arranged, and whether or not significant length information is stored may be determined depending on whether this flag is set or reset.

In step 2101, the length information division unit 1031 resets the internal register for storing the number of bytes after cumulative decoding to "0". In step 2102, it is decided if transfer of length information from the length information buffer 1022 of the length information extraction unit 102 is complete. If the transfer is complete, the processing ends, and the length information division unit 1031 notifies the subsequent length information generating unit 1032 of completion of input of length information.

In step 2103, the length information division unit 1031 acquires length information by receiving 1 byte from the length information buffer 1022 of the length information extraction unit 102. When length information stored in the internal register for storing length information is other than "80h", i.e., when significant length information is stored in the internal register, the length information division unit 1031 does not receive any length information from the length information extraction unit 102, but it acquires the length information stored in the internal register. It should be noted that the length information to be described below is acquired from one of the length information extraction unit 102 and the internal register.

In step 2104, the length information division unit 1031 interprets the acquired length information by collating it with the table shown in FIG. 2, thus obtaining the number of bytes and the number of repetition times of output of data information.

In step 2105, the length information division unit 1031 cumulates (adds) {the number of bytes×the number of repetition times} to the number of bytes after cumulative decoding. That is, the length information division unit 1031 cumulatively counts the number of data (the number of bytes) to be decoded.

The length information division unit 1031 decides in step 2106 if the number of bytes after cumulative decoding is less than 6. If the number of bytes is less than 6, the process advances to step 2107; otherwise, the process advances to step 2108.

In step 2107, the length information division unit 1031 transfers the acquired length information to the length information generating unit 1032, and the process returns to step 2102.

The length information division unit 1031 decides in step 2108 if the number of bytes after cumulative decoding is equal to 6. If the number of bytes is equal to 6, the process advances to step 2109; otherwise, the process advances to step 2111.

In step 2109, the length information division unit 1031 transfers the acquired length information to the length information generating unit 1032. At this time, the unit 1031 sets "80h" in the internal register so as to externally acquire length information when the process reaches step 2103 in the next processing. After that, the process advances to step 2110.

In step 2110, the length information division unit 1031 transfers a delimiter signal to the length information generating unit 1032, and the process returns to step 2101. This delimiter signal is also a control signal that controls the length information generating unit 1032. At this time, the unit 1031 clears the number of bytes after cumulative decoding in the internal register to "0".

The length information division unit 1031 decides in step 2111 if the number of repetition times is equal to 1. If the number of repetition times is equal to 1, the process advances to step 2112; otherwise, the process advances to step 2115.

In step 2112, the length information division unit 1031 divides the length information into former and latter parts. More specifically, the unit 1031 executes processing for generating two pieces of new length information using the values of the original length information. The length information (latter part) is generated to have (6—the number of bytes after cumulative decoding) as the byte count information, and 1 as the number of repetition times. The length information (former part) is generated to have (original byte count information—byte count information of length information (latter part)) as the byte count information and 1 as the number of repetition times.

For example, assume that length information of interest is "7Fh". From FIG. 2, the length information "7Fh" means to output 128 bytes that follow the length information of interest once. Now, assume that the result obtained by adding the number of data indicated by the length information of interest (the cumulated result in step 2105) is 132. This is also the case when the number N of data immediately before the length information of interest is "4". This embodiment shows an example that implements "6" as a throughput M. Therefore, the length information "7Fh" of interest is divided into former length information (first length information) "01h" indicating the number of data indicated by a difference "2" (=M−N), and latter length information (second length information) "7Dh" indicating the remaining number of output data, i.e., 126 data.

In step 2113, the length information division unit 1031 transfers the former length information (first length information) to the length information generating unit 1032.

In step 2114, the length information division unit 1031 stores (sets) the latter length information (second length information) in the internal register. As a result, the internal register is set with the latter length information (significant length information) as a count target.

In step 2115, the length information division unit 1031 divides the length information into former and latter parts. More specifically, the unit 1031 executes processing for generating two pieces of new length information using the values of the original length information. The length information (latter part) is generated to have 1 as the byte count information, and (6—the number of bytes after cumulative decoding) as the number of repetition times. The length information (former part) is generated to have 1 as the byte count information and (the number of repetition times of original length information—the number of repetition times of length information (latter part)) as the number of repetition times.

For example, assume that length information of interest is "81h". From FIG. 2, the length information "81h" means to output 1 byte that follows the length information of interest 128 times. Now, assume that the result obtained by adding the number of data indicated by the length information of interest is 132. This is also the case when the number N of data immediately before the length information of interest is "4". This embodiment shows an example that implements "6" as a throughput M. Therefore, the length information "81h" of interest is divided into former length information (first length information) "FFh" indicating the number of data indicated by a difference "2" (=M−N), and latter length information (second length information) "83h" indicating the remaining number of output data, i.e., 126 data.

In step 2116, the length information division unit 1031 transfers the former length information to the length information generating unit 1032.

In step 2117, the length information division unit 1031 appends a repeat attribute to the latter length information.

In step 2118, the length information division unit 1031 stores the latter length information in the internal register as the next length information to be acquired, and the process advances to step 2110.

As described above, the length information division unit 1031 generates one or more pieces of length information which yield 6 as the number of bytes after cumulative decoding. Every time the number of bytes after cumulative decoding becomes 6, the unit 1031 outputs a delimiter signal to the length information generating unit 1032, and resets the number of bytes after cumulative decoding to "0".

Figure 22:
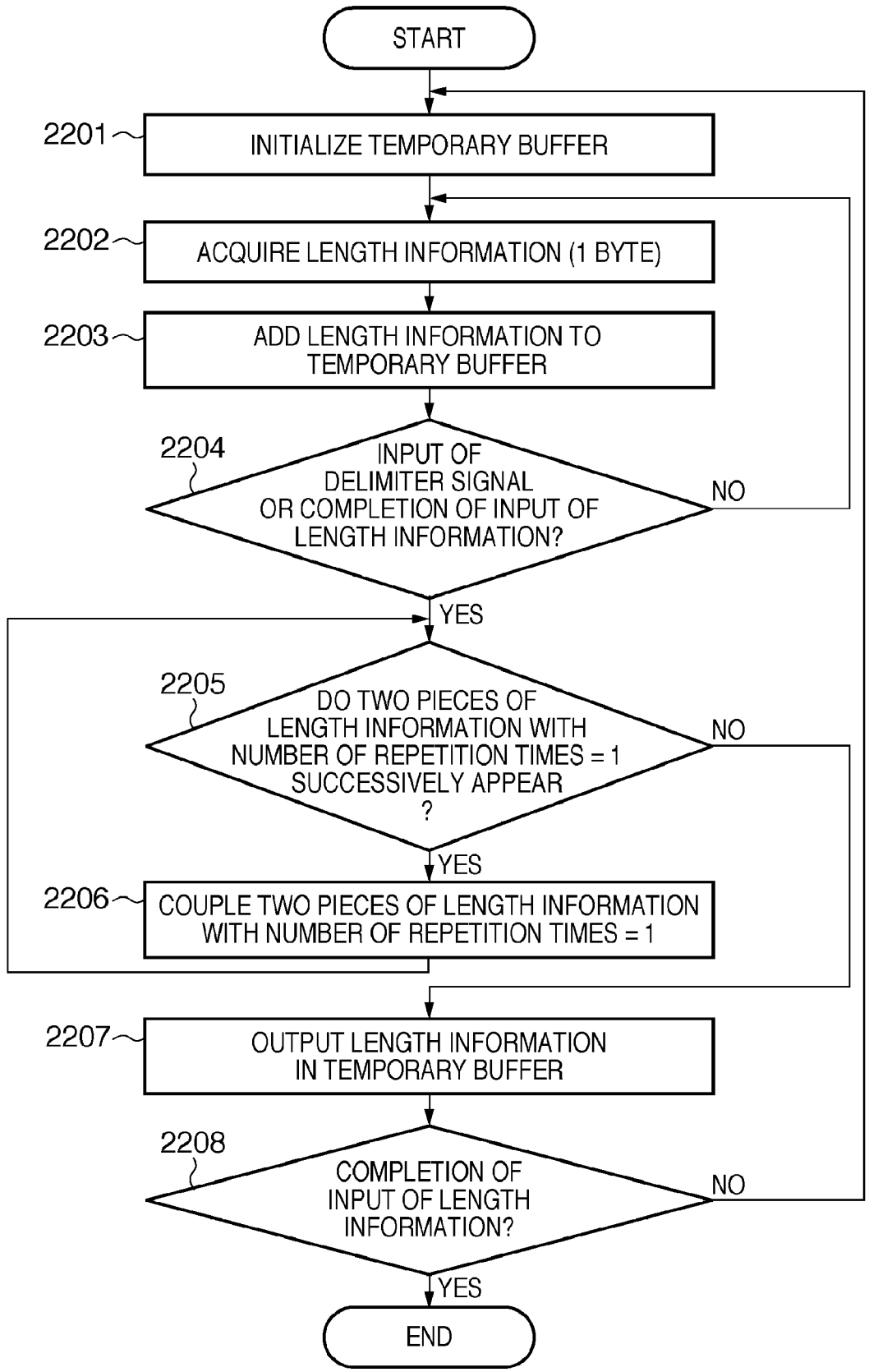
FIG. 22 is a flowchart showing the sequence of length information generating processing in a length information generating unit.

The sequence of the generating processing of length information in the length information generating unit 1032 will be described below with reference to the flowchart shown in FIG. 22. Assume that the length information generating unit 1032 includes a temporary storage buffer.

In step 2201, the length information generating unit 1032 initializes the temporary buffer as the internal buffer to a state in which the buffer stores nothing.

In step 2202, the length information generating unit 1032 receives 1 byte of length information from the length information division unit 1031.

In step 2203, the length information generating unit 1032 additionally stores the received length information in the temporary buffer.

The length information generating unit 1032 decides in step 2204 if the delimiter signal is received from the length information division unit 1031 or input of length information from the length information division unit 1031 is complete. If the delimiter signal is received or input of length information is complete, the process advances to step 2205; otherwise, the process returns to step 2202.

The length information generating unit 1032 decides in step 2205 if a predetermined condition is satisfied by examining pieces of length information stored in the temporary buffer from the head. The predetermined condition indicates whether or not two pieces of length information with the number of repetition times=1 are successively stored. This can be decided by checking if values equal to or smaller than "7Fh" are successively stored as length information (see FIG. 2). If the condition is satisfied, the process advances to step 2206; otherwise, the process jumps to step 2207.

In step 2206, the length information generating unit 1032 couples two pieces of length information with the number of repetition times=1 to convert them into new one length information. The unit 1032 deletes these pieces of length information from the temporary buffer, and stores the new length information at that position instead. Then, the process returns to step 2205 to make determination again. As a result, as long as pieces of length information with the number of repetition times=1 are successively stored, they are coupled to one information. Note that the coupled length information includes the number of bytes obtained by combining the numbers of bytes indicated by the two pieces of length information before coupling. In case of the former length information appended with a repeat attribute, the length information generating unit 1032 appends a repeat attribute to the new length information. Incidentally, there is no case of the latter length information appended with a repeat attribute. This is an inevitable result from the sequence of the division processing of length information in the length information division unit 1031.

In step 2207, the length information generating unit 1032 transfers the length information stored in the temporary buffer to the combining unit 1033. At this time, when a repeat attribute is appended to the length information, the unit 1032 transfers the length information which is kept appended with the repeat attribute to the combining unit 1033.

The length information generating unit 1032 decides in step 2208 if input of length information from the length information division unit 1031 is complete. If the input is complete, the processing ends; otherwise, the process returns to step 2201.

The above processing will be practically explained below.

As described above, length information with the number of repetition times=1, which is generated by the length information division unit 1031, inevitably assumes a value ranging from 00h to 05h. Likewise, length information with the number of repetition times=2 or more, which is generated by the length information division unit 1031, inevitably assumes a value ranging from FBh to FFh.

Now, assume that pieces of length information are input to the buffer in the length information generating unit 1032 in the following sequence.

00h, 01h, 00h, FFh (including a repeat signal), a delimiter signal . . . .

In the above case, since both 00h and 01h have the number of repetition times=1, and are successively stored, they are coupled to one length information. The length information "00h" means to output data of 1 byte which follows, and the length information "01h" means to output data of 2 bytes which follow. Therefore, length information after coupling of 00h and 01h is 02h. That is, the buffer in the length information generating unit 1032 is updated as follows.

02h, 00h, FFh

Since both 02h and 00h have the number of repetition times=1, and are successively stored, they are coupled, and the buffer is finally updated as follows.

03h, FFh

The length information generating unit 1032 outputs the above 03h and FFh including a repeat signal to the combining unit 1033.

FIGS. 23A to 23L show a list in which patterns output from the data conversion apparatus 1 of those of the code data shown in FIGS. 8A to 8L are unpatterned, and patterns which are not output are indicated by hatching. The patterns indicated by hatching are those to be converted by the data conversion apparatus 1. More specifically, the data conversion apparatus 1 converts code data which have 7 bytes or more as the number of bytes obtained by decoding into those which have just 6 bytes as the number of bytes obtained by decoding. When pieces of length information with the number of repetition times=1 are successively stored at two neighboring positions, the data conversion apparatus 1 converts their code data into one code data. That is, in the list, patterns having 7 bytes or more as the number of bytes obtained by decoding and patterns in which two or more pieces of length information with the number of repetition times=1 appear at neighboring positions are hatched. Since code data output from the data conversion apparatus 1 do not include any hatched patterns, an apparatus for decoding these code data need not execute processing for hatched patterns.

FIG. 24 shows a list which enumerates only patterns output from the data conversion apparatus 1 of those of the code data shown in FIGS. 23A to 23L. The total number of patterns is 32, and code data required for decoding of 6 bytes are 8 bytes at a maximum. Since the decoding result of each pattern yields just 6 bytes, division of unit codes need not be considered at the time of decoding. For this reason, a decoding apparatus which decodes only code data output from the data conversion apparatus 1 can be implemented to have a smaller circuit scale, a shorter processing delay time, and lower cost than those which decode arbitrary code data.

The operation of the data conversion apparatus 1 in the aforementioned arrangement will be described below taking the code data shown in FIG. 3 as an example.

The code data input unit 101 transfers received code data every 12 bytes to the length information extraction unit 102, as described above. Therefore, the code data input unit 101 transfers "04, 01, 02, 03, 04, 05, FE, 06, 03, 07, 08, 09" to the length information extraction unit 102 first. In the next stage, the code data input unit 101 transfers "0A, FA, 0B, 05, 0C, 0D, 0E, 0F, 10, 11, FA, 12" to the length information extraction unit 102.

Upon reception of the 12-byte code data "04, 01, 02, 03, 04, 05, FE, 06, 03, 07, 08, 09", the length information extraction unit 102 stores them in the internal buffers while separating them into length information and data information. Also, upon reception of the subsequent 12-byte code data "0A, FA, 0B, 05, 0C, 0D, 0E, 0F, 10, 11, FA, 12", the length information extraction unit 102 stores them in the internal buffers while separating them into length information and data information. Then, the length information extraction unit 102 transfers the code data to the code data conversion unit 103 while separating them into length information and data information, as described above. Although the division sequence in this case will be described later, only division results will be described below.

In the above case, pieces of length information are "04, FE, 03, FA, 05, FA". Also, pieces of data information are "01, 02, 03, 04, 05, 06, 07, 08, 09, 0A, 0B, 0C, 0D, 0E, 0F, 10, 11, 12".

The length information and data information are temporarily stored in the length information buffer 1022 and data information buffer 1023 in the length information extraction unit 102, respectively, and are transferred in response to a request from the code data conversion unit 103. Therefore, the code data conversion unit 103 receives respective bytes from the head of "04, FE, 03, FA, 05, FA" as length information. Also, the code data conversion unit 103 receives respective bytes from the head of "01, 02, 03, 04, 05, 06, 07, 08, 09, 0A, 0B, 0C, 0D, 0E, 0F, 10, 11, 12" as data information.

As described above, the code data conversion unit 103 receives the length information and data information from the length information extraction unit 102, and transfers converted code data to the code data output unit 104. Although the conversion sequence in this case will be described later, only output results will be described below. Code data transfer in this case is executed several times since it is done every time the number of bytes after decoding reaches 6 bytes.

In the first cycle, "05, 01, 02, 03, 04, 05, 06" are transferred. This code data corresponds to pattern 2 in FIG. 24.

In the second cycle, "FF, 06, 03, 07, 08, 09, 0A" are transferred. This code data corresponds to pattern 14 in FIG. 24.

In the third cycle, "FB, 0B" are transferred. This code data corresponds to pattern 1 in FIG. 24.

In the fourth cycle, "05, 0B, 0C, 0D, 0E, 0F, 10" are transferred. This code data corresponds to pattern 2 in FIG. 24.

In the fifth cycle, "00, 11, FC, 12" are transferred. This code data corresponds to pattern 25 in FIG. 24.

In the sixth cycle, "FF, 12" are transferred. Since the input code data in the sixth cycle ends halfway, the code data is transferred so that the number of bytes after decoding is exceptionally less than 6. This code data corresponds to a plurality of patterns 13, 14, 16, 18, 19, 20, 23, and 24 in FIG. 24 since it includes only 2 bytes.

The code data output unit 104 outputs code data received from the code data conversion unit 103, as described above. The output has the same contents as those transferred from the code data conversion unit 103, and code data shown in FIG. 25 is obtained by coupling the code data in all the transfer cycles. This code data includes only the patterns shown in FIG. 24, and a decoding apparatus which decodes this code data can be implemented to have a small circuit scale, a short processing delay time, and low cost, as described above.

The detailed operation sequences of the length information extraction unit 102 and code data conversion unit 103 will be described below.

The operation of the length information extraction unit 102 in FIG. 9 will be described below taking the code data shown in FIG. 3 as an example. As described above, the code data input unit 101 transfers received code data every 12 bytes to the length information discrimination unit 1021 in the length information extraction unit 102. Therefore, as the code data, "04, 01, 02, 03, 04, 05, FE, 06, 03, 07, 08, 09" are transferred first, and "0A, FA, 0B, 05, 0C, 0D, 0E, 0F, 10, 11, FA, 12" are then transferred.

In the first processing cycle, the length information discrimination unit 1021 receives "04, 01, 02, 03, 04, 05, FE, 06, 03, 07, 08, 09", and assigns respective bytes of this code data to bytes 0 to 11. Since the "first processing cycle" is to be executed, the discrimination circuit shown in FIG. 11 determines that "byte 0 is length information in this processing cycle". Also, the discrimination circuit shown in FIG. 10 determines that "byte 0 is length information". Since the value of byte 0 is "04", and "byte count information of byte 0 is 5" from FIG. 2, a discrimination circuit (not shown) determines that "byte 6 is length information in this cycle". Also, the discrimination circuit (not shown) determines that "byte 6 is length information". Since the value of byte 6 is "FE", and "byte count information of byte 6 is 1" from FIG. 2, the discrimination circuit (not shown) determines that "byte 8 is length information in this cycle". Also, the discrimination circuit (not shown) determines that "byte 8 is length information". Since the value of byte 8 is "03" and "byte count information of byte 8 is 4" from FIG. 2, the discrimination circuit shown in FIG. 13 determines that "byte 1 is length information in the next processing cycle". With the processes executed so far, it is determined that bytes 0, 6, and 8 are length information, these bytes are transferred to the length information buffer 1022, and other bytes are transferred to the data information buffer 1023. Therefore, "04, FE, 03" are transferred to the length information buffer 1022 in this processing cycle, and "01, 02, 03, 04, 05, 06, 07, 08, 09" are transferred to the data information buffer 1023 in this processing cycle.

In the next processing cycle, the length information discrimination unit 1021 receives "0A, FA, 0B, 05, 0C, 0D, 0E, 0F, 10, 11, FA, 12", and assigns respective bytes of this code data to bytes 0 to 11. In the previous processing cycle, the discrimination circuit shown in FIG. 13 determined that "byte 1 is length information in the next processing cycle". For this reason, the discrimination circuit shown in FIG. 12 determines that "byte 1 is length information". Since the value of byte 1 is "FA" and "byte count information of byte 1 is 1" from FIG. 2, the discrimination circuit shown in FIG. 17 determines that "byte 3 is length information in this processing cycle". Also, the discrimination circuit shown in FIG. 16 determines that "byte 3 is length information". Since the value of byte 3 is "05" and "byte count information of byte 3 is 6" from FIG. 2, the discrimination circuit (not shown) determines that "byte 10 is length information in this processing cycle". Also, the discrimination circuit (not shown) determines that "byte 10 is length information". Since the value of byte 10 is "FA" and "byte count information of byte 10 is 1" from FIG. 2, the discrimination circuit shown in FIG. 11 determines that "byte 0 is length information in the next processing cycle". With the processes executed so far, it is determined that bytes 1, 3, and 10 are length information, these bytes are transferred to the length information buffer 1022, and other bytes are transferred to the data information buffer 1023. Therefore, "FA, 05, FA" are transferred to the length information buffer 1022 in this processing cycle, and "0A, 0B, 0C, 0D, 0E, 0F, 10, 11, 12" are transferred to the data information buffer 1023 in this processing cycle.

Therefore, the length information buffer 1022 stores "04, FE, 03, FA, 05, FA". Also, the data information buffer 1023 stores "01, 02, 03, 04, 05, 06, 07, 08, 09, 0A, 0B, 0C, 0D, 0E, 0F, 10, 11, 12".

The operation of the code data conversion unit 103 in FIG. 20 will be described below taking the code data shown in FIG. 3 as an example. As described above, the length information extraction unit 102 stores the code data in the internal buffers separately as length information and data information, and transfers them in response to a request from the code data conversion unit 103. As described above, pieces of length information are "04, FE, 03, FA, 05, FA". Also, pieces of data information are "01, 02, 03, 04, 05, 06, 07, 08, 09, 0A, 0B, 0C, 0D, 0E, 0F, 10, 11, 12".

The length information division unit 1031 operates according to the flowchart shown in FIGS. 21A and 21B, as described above. The following description will be given using step numbers in FIGS. 21A and 21B.

The operation of the first cycle will be described below.

Step 2101: The length information division unit 1031 resets the number of bytes after cumulative decoding to zero.

Step 2102: Since input of length information is not complete yet, the process advances to step 2103.

Step 2103: The length information division unit 1031 acquires 1 byte of length information (04).

Step 2104: The length information division unit 1031 interprets the length information (04) to acquire the number of bytes (5) and the number of repetition times (1) of data information.

Step 2105: The length information division unit 1031 cumulates 5×1=5 to the number of bytes (0) after cumulative decoding to yield the number of bytes after cumulative decoding=5.

Step 2106: Since the number of bytes (5) after cumulative decoding is smaller than 6, the process advances to step 2107.

Step 2107: The length information division unit 1031 outputs the length information (04) to the length information generating unit 1032.

Step 2102: Since input of length information is not complete yet, the process advances to step 2103.

Step 2103: The length information division unit 1031 acquires 1 byte of length information (FE).

Step 2104: The length information division unit 1031 interprets the length information (FE) to acquire the number of bytes (1) and the number of repetition times (3) of data information.

Step 2105: The length information division unit 1031 cumulates 1×3=3 to the number of bytes (5) after cumulative decoding to yield the number of bytes after cumulative decoding=8.

Step 2106: Since the number of bytes (8) after cumulative decoding is not smaller than 6, the process advances to step 2108.

Step 2108: Since the number of bytes (8) after cumulative decoding is not equal to 6, the process advances to step 2111.

Step 2111: Since the number of repetition times (3) is not equal to 1, the process advances to step 2115.

Step 2115: The length information division unit 1031 divides the length information (FE) into former and latter parts. The length information division unit 1031 makes the aforementioned calculations, and the length information (former part) is generated as length information (00) having "1" as byte count information and "1" as the number of repetition times. Also, the length information (latter part) is generated as length information (FF) having "1" as byte count information and "2" as the number of repetition times.

Step 2116: The length information division unit 1031 outputs the length information (former part) (00) to the length information generating unit 1032.

Step 2117: The length information division unit 1031 appends a repeat attribute to the length information (latter part) (FF).

Step 2118: The length information division unit 1031 stores the length information (latter part) (FF/repeat) as the next length information to be acquired in the internal buffer, and the process advances to step 2110.

Step 2110: The length information division unit 1031 transfers a delimiter signal to the length information generating unit 1032, and the process returns to step 2101.

The operation of the second cycle will be described below.

Step 2101: The length information division unit 1031 resets the number of bytes after cumulative decoding to zero.

Step 2102: Since input of length information is not complete yet, the process advances to step 2103.

Step 2103: Since the next length information (FF/repeat) to be acquired is stored in the internal buffer, the length information division unit 1031 acquires this length information (FF/repeat) as 1 byte of length information.

Step 2104: The length information division unit 1031 interprets the length information (FF/repeat) to acquire the number of bytes (1) and the number of repetition times (2) of data information.

Step 2105: The length information division unit 1031 cumulates 1×2=2 to the number of bytes (0) after cumulative decoding to yield the number of bytes after cumulative decoding=2.

Step 2106: Since the number of bytes (2) after cumulative decoding is smaller than 6, the process advances to step 2107.

Step 2107: The length information division unit 1031 outputs the length information (FF/repeat) to the length information generating unit 1032.

Step 2102: Since input of length information is not complete yet, the process advances to step 2103.

Step 2103: The length information division unit 1031 acquires 1 byte of length information (03).

Step 2104: The length information division unit 1031 interprets the length information (03) to acquire the number of bytes (4) and the number of repetition times (1) of data information.

Step 2105: The length information division unit 1031 cumulates 4×1=4 to the number of bytes (2) after cumulative decoding to yield the number of bytes after cumulative decoding=6.

Step 2106: Since the number of bytes (6) after cumulative decoding is not smaller than 6, the process advances to step 2108.

Step 2108: Since the number of bytes (6) after cumulative decoding is equal to 6, the process advances to step 2109.

Step 2109: The length information division unit 1031 outputs the length information (03) to the length information generating unit 1032, and the process advances to step 2110.

Step 2110: The length information division unit 1031 transfers a delimiter signal to the length information generating unit 1032, and the process returns to step 2101.

The operation of the third cycle will be described below.

Step 2101: The length information division unit 1031 resets the number of bytes after cumulative decoding to zero.

Step 2102: Since input of length information is not complete yet, the process advances to step 2103.

Step 2103: The length information division unit 1031 acquires 1 byte of length information (FA).

Step 2104: The length information division unit 1031 interprets the length information (FA) to acquire the number of bytes (1) and the number of repetition times (7) of data information.

Step 2105: The length information division unit 1031 cumulates 1×7=7 to the number of bytes (0) after cumulative decoding to yield the number of bytes after cumulative decoding=7.

Step 2106: Since the number of bytes (7) after cumulative decoding is not smaller than 6, the process advances to step 2108.

Step 2108: Since the number of bytes (7) after cumulative decoding is not equal to 6, the process advances to step 2111.

Step 2111: Since the number of repetition times (7) is not equal to 1, the process advances to step 2115.

Step 2115: The length information division unit 1031 divides the length information (FA) into former and latter parts. The length information division unit 1031 makes the aforementioned calculations, and the length information (former part) is generated as length information (FB) having "1" as byte count information and "6" as the number of repetition times. Also, the length information (latter part) is generated as length information (00) having "1" as byte count information and "1" as the number of repetition times.

Step 2116: The length information division unit 1031 outputs the length information (former part) (FB) to the length information generating unit 1032.

Step 2117: The length information division unit 1031 appends a repeat attribute to the length information (latter part) (00).

Step 2118: The length information division unit 1031 stores the length information (latter part) (00/repeat) as the next length information to be acquired in the internal buffer, and the process advances to step 2110.

Step 2110: The length information division unit 1031 transfers a delimiter signal to the length information generating unit 1032, and the process returns to step 2101.

The operation of the fourth cycle will be described below.

Step 2101: The length information division unit 1031 resets the number of bytes after cumulative decoding to zero.

Step 2102: Since input of length information is not complete yet, the process advances to step 2103.

Step 2103: Since the next length information (00/repeat) to be acquired is stored in the internal buffer, the length information division unit 1031 acquires this length information (00/repeat) as 1 byte of length information.

Step 2104: The length information division unit 1031 interprets the length information (00/repeat) to acquire the number of bytes (1) and the number of repetition times (1) of data information.

Step 2105: The length information division unit 1031 cumulates 1×1=1 to the number of bytes (0) after cumulative decoding to yield the number of bytes after cumulative decoding=1.

Step 2106: Since the number of bytes (1) after cumulative decoding is smaller than 6, the process advances to step 2107.

Step 2107: The length information division unit 1031 outputs the length information (00/repeat) to the length information generating unit 1032.

Step 2102: Since input of length information is not complete yet, the process advances to step 2103.

Step 2103: The length information division unit 1031 acquires 1 byte of length information (05).

Step 2104: The length information division unit 1031 interprets the length information (05) to acquire the number of bytes (6) and the number of repetition times (1) of data information.

Step 2105: The length information division unit 1031 cumulates 6×1=6 to the number of bytes (1) after cumulative decoding to yield the number of bytes after cumulative decoding=7.

Step 2106: Since the number of bytes (7) after cumulative decoding is not smaller than 6, the process advances to step 2108.

Step 2108: Since the number of bytes (7) after cumulative decoding is not equal to 6, the process advances to step 2111.

Step 2111: Since the number of repetition times (1) is equal to 1, the process advances to step 2112.

Step 2112: The length information division unit 1031 divides the length information (05) into former and latter parts. The length information division unit 1031 makes the aforementioned calculations, and the length information (former part) is generated as length information (04) having "5" as byte count information and "1" as the number of repetition times. Also, the length information (latter part) is generated as length information (00) having "1" as byte count information and "1" as the number of repetition times.

Step 2113: The length information division unit 1031 outputs the length information (former part) (04) to the length information generating unit 1032.

Step 2114: The length information division unit 1031 stores the length information (latter part) (00) as the next length information to be acquired in the internal buffer, and the process advances to step 2110.

Step 2110: The length information division unit 1031 transfers a delimiter signal to the length information generating unit 1032, and the process returns to step 2101.

The operation of the fifth cycle will be described below.

Step 2101: The length information division unit 1031 resets the number of bytes after cumulative decoding to zero.

Step 2102: Since input of length information is not complete yet, the process advances to step 2103.

Step 2103: Since the next length information (00) to be acquired is stored in the internal buffer, the length information division unit 1031 acquires this length information (00) as 1 byte of length information.

Step 2104: The length information division unit 1031 interprets the length information (00) to acquire the number of bytes (1) and the number of repetition times (1) of data information.

Step 2105: The length information division unit 1031 cumulates 1×1=1 to the number of bytes (0) after cumulative decoding to yield the number of bytes after cumulative decoding=1.

Step 2106: Since the number of bytes (1) after cumulative decoding is smaller than 6, the process advances to step 2107.

Step 2107: The length information division unit 1031 outputs the length information (00) to the length information generating unit 1032.

Step 2102: Since input of length information is not complete yet, the process advances to step 2103.

Step 2103: The length information division unit 1031 acquires 1 byte of length information (FA).

Step 2104: The length information division unit 1031 interprets the length information (FA) to acquire the number of bytes (1) and the number of repetition times (7) of data information.

Step 2105: The length information division unit 1031 cumulates 1×7=7 to the number of bytes (1) after cumulative decoding to yield the number of bytes after cumulative decoding=8.

Step 2106: Since the number of bytes (8) after cumulative decoding is not smaller than 6, the process advances to step 2108.

Step 2108: Since the number of bytes (8) after cumulative decoding is not equal to 6, the process advances to step 2111.

Step 2111: Since the number of repetition times (7) is not equal to 1, the process advances to step 2115.

Step 2115: The length information division unit 1031 divides the length information (FA) into former and latter parts. The length information division unit 1031 makes the aforementioned calculations, and the length information (former part) is generated as length information (FC) having "1" as byte count information and "5" as the number of repetition times. Also, the length information (latter part) is generated as length information (FF) having "1" as byte count information and "2" as the number of repetition times.

Step 2116: The length information division unit 1031 outputs the length information (former part) (FC) to the length information generating unit 1032.

Step 2117: The length information division unit 1031 appends a repeat attribute to the length information (latter part) (FF).

Step 2118: The length information division unit 1031 stores the length information (latter part) (FF/repeat) as the next length information to be acquired in the internal buffer, and the process advances to step 2110.

Step 2110: The length information division unit 1031 transfers a delimiter signal to the length information generating unit 1032, and the process returns to step 2101.

The operation of the sixth cycle will be described below.

Step 2101: The length information division unit 1031 resets the number of bytes after cumulative decoding to zero.

Step 2102: Since input of length information is not complete yet, the process advances to step 2103.

Step 2103: Since the next length information (FF/repeat) to be acquired is stored in the internal buffer, the length information division unit 1031 acquires this length information (FF/repeat) as 1 byte of length information.

Step 2104: The length information division unit 1031 interprets the length information (FF/repeat) to acquire the number of bytes (1) and the number of repetition times (2) of data information.

Step 2105: The length information division unit 1031 cumulates 1×2=2 to the number of bytes (0) after cumulative decoding to yield the number of bytes after cumulative decoding=2.

Step 2106: Since the number of bytes (2) after cumulative decoding is smaller than 6, the process advances to step 2107.

Step 2107: The length information division unit 1031 outputs the length information (FF/repeat) to the length information generating unit 1032.

Step 2102: Since input of the length information is complete, the processing ends.

As described above, the length information division unit 1031 transfers the length information and delimiter signals to the length information generating unit 1032 as follows.

First cycle: 04, 00, delimiter signal
Second cycle: FF/repeat, 03, delimiter signal
Third cycle: FB, delimiter signal
Fourth cycle: 00/repeat, 04, delimiter signal
Fifth cycle: 00, FC, delimiter signal
Sixth cycle: FF/repeat The length information generating unit 1032 operates according to the flowchart shown in FIG. 22, as described above. The following description will be given using step numbers in FIG. 22.

The operation of the first cycle will be described below.

Step 2201: The length information generating unit 1032 initializes the temporary buffer to a state in which the buffer stores nothing.

Step 2202: The length information generating unit 1032 receives 1 byte of length information (04) from the length information division unit 1031.

Step 2203: The length information generating unit 1032 stores the length information in the temporary buffer (04).

Step 2204: Since no delimiter signal is input from the length information division unit 1031 and input of length information is not complete yet, the process returns to step 2202.

Step 2202: The length information generating unit 1032 receives 1 byte of length information (00) from the length information division unit 1031.

Step 2203: The length information generating unit 1032 stores the length information in the temporary buffer (04, 00).

Step 2204: Since a delimiter signal is input from the length information division unit 1031, the process advances to step 2205.

Step 2205: Upon examining the pieces of length information stored in the temporary buffer (04, 00) from the head, since two pieces of length information having the number of repetition times=1 are successively stored at neighboring positions (04, 00), the process advances to step 2206.

Step 2206: The length information generating unit 1032 couples the two pieces of length information (04, 00) with the number of repetition times=1 at the neighboring positions to convert them into new one length information (05). The length information generating unit 1032 updates the temporary buffer to (05), and the process returns to step 2205.

Step 2205: Upon examining the length information stored in the temporary buffer (05), since two pieces of length information having the number of repetition times=1 are not successively stored at neighboring positions, the process jumps to step 2207.

Step 2207: The length information generating unit 1032 transfers the length information (05) stored in the temporary buffer (05) to the combining unit 1033.

Step 2208: Since input of length information from the length information division unit 1031 is not complete yet, the process returns to step 2201.

The operation of the second cycle will be described below.

Step 2201: The length information generating unit 1032 initializes the temporary buffer to a state in which the buffer stores nothing.

Step 2202: The length information generating unit 1032 receives 1 byte of length information (FF/repeat) from the length information division unit 1031.

Step 2203: The length information generating unit 1032 stores the length information in the temporary buffer (FF/repeat).

Step 2204: Since no delimiter signal is input from the length information division unit 1031 and input of length information is not complete yet, the process returns to step 2202.

Step 2202: The length information generating unit 1032 receives 1 byte of length information (03) from the length information division unit 1031.

Step 2203: The length information generating unit 1032 stores the length information in the temporary buffer (FF/repeat, 03).

Step 2204: Since a delimiter signal is input from the length information division unit 1031, the process advances to step 2205.

Step 2205: Upon examining the pieces of length information stored in the temporary buffer (FF/repeat, 03) from the head, since two pieces of length information having the number of repetition times=1 are not successively stored at neighboring positions, the process jumps to step 2207.

Step 2207: The length information generating unit 1032 transfers the pieces of length information (FF/repeat, 03) stored in the temporary buffer (FF/repeat, 03) to the combining unit 1033. In this case, the first length information (FF/repeat) is appended with the repeat attribute, and the length information generating unit 1032 transfers the length information while being kept appended with the repeat information.

Step 2208: Since input of length information from the length information division unit 1031 is not complete yet, the process returns to step 2201.

The operation of the third cycle will be described below.

Step 2201: The length information generating unit 1032 initializes the temporary buffer to a state in which the buffer stores nothing.

Step 2202: The length information generating unit 1032 receives 1 byte of length information (FB) from the length information division unit 1031.

Step 2203: The length information generating unit 1032 stores the length information in the temporary buffer (FB).

Step 2204: Since a delimiter signal is input from the length information division unit 1031, the process advances to step 2205.

Step 2205: Upon examining the length information stored in the temporary buffer (FB), since two pieces of length information having the number of repetition times=1 are not successively stored at neighboring positions, the process jumps to step 2207.

Step 2207: The length information generating unit 1032 transfers the length information (FB) stored in the temporary buffer (FB) to the combining unit 1033.

Step 2208: Since input of length information from the length information division unit 1031 is not complete yet, the process returns to step 2201.

The operation of the fourth cycle will be described below.

Step 2201: The length information generating unit 1032 initializes the temporary buffer to a state in which the buffer stores nothing.

Step 2202: The length information generating unit 1032 receives 1 byte of length information (00/repeat) from the length information division unit 1031.

Step 2203: The length information generating unit 1032 stores the length information in the temporary buffer (00/repeat).

Step 2204: Since no delimiter signal is input from the length information division unit 1031 and input of length information is not complete yet, the process returns to step 2202.

Step 2202: The length information generating unit 1032 receives 1 byte of length information (04) from the length information division unit 1031.

Step 2203: The length information generating unit 1032 stores the length information in the temporary buffer (00/repeat, 04).

Step 2204: Since a delimiter signal is input from the length information division unit 1031, the process advances to step 2205.

Step 2205: Upon examining the pieces of length information stored in the temporary buffer (00/repeat, 04) from the head, since two pieces of length information having the number of repetition times=1 are successively stored at neighboring positions (00/repeat, 04), the process advances to step 2206.

Step 2206: The length information generating unit 1032 couples the two pieces of length information (00/repeat, 04) with the number of repetition times=1 at the neighboring positions to convert them into new one length information (05/repeat). Since the first original length information (00/repeat) is appended with the repeat attribute, the repeat attribute is appended to the new one length information (05/repeat). The length information generating unit 1032 updates the temporary buffer to (05/repeat), and the process returns to step 2205.

Step 2205: Upon examining the length information stored in the temporary buffer (05/repeat) from the head, since two pieces of length information having the number of repetition times=1 are not successively stored at neighboring positions, the process jumps to step 2207.

Step 2207: The length information generating unit 1032 transfers the length information (05/repeat) stored in the temporary buffer (05/repeat) to the combining unit 1033. At this time, the repeat attribute is appended to the length information (05/repeat), and that length information is transferred while being kept appended with the repeat attribute.

Step 2208: Since input of length information from the length information division unit 1031 is not complete yet, the process returns to step 2201.

The operation of the fifth cycle will be described below.

Step 2201: The length information generating unit 1032 initializes the temporary buffer to a state in which the buffer stores nothing.

Step 2202: The length information generating unit 1032 receives 1 byte of length information (00) from the length information division unit 1031.

Step 2203: The length information generating unit 1032 stores the length information in the temporary buffer (00).

Step 2204: Since no delimiter signal is input from the length information division unit 1031 and input of length information is not complete yet, the process returns to step 2202.

Step 2202: The length information generating unit 1032 receives 1 byte of length information (FC) from the length information division unit 1031.

Step 2203: The length information generating unit 1032 stores the length information in the temporary buffer (00, FC).

Step 2204: Since a delimiter signal is input from the length information division unit 1031, the process advances to step 2205.

Step 2205: Upon examining the pieces of length information stored in the temporary buffer (00, FC) from the head, since two pieces of length information having the number of repetition times=1 are not successively stored at neighboring positions, the process jumps to step 2207.

Step 2207: The length information generating unit 1032 transfers the pieces of length information (00, FC) stored in the temporary buffer (00, FC) to the combining unit 1033.

Step 2208: Since input of length information from the length information division unit 1031 is not complete yet, the process returns to step 2201.

The operation of the sixth cycle will be described below.

Step 2201: The length information generating unit 1032 initializes the temporary buffer to a state in which the buffer stores nothing.

Step 2202: The length information generating unit 1032 receives 1 byte of length information (FF/repeat) from the length information division unit 1031.

Step 2203: The length information generating unit 1032 stores the length information in the temporary buffer (FF/repeat).

Step 2204: Since input of length information is complete, the process advances to step 2205.

Step 2205: Upon examining the length information stored in the temporary buffer (FF/repeat) from the head, since two pieces of length information having the number of repetition times=1 are not successively stored at neighboring positions, the process jumps to step 2207.

Step 2207: The length information generating unit 1032 transfers the length information (FF/repeat) stored in the temporary buffer (FF/repeat) to the combining unit 1033. At this time, since the length information (FF/repeat) is appended with the repeat attribute, the length information is transferred while being kept appended with the repeat information.

Step 2208: Since input of length information from the length information division unit 1031 is complete, the processing ends.

As described above, the length information generating unit 1032 transfers the length information to the combining unit 1033 as follows.

First cycle: 05
Second cycle: FF/repeat, 03
Third cycle: FB
Fourth cycle: 05/repeat
Fifth cycle: 00, FC
Sixth cycle: FF/repeat The operation of the combining unit 1033 will be described below.

The operation of the first cycle will be described below.

The combining unit 1033 receives length information (05) from the length information generating unit 1032, and outputs it to the code data output unit 104 (05).

The combining unit 1033 reads byte count information (6) of the received length information (05), receives data information (01, 02, 03, 04, 05, 06) as many as the number of bytes indicated by the byte count information (6) from the data information buffer 1023, and outputs them to the code data output unit 104 (01, 02, 03, 04, 05, 06).

The operation of the second cycle will be described below.

The combining unit 1033 receives length information (FF/repeat) from the length information generating unit 1032, and outputs it to the code data output unit 104 (FF).

The combining unit 1033 reads byte count information (1) of the received length information (FF/repeat). Since the repeat attribute is appended to the length information, the combining unit 1033 re-uses the last one byte (06) of the data information transferred at the immediately preceding timing to receive only data information (none) as many as the remaining number of bytes (0) from the data information buffer 1023, couples that data information, and outputs the data information to the code data output unit 104 (06).

Furthermore, the combining unit 1033 receives length information (03) from the length information generating unit 1032, and outputs it to the code data output unit 104 (03).

The combining unit 1033 reads byte count information (4) of the received length information (03), receives data information (07, 08, 09, 0A) as many as the number of bytes indicated by the byte count information (4) from the data information buffer 1023, and outputs them to the code data output unit 104 (07, 08, 09, 0A).

The operation of the third cycle will be described below.

The combining unit 1033 receives length information (FB) from the length information generating unit 1032, and outputs it to the code data output unit 104 (FB).

The combining unit 1033 reads byte count information (1) of the received length information (FB), receives data information (0B) as many as the number of data indicated by the byte count information (1) from the data information buffer 1023, and outputs it to the code data output unit 104 (0B).

The operation of the fourth cycle will be described below.

The combining unit 1033 receives length information (05/repeat) from the length information generating unit 1032, and outputs it to the code data output unit 104 (05).

The combining unit 1033 reads byte count information (6) of the received length information (05/repeat). Since the repeat attribute is appended to the length information, the combining unit 1033 re-uses the last one byte (0B) of the data information transferred at the immediately preceding timing to receive only data information (0C, 0D, 0E, 0F, 10) as many as the remaining number of bytes (5) from the data information buffer 1023, couples these pieces of data information, and outputs them to the code data output unit 104 (0B, 0C, 0D, 0E, 0F, 10).

The operation of the fifth cycle will be described below.

The combining unit 1033 receives length information (00) from the length information generating unit 1032, and outputs it to the code data output unit 104 (00).

The combining unit 1033 reads byte count information (1) of the received length information (00), receives data information (11) as many as the number of data indicated by the byte count information (1) from the data information buffer 1023, and outputs it to the code data output unit 104 (11).

Furthermore, the combining unit 1033 receives length information (FC) from the length information generating unit 1032, and outputs it to the code data output unit 104 (FC).

The combining unit 1033 reads byte count information (1) of the received length information (FC), receives data information (12) as many as the number of data indicated by the byte count information (1) from the data information buffer 1023, and outputs it to the code data output unit 104 (12).

The operation of the sixth cycle will be described below.

The combining unit 1033 receives length information (FF/repeat) from the length information generating unit 1032, and outputs it to the code data output unit 104 (FF).

The combining unit 1033 reads byte count information (1) of the received length information (FF/repeat). Since the repeat attribute is appended to the length information, the combining unit 1033 re-uses the last one byte (12) of the data information transferred at the immediately preceding timing to receive only data information (none) as many as the remaining number of bytes (0) from the data information buffer 1023, couples that data information, and outputs the data information to the code data output unit 104 (12).

As described above, the combining unit 1033 transfers (outputs) the code data to the code data output unit 104 as follows.

First cycle: 05, 01, 02, 03, 04, 05, 06
Second cycle: FF, 06, 03, 07, 08, 09, 0A
Third cycle: FB, 0B
Fourth cycle: 05, 0B, 0C, 0D, 0E, 0F, 10
Fifth cycle: 00, 11, FC, 12
Sixth cycle: FF, 12

The detailed operation sequences of the length information extraction unit 102 and code data conversion unit 103 have been described.

According to this embodiment, once the data conversion apparatus described in this embodiment executes the conversion processing, code data that generates decoded data of 6 bytes (throughput=6) can be generated. In addition, the number of one or more unit code data required to generate decoded data of 6 bytes can be reduced, and code data can be efficiently converted into data that allows decoding.

In this embodiment, a throughput=6 has been exemplified. Likewise, the present invention can be applied to other throughputs. That is, upon realizing a throughput=M, the present invention can comprise the following arrangement.

That is, there is provided a data conversion apparatus, which converts encoded data that is Packbit-encoded to have a set of length information and data information as a unit code, into new Packbit-encoded data, which is expressed by length information indicating the number of output data not more than M output data smaller than the maximum number of output data after decoding that can be expressed by one length information of Packbit-encoded data, and data information, the apparatus comprising: an input unit which inputs encoded data to be converted; a separation unit which separates the input encoded data into length information and data information; a count unit which receives the length information obtained by the separation unit, and cumulatively counts the number of output data after decoding indicated by the received length information; a length information division unit which receives the length information separated by the separation unit, and divides the received length information, and which (a) outputs the received length information while a value counted by the count unit is smaller than M, (b) outputs length information of interest when the value counted by the count unit reaches M, outputs delimiter information indicating that the value reaches M, and resetting the count unit, and (c) divides the length information of interest into first length information indicating a difference between M and a counted value until length information immediately before the length information of interest, and second length information indicating the remaining number of output data when the value counted by the count unit is larger than M, outputs the first length information, outputs delimiter information indicating that the value reaches M, and sets the second length information as an initial count target to be counted by the count unit; a length information generating unit which receives the length information from the length information division unit, and generates, when a plurality of pieces of length information each indicating that data information is output once successively appear in the pieces of already received length information every time the delimiter information is input, new one length information from these pieces of successive length information; and a data combining unit which refers to the length information obtained via the length information generating unit, combines the length information and the data information separated by the separation unit, and outputs the combined information as new Packbit-encoded data.

Second Embodiment

The second embodiment according to the present invention will be described below.

Figure 26:
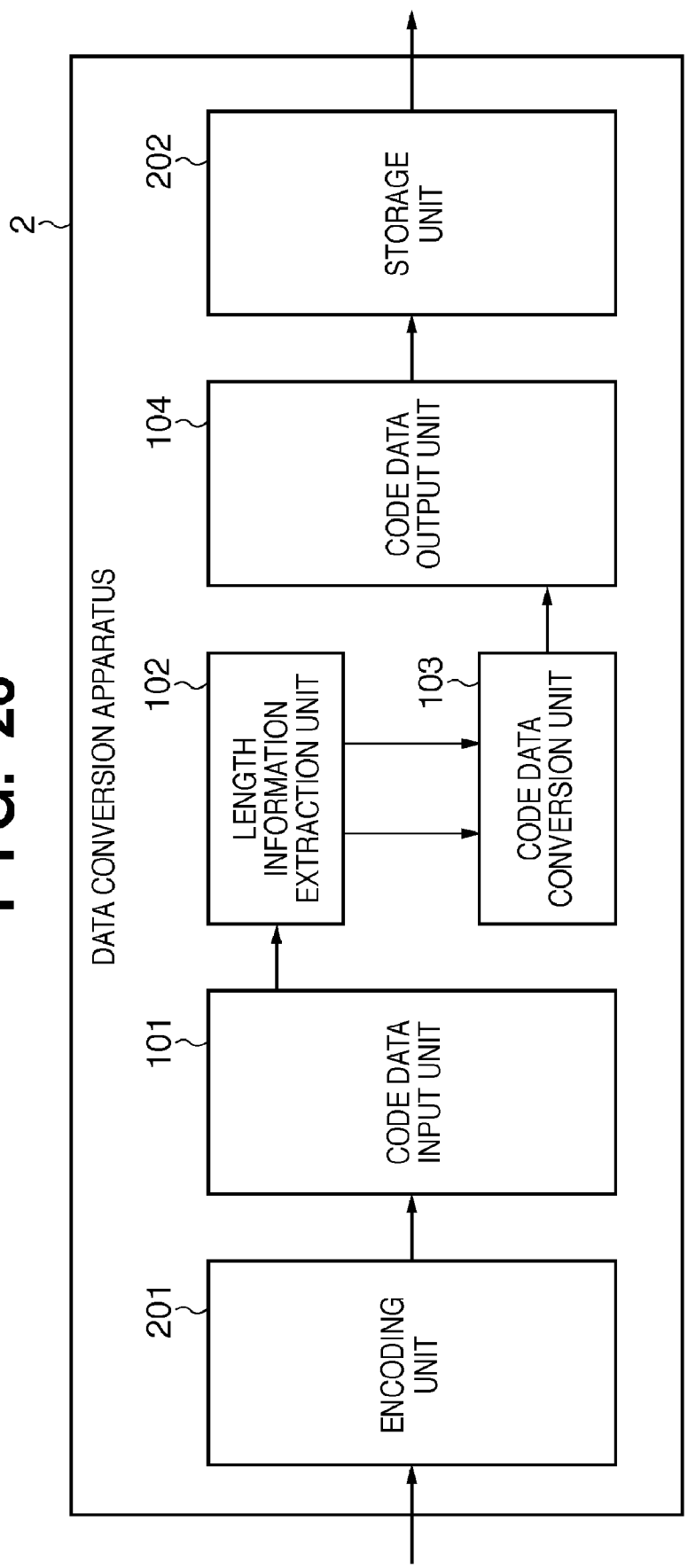
FIG. 26 is a block diagram of a data conversion apparatus according to the second embodiment.

FIG. 26 is a block diagram showing the internal arrangement of a data conversion apparatus according to the second embodiment (to be referred to as a data conversion apparatus 2 hereinafter). Reference numeral 101 denotes a code data input unit; 102, a length information extraction unit; 103, a code data conversion unit; 104, a code data output unit; 201, an encoding unit; and 202, a storage unit.

Since the code data input unit 101, length information extraction unit 102, code data conversion unit 103, and code data output unit 104 are the same as those in the data processing apparatus 1 in the first embodiment described above, a repetitive description thereof will be avoided.

The encoding unit 201 is connected to the code data input unit 101. The encoding unit 201 encodes received data (non-encoded data) by runlength encoding (Packbit-encoding) to fit the specification table shown in FIG. 2, and transfers encoded data to the code data input unit 101.

The storage unit 202 is connected to the code data output unit 104, and stores code data received from the code data output unit 104. The storage unit 202 can output the stored code data in response to an output request.

The operation of the data conversion apparatus 2 with the above arrangement will be described below taking data shown in FIG. 5 as an example.

Upon reception of the data shown in FIG. 5, the encoding unit 201 Pack-bit encodes the received data in turn from the first data, and outputs the encoded data to the code data input unit 101.

In case of FIG. 5, the encoding unit 201 encodes data to a unit code having byte count information indicating a value as large as possible unless two or more bytes having the same value successively appear. In FIG. 5, since 5 bytes d0 to d4 do not include two or more successive bytes having the same value, the encoding unit 201 encodes these 5 bytes to a unit code (04, 01, 02, 03, 04, 05). When two or more bytes having the same value successively appear, the encoding unit 201 encodes data to a unit code having the number of repetition times indicating a value as large as possible. In FIG. 5, since 3 bytes d5 to d7 have the same value "06", the encoding unit 201 encodes these 3 bytes to a unit code (FE, 06). Likewise, since 4 bytes d8 to d11 do not include two or more successive bytes having the same value, the encoding unit 201 encodes these 4 bytes to a unit code (03, 07, 08, 09, 0A). Since 7 bytes d12 to d18 have the same value "0B", the encoding unit 201 encodes these 7 bytes to a unit code (FA, 0B). Since 6 bytes d19 to d24 do not include two or more successive bytes having the same value, the encoding unit 201 encodes these 6 bytes to a unit code (05, 0C, 0D, 0E, 0F, 10, 11). Since 7 bytes d25 to d31 have the same value "12", the encoding unit 201 encodes these 7 bytes to a unit code (FA, 12). Therefore, the encoding unit 201 outputs code data shown in FIG. 3.

In the operation of the code data input unit 101, since the example of the code data shown in FIG. 3 has been explained in the first embodiment, a repetitive description thereof will be avoided. Likewise, since the operations of the subsequent length information extraction unit 102, code data conversion unit 103, and code data output unit 104 have been described in the first embodiment, a repetitive description thereof will be avoided.

Code data transferred to the storage unit 202 is that shown in FIG. 25. The storage unit 202 stores this code data, and can output the stored code data in response to an output request.

As described above, the data conversion apparatus 2 can generate, from an arbitrary data input, code data that can be decoded in consideration of only patterns shown in FIG. 24. Also, the code data can be stored and can be output in response to a request. As a result, a decoding apparatus for decoding code data output from the data conversion apparatus 2 can be implemented to have a smaller circuit scale, a shorter processing delay time, and lower cost than that which decodes arbitrary code data.

Third Embodiment

The third embodiment according to the present invention will be described below.

Figure 27:
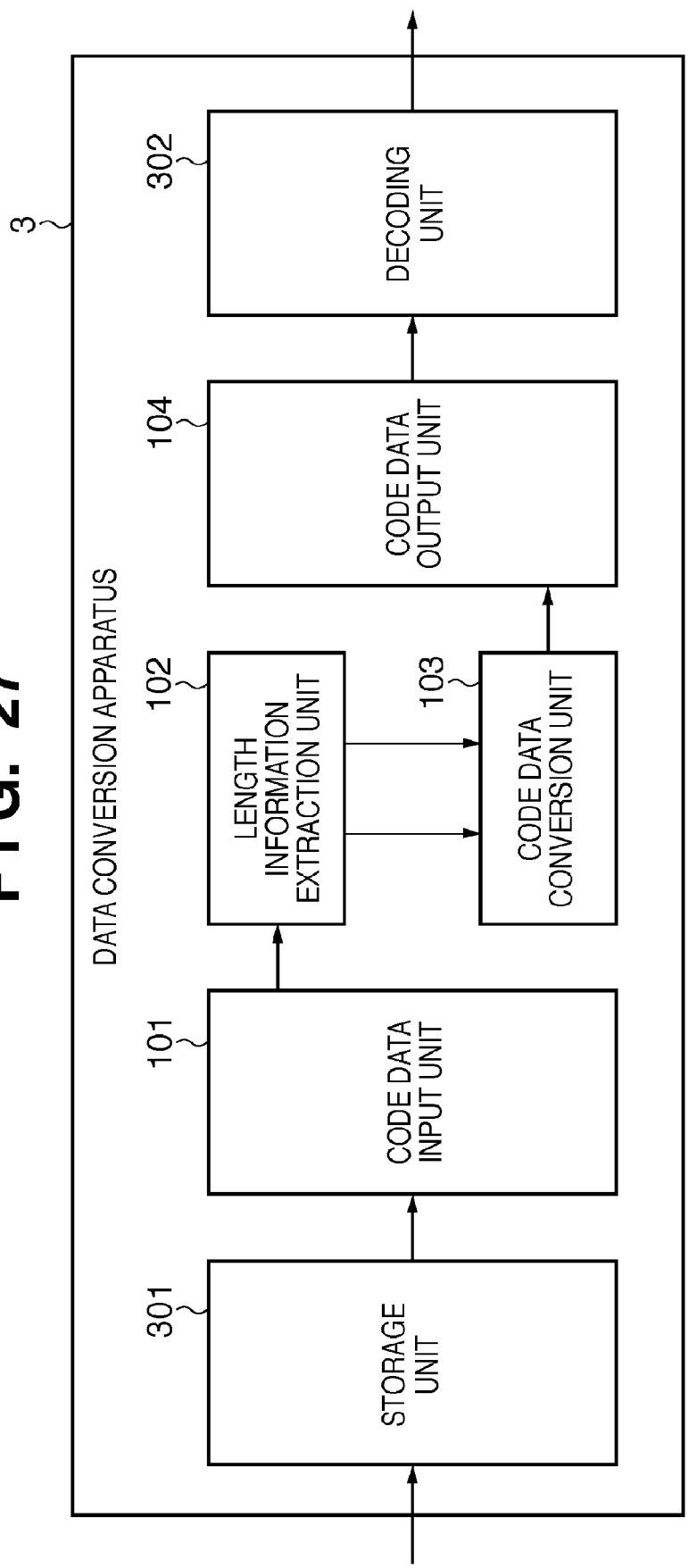
FIG. 27 is a block diagram of a decoding apparatus according to the third embodiment.

FIG. 27 is a block diagram showing the internal arrangement of a data conversion apparatus according to this embodiment (to be referred to as a data conversion apparatus 3 hereinafter). Reference numeral 101 denotes a code data input unit; 102, a length information extraction unit; 103, a code data conversion unit; 104, a code data output unit; 301, a storage unit; and 302, a decoding unit.

The storage unit 301 is connected to the code data input unit 101, stores input code data, and transfers the stored code data to the code data input unit 101.

Since the code data input unit 101, length information extraction unit 102, code data conversion unit 103, and code data output unit 104 are the same as those in the data processing apparatus 1 in the first embodiment described above, a repetitive description thereof will be avoided.

The decoding unit 302 is connected to the code data output unit 104. The decoding unit 302 receives code data output from the code data output unit 104, and decodes and outputs the received code data by runlength decoding to fit the specification table shown in FIG. 2. The decoding unit 302 is configured to realize a throughput=6. Since the internal arrangement and operation sequence of the decoding unit 302 are configured by expanding decoding of a throughput=4 described in Japanese Patent Laid-Open No. 2007-189527 to that of a throughput=6 by changing the number of patterns, a detailed description thereof will not be given. Note that code data that can be decoded by the decoding unit 302 is not arbitrary code data, but is code data, the number of patterns of which is limited. More specifically, the decoding unit 302 is configured not to decode all 239 patterns shown in FIGS. 8A to 8L but to decode only 32 patterns shown in FIG. 24. For this reason, the decoding unit 302 can have a small circuit scale and short delay time.

The operation of the data conversion apparatus 3 with the above arrangement will be described below taking data shown in FIG. 3 as an example.

When code data shown in FIG. 3 is transferred to the storage unit 301, the storage unit 301 stores this code data. The storage unit 301 reads out the stored code data, and transfers the readout code data to the code data input unit 101. Therefore, the storage unit 301 outputs the code data shown in FIG. 3.

In the operation of the code data input unit 101, since the example of the code data shown in FIG. 3 has been explained in the first embodiment, a repetitive description thereof will be avoided. Likewise, since the operations of the subsequent length information extraction unit 102, code data conversion unit 103, and code data output unit 104 have been described in the first embodiment, a repetitive description thereof will be avoided.

Figure 28:
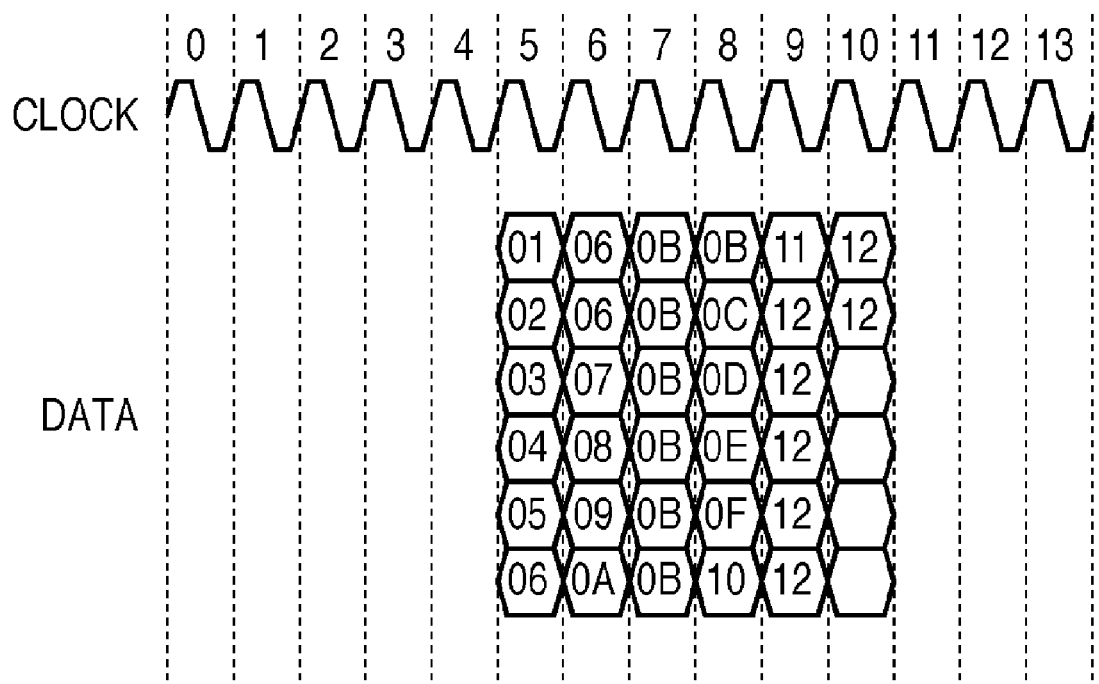
FIG. 28 is a timing chart showing data decoded by the decoding apparatus of the third embodiment and their output timings.

Code data transferred to the decoding unit 302 is that shown in FIG. 25. The decoding unit 302 decodes this code data, and outputs decoded data to have a throughput=6. As shown in the timing chart of FIG. 28, as output data, 6 bytes are decoded and output per cycle in synchronism with a clock.

As described above, the data conversion apparatus 3 can output data decoded to have a throughput=6 from an arbitrary code data input. Also, the decoding unit 302 which performs decoding can be implemented to have a smaller circuit scale, a shorter processing delay time, and lower cost than that which decodes arbitrary code data.

The embodiments according to the present invention have been described. This embodiment has exemplified the case in which Packbit-encoded data having 1 byte (8 bits) as a unit is re-converted. However, the unit data length is not limited to 1 byte, and any other bits may be used. In the above embodiment, as can be seen from the above description of the principal part processing contents according to the flowcharts, the present invention may be implemented as a computer program to be executed by a computer. In this case, this computer program can make parts corresponding to respective processing units serve as functions or subroutines. Normally, the computer program is stored in a computer-readable storage medium such as a CD-ROM. The storage medium is set in a reader (CD-ROM drive) of the computer to copy or install the computer program in a system, thus allowing to execute the computer program. Therefore, that computer-readable storage medium is also included in the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-111903, filed Apr. 22, 2008, which is hereby incorporated by reference herein in its entirety.

What is claimed is:

1. A data conversion apparatus, which converts encoded data that is Packbit-encoded to have a set of length information and data information as a unit code, into new Packbit-encoded data, which is expressed by length information indicating the number of output data not more than M output data smaller than the maximum number of output data after decoding that can be expressed by one length information of Packbit-encoded data, and data information, the apparatus comprising:

an input unit which inputs encoded data to be converted;

a separation unit which separates the input encoded data into length information and data information;

a buffer which stores length information;

a count unit which receives the length information obtained by the separation unit as length information of interest, and obtains cumulated result by cumulatively counts the number of output data after decoding indicated by the received length information, where, if significant length information is stored in the buffer, the count unit does not receive the length information obtained by the separation unit but acquires the length information stores in the buffer as length information of interest;

a length information division unit which inputs the length information of interest, and performs one of the following processes (a)-(c):

(a) outputs the received length information of interest when the cumulated result is smaller than M, (b) outputs length information of interest when the cumulated result is M, outputs delimiter information indicating that the value reaches M, and resetting the cumulated result, and (c) divides the length information of interest into first length information indicating a difference between M and a counted value until length information immediately before the length information of interest, and second length information indicating the remaining number of output data when the cumulated result is larger than M, outputs the first length information, outputs delimiter information indicating that the value reaches M, and stores the second length information significant length information for the next counting by the count unit in the buffer;

a length information generating unit which receives the length information outputted from the length information division unit, and generates, when a plurality of pieces of length information each indicating that data information is output once successively appear in the pieces of already received length information every time the delimiter information is input, new one length information from these pieces of successive length information; and a data combining unit which refers to the length information obtained via the length information generating unit, combines the length information and the data information separated by the separation unit, and outputs the combined information as new Packbit-encoded data.

2. The apparatus according to claim 1, further comprising a Packbit-encoding unit which receives image data and executes standard Packbit-encoding for the received image data, wherein the input unit inputs the Packbit-encoded data encoded by the Packbit-encoding unit.

3. The apparatus according to claim 1, further comprising a decoding unit which decodes the Packbit-encoded data generated by the data combining unit to have M data as a unit.

4. A method of controlling a data conversion apparatus, which converts encoded data that is Packbit-encoded to have a set of length information and data information as a unit code, into new Packbit-encoded data, which is expressed by length information indicating the number of output data not more than M output data smaller than the maximum number of output data after decoding that can be expressed by one length information of Packbit-encoded data, and data information, the method comprising:

an input step of inputting encoded data to be converted;

a separation step of separating the input encoded data into length information and data information;

a buffer step of storing length information;

a count step of receiving the length information obtained in the separation step as length information of interest, and obtaining cumulated result by cumulatively counting the number of output data after decoding indicated by the received length information, where, if significant length information is stored in the buffer step, the count step does not receive the length information obtained in the separation step but acquires the length information stored in the buffer step as length information of interest;

a length information division step of inputting the length information of interest, and performing one of the following processes (a)-(c):

(a) outputting the received length information of interest when the cumulated result is smaller than M, (b) outputting length information of interest when the cumulated result is M, outputting delimiter information indicating that the value reaches M, and resetting the cumulated result, and (c) dividing the length information of interest into first length information indicating a difference between M and a counted value until length information immediately before the length information of interest, and second length information indicating the remaining number of output data when the cumulated result is larger than M, outputting the first length information, outputting delimiter information indicating that the value reaches M, and storing the second length information significant length information for the next counting in the count step in the buffer step;

a length information generating step of receiving the length information outputted from the length information division step, and generating, when a plurality of pieces of length information each indicating that data information is output once successively appear in the pieces of already received length information every time the delimiter information is input, new one length information from these pieces of successive length information; and a data combining step of referring to the length information obtained via the length information generating step, combining the length information and the data information separated in the separation step, and outputting the combined information as new Packbit- encoded data.

5. A computer-readable storage medium storing a computer program for making a computer perform the method of claim 4 when the computer is read and executed by the computer.

* * * * *